(12) United States Patent
Taya et al.

(10) Patent No.: US 8,703,517 B2
(45) Date of Patent: Apr. 22, 2014

(54) METHOD OF MANUFACTURING A SEMICONDUCTOR DEVICE INCLUDING REMOVING A REFORMED LAYER

(75) Inventors: Atsushi Taya, Kariya (JP); Katsuhiko Kanamori, Nukata-gun (JP); Masashi Totokawa, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/279,409

(22) Filed: Oct. 24, 2011

(65) Prior Publication Data

US 2012/0107994 A1    May 3, 2012

(30) Foreign Application Priority Data

Oct. 29, 2010  (JP) .................................. 2010-243234
Feb. 28, 2011  (JP) .................................. 2011-041853

(51) Int. Cl.
  *H01L 21/02*    (2006.01)
(52) U.S. Cl.
  USPC ............ 438/53; 257/415; 257/254; 257/417; 257/414; 257/E21.002; 438/50; 438/148
(58) Field of Classification Search
  USPC ................. 257/415, 254, 417, 414, E21.002; 438/53, 50, 148
  See application file for complete search history.

(56) References Cited

U.S. PATENT DOCUMENTS

| | | | |
|---|---|---|---|
| 4,325,182 A | | 4/1982 | Tefft et al. |
| 5,024,724 A | * | 6/1991 | Hirono et al. .................. 216/13 |
| 5,369,544 A | * | 11/1994 | Mastrangelo ............... 361/283.4 |
| 6,211,056 B1 | * | 4/2001 | Begley et al. .................. 438/619 |
| 6,357,299 B1 | * | 3/2002 | Aigner et al. .................... 73/754 |
| 6,494,433 B2 | * | 12/2002 | Mastrangelo et al. .......... 251/11 |
| 6,892,582 B1 | * | 5/2005 | Satou et al. ...................... 73/715 |
| 7,321,156 B2 | * | 1/2008 | Fischer et al. ................. 257/417 |
| 2002/0037221 A1 | | 3/2002 | Mastrangelo et al. |
| 2005/0130390 A1 | | 6/2005 | Andrews et al. |
| 2005/0173387 A1 | * | 8/2005 | Fukuyo et al. ........... 219/121.67 |
| 2009/0101997 A1 | * | 4/2009 | Lammel et al. ................ 257/415 |
| 2010/0032418 A1 | | 2/2010 | Kuno et al. |
| 2011/0034031 A1 | | 2/2011 | Kanamori et al. |

FOREIGN PATENT DOCUMENTS

| | | |
|---|---|---|
| EP | 1 338 371 | 8/2003 |
| JP | A-2000-31501 | 1/2000 |
| JP | A-2001-099734 | 4/2001 |
| JP | A-2002-192367 | 7/2002 |
| JP | A-2002-319684 | 10/2002 |
| JP | B2-3408805 | 3/2003 |

(Continued)

OTHER PUBLICATIONS

Notification of Reasons for Refusal mailed Oct. 23, 2012 in a corresponding Japanese application No. 2010-243234.

(Continued)

*Primary Examiner* — Lex Malsawma
*Assistant Examiner* — Sheng Zhu
(74) *Attorney, Agent, or Firm* — Posz Law Group, PLC

(57) ABSTRACT

In a manufacturing method of a semiconductor device, a substrate including single crystalline silicon is prepared, a reformed layer that continuously extends is formed in the substrate, and the reformed layer is removed by etching. The forming the reformed layer includes polycrystallizing a portion of the single crystalline silicon by irradiating the substrate with a pulsed laser beam while moving a focal point of the laser beam in the substrate.

15 Claims, 38 Drawing Sheets

(56) References Cited

FOREIGN PATENT DOCUMENTS

| | | |
|---|---|---|
| JP | A-2004-160618 | 6/2004 |
| JP | A-2008-264902 | 11/2008 |
| JP | A-2009-111147 | 5/2009 |
| JP | A-2009-176926 | 8/2009 |
| JP | A-2010-164394 | 7/2010 |

OTHER PUBLICATIONS

Office action dated Dec. 3, 2013 in the corresponding CN application No. 201110333940.9 (and English translation).

* cited by examiner

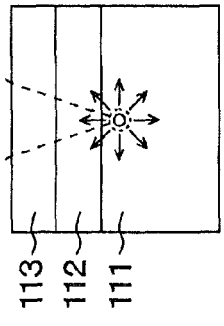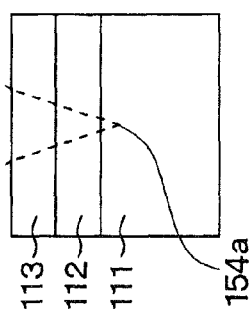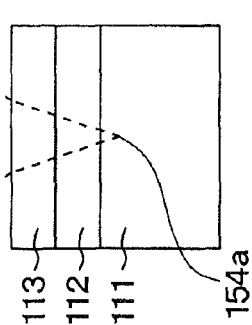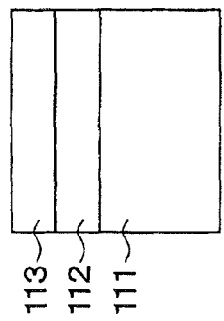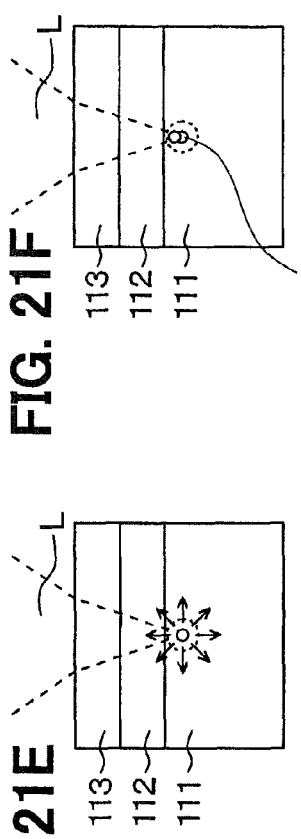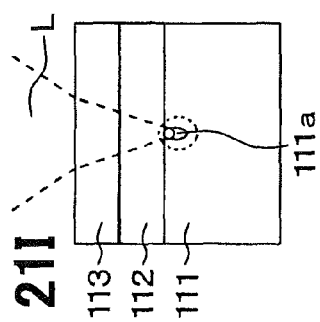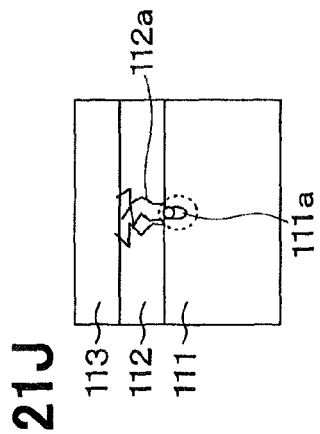

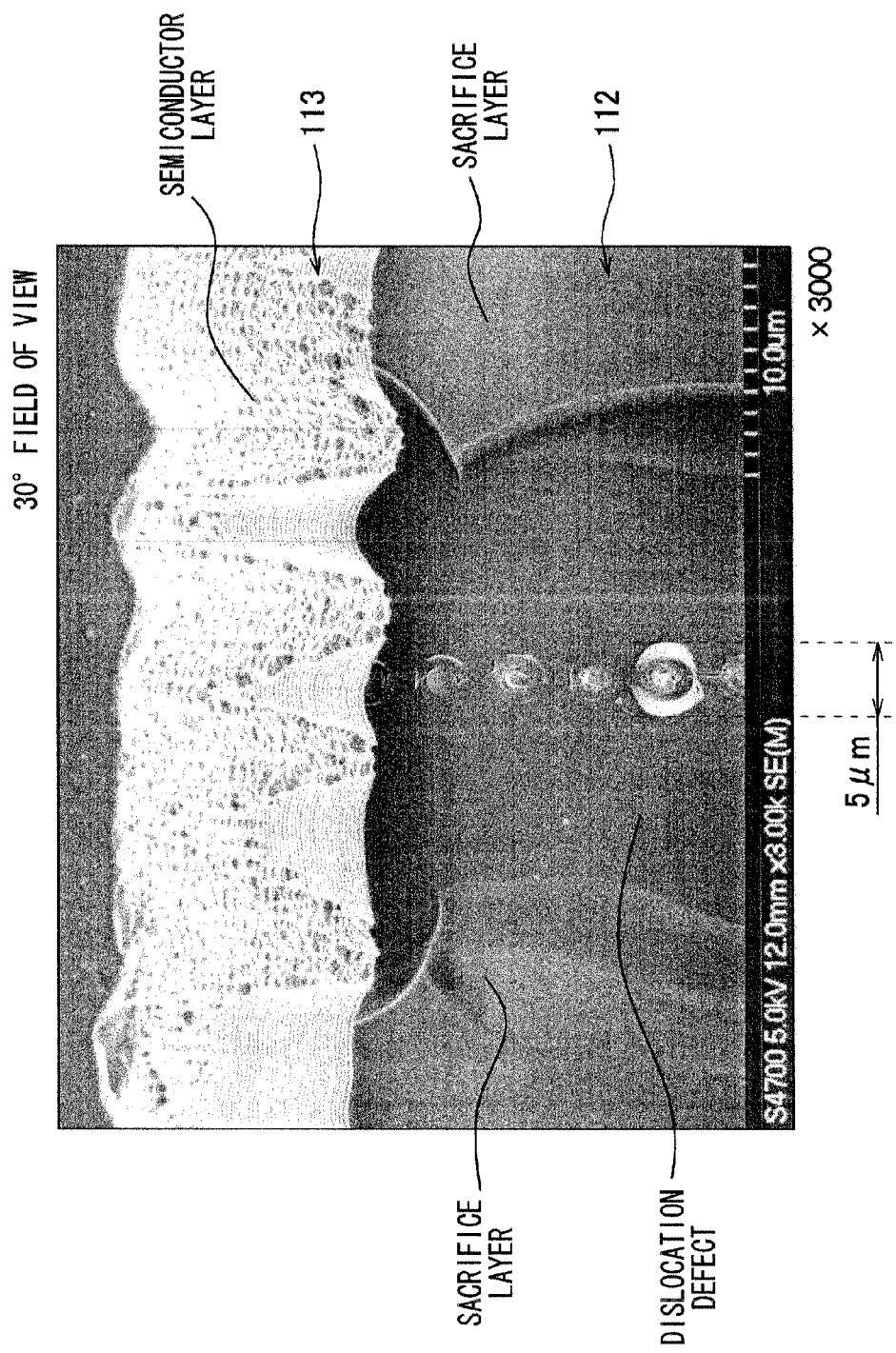

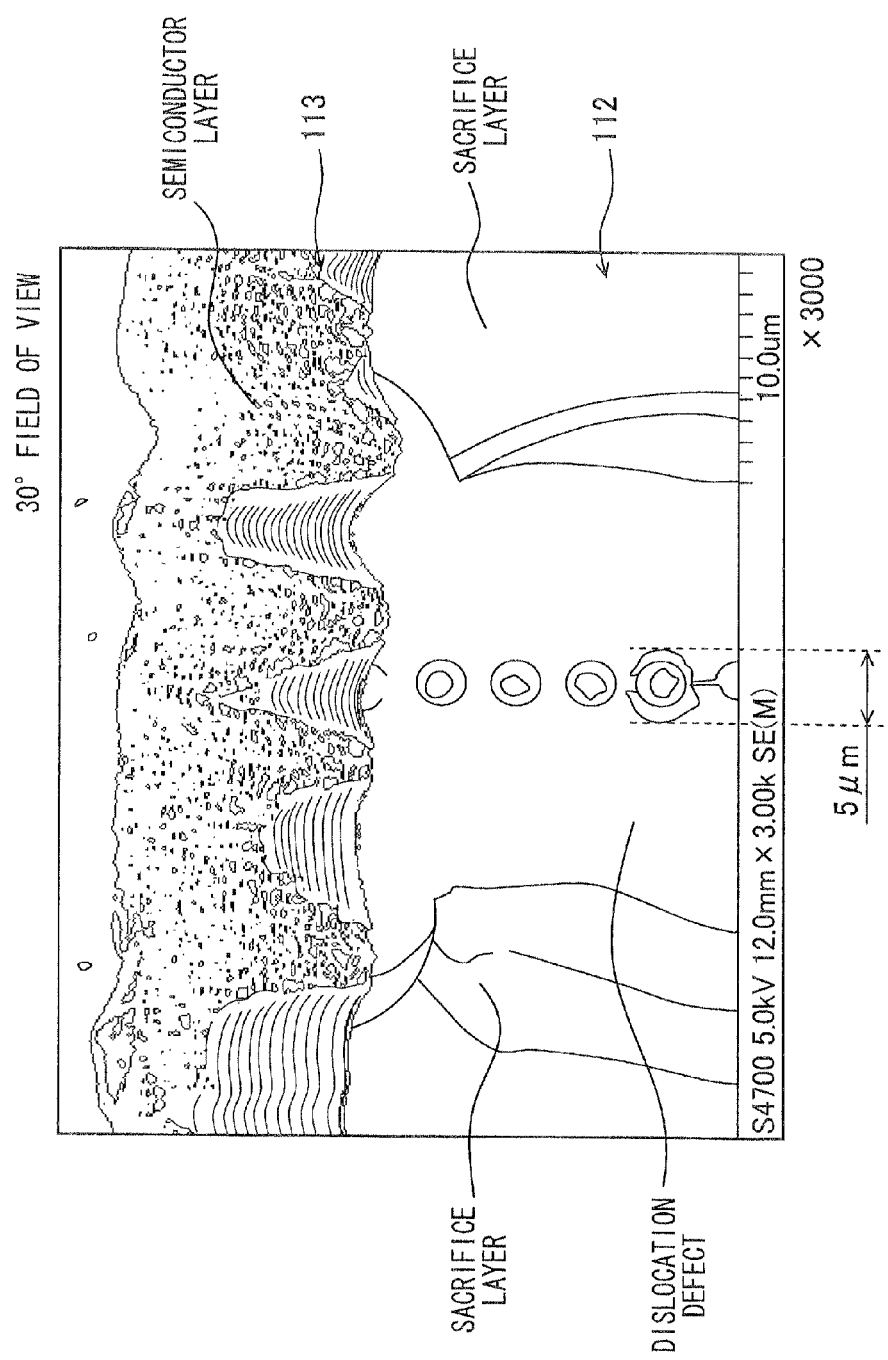

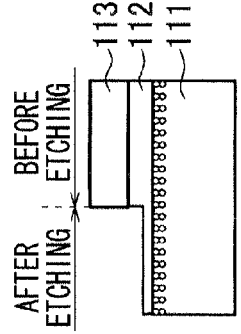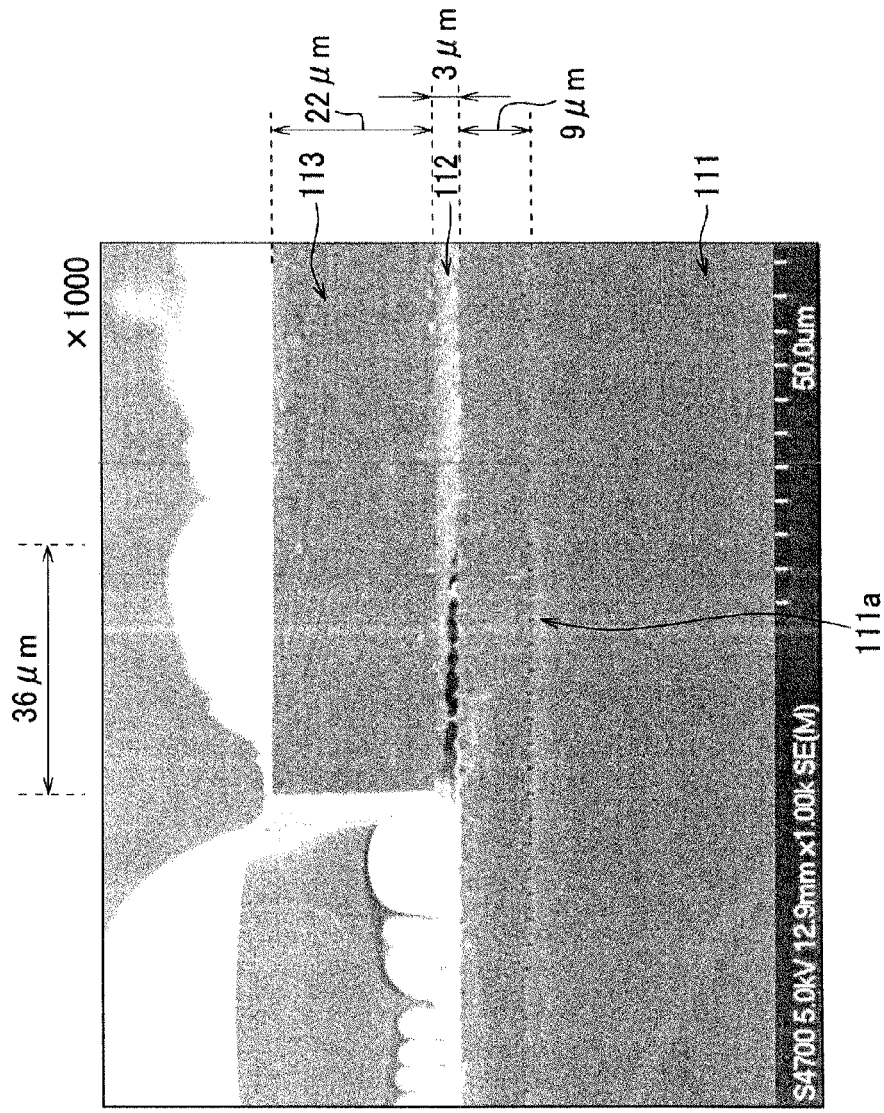

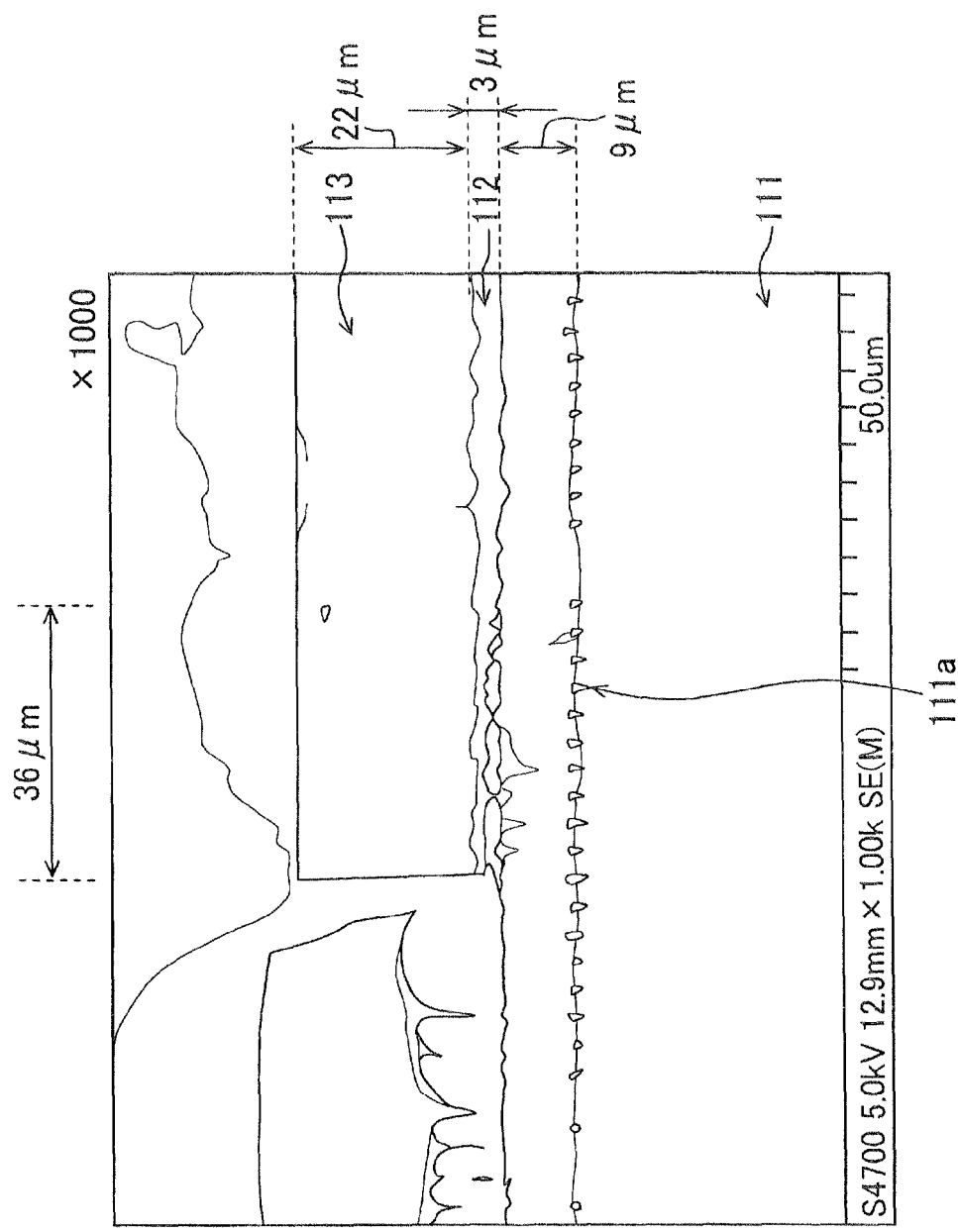

METHOD OF MANUFACTURING A SEMICONDUCTOR DEVICE INCLUDING REMOVING A REFORMED LAYER

CROSS REFERENCE TO RELATED APPLICATIONS

The present application is based on and claims priority to Japanese Patent Applications No. 2010-243234 filed on Oct. 29, 2010, and No. 2011-41853 filed on Feb. 28, 2011, the contents of which are incorporated in their entirety herein by reference.

TECHNICAL FIELD

The present invention relates to a manufacturing method of a semiconductor device including etching.

BACKGROUND

Some manufacturing methods of a semiconductor device need etching of a complicated-shaped removal region or a deep and large removal region as described, for example in JP-A-2008-264902 (hereafter, referred to as a patent document No. 1), JP-A-2000-31501 (hereafter, referred to as a patent document No. 2), and JP-A-2010-164394 (hereafter, referred to as a patent document No. 3).

The patent document No. 1 relates to a manufacturing method of a silicon structure that forms, for example, an acceleration sensor or an angular velocity sensor. The manufacturing method includes a process of forming a fixed part and a movable part by processing a silicon substrate and needs etching of a complicated-shaped removal region.

In the manufacturing method of the silicon structure disclosed in the patent document No. 1, a silicon-on-insulator (SOI) substrate, in which an upper layer made of single crystalline silicon, a middle layer made of silicon oxide, and a base layer made of single crystalline silicon are stacked, is used and needs the following two etching processes. In the first etching process, the upper layer is removed by anisotropic etching in a region that separates the fixed part and the movable part. In the second etching process, the middle layer is removed from the region where the upper layer is removed by isotropic etching, and the middle layer in the region where the upper layer is removed and the middle layer in the region that separates the fixed part and the movable part are completely removed. Specifically, in the first etching process, single crystalline silicon in the upper layer is etched to the middle layer using a patterned oxide layer that is formed on a surface of the single crystalline silicon in the upper layer as a mask. In the second etching process, the middle layer exposed by the first etching process is wet-etched, for example, with solution such as hydrogen fluoride.

The patent document No. 2 relates to an etching method for forming a thin-wall part (diaphragm), for example, in a semiconductor pressure sensor, and the etching method needs etching of a deep and large removal region.

In the etching method disclosed in the patent document No. 2, an etching process is carried out as follows in order to reduce an etching time and to equalize a thickness of the thin-wall part. An etching of a predetermined region of a silicon wafer having a PN junction is carried out from one surface of the silicon wafer in a state where the silicon wafer is soaked in a KOH solution and the etching is stopped in the vicinity of a PN junction surface by anodization of silicon. When the etching is stopped by anodization and a current gradient in the silicon wafer increases, a liquid that has a lower temperature and a lower concentration than the KOH solution in a processing tub is poured into the processing tub for diluting and cooling an etching solution. By reducing the temperature and the concentration of the etching solution before the whole etching-processed surface in a wafer surface reaches a PN junction portion, a thickness of the diaphragm (thin-wall part) is uniformed.

In the manufacturing method of the silicon structure disclosed in the patent document No. 1, single crystalline silicon of the upper layer is etched in a depth direction to form the movable part and the fixed part, and then silicon oxide of the middle layer is etched in a horizontal direction, that is, a direction along a substrate plane. However, because an etching rate of silicon oxide of the middle layer is low and an etching rate of single crystalline silicon of the upper layer is also low, there are limits to improve the etching rates.

The etching method disclosed in the patent document No. 2 needs to remove the whole of a deep and large removal region by etching, and there is a limit to decrease an etching time. In addition, the removal region that is deep and large is made of single crystalline silicon, and an etching rate is low as described above. Thus, there is a limit to improve the etching rate.

As described above, in etching of a complicated-shaped removal region and a deep and large removal region, improvement of the etching rate is an important issue.

In associated with the manufacture of the silicon structure in the patent document No. 1, a manufacturing method of a semiconductor device with laser irradiation has been invented to improve an etching rate. The manufacturing method includes a reforming process in which an inside of a single crystalline silicon substrate is partially polycrystallized such that a part is exposed from a surface by irradiating the single crystalline silicon substrate with a laser beam while moving a focal point, and an etching process in which the portion polycrystallized in the reforming process is etched with etchant.

The portion polycrystallized by the laser irradiation in the above-described method, a permeation rate and an adsorption ratio of the etchant are increased compared with the other portion of the single crystalline silicon substrate which is not polycrystallized. Thus, in the above-described manufacturing method, the etching rate can be improved when the semiconductor device is manufactured using the single crystalline silicon substrate by preliminary polycrystallizing a portion of the single crystalline silicon substrate in the reforming process and etching the polycrystallized portion with the etchant in the etching process. The above-described invention has already been filed by some of the inventors of the present invention and another associate and is published as JP-A-2011-040942 and US 2011/0034031 A1.

The etching process with a laser irradiation can be applied not only to a manufacture of a complicated-shaped semiconductor device, such as an acceleration sensor described in the patent document No. 1, but also to a semiconductor device in which a thin-wall part (diaphragm) is formed, such as a semiconductor pressure sensor in the patent document No. 2. However, a relationship between a laser irradiation and reformed portion formed thereby has not been clear. Thus, it has not been clear what kind of laser irradiation can form a required reformed layer and can provide a good etching. In addition, the manufacturing method of the latter semiconductor device that needs etching of a deep and large removal region needs further improvement of the etching rate compared with the manufacturing method of the former semiconductor device.

In the method disclosed in the patent document No. 3, a SOI substrate in which a sacrifice layer is formed on a support substrate and a semiconductor layer is formed on the sacrifice layer is prepared. The SOI substrate is irradiated with a laser beam while focusing on the sacrifice layer in a sacrifice section. The sacrifice section includes a movable part and a fixed part defined by opening portions penetrating the semiconductor layer and the opening portions. Accordingly, the sacrifice layer in the sacrifice section is polycrystallized. Then, etchant is introduced from the opening portions, the polycrystallized sacrifice layer is removed by etching, and thereby the movable part floats from the support substrate.

In the method disclosed in the patent document No. 3, because the sacrifice layer is directly polycrystallized by focusing the laser beam on the sacrifice layer, the etchant easily permeates the polycrystallized sacrifice layer and an etching rate increases. However, even when a part of the sacrifice layer is polycrystallized, it takes times for the etchant to reach the most distance portion of the sacrifice layer from the opening portion, and the productivity is limited. Thus, further improvement of the etching rate of the sacrifice layer is desirable.

SUMMARY

In view of the foregoing problems, it is an object of the present invention to provide a manufacturing method of a semiconductor device that can improve an etching rate.

In a manufacturing method of a semiconductor device according to a first aspect of the present invention, a substrate including single crystalline silicon is prepared, a reformed layer that continuously extends is formed in the substrate, and the reformed layer is removed by etching. The forming the reformed layer includes polycrystallizing a portion of the single crystalline silicon by irradiating the substrate with a pulsed laser beam while moving a focal point of the laser beam in the substrate.

The reformed layer formed by polycrystallizing single crystalline silicon has a higher permeation rate and a higher adsorption rate of an etchant than a surrounding portion made of single crystalline silicon. Thus, the above-described method can improve an etching rate.

A manufacturing method according to a second aspect of the present invention is a manufacturing method of a semiconductor device including a substrate that includes a first layer, a sacrifice layer disposed on the first layer, and a second layer disposed on the sacrifice layer. The second layer includes a structural body that is defined by an opening portion penetrating through the second layer. The substrate includes a sacrifice section in which the opening portion and the structural body are located. The structural body floats from the first layer by removing a portion of the sacrifice layer located in the sacrifice section. In the manufacturing method, the first layer is irradiated with a laser beam from above the second layer through the sacrifice layer in a state where a focal point of the laser beam is set to a portion of the first layer located in the sacrifice section, and thereby a thermal stress is transferred from the focal point of the laser beam toward an incident side of the laser beam, and micro cracks are formed in the portion of the sacrifice layer located in the sacrifice section by the thermal stress. The portion of the sacrifice layer with the micro cracks are removed by introducing an etchant from the opening portion and etching the portion of the sacrifice layer, and thereby the structural body floats from the first layer.

Because the micro cracks are intentionally formed in the sacrifice layer in the sacrifice section, the sacrifice layer can be reformed more efficiently compared with cases where the focal point of the laser beam is set to the sacrifice layer. Thus, an etchant permeates to a deep portion of the sacrifice layer more easily, and an etching rate of the sacrifice layer can be improved.

BRIEF DESCRIPTION OF THE DRAWINGS

Additional objects and advantages of the present invention will be more readily apparent from the following detailed description of embodiments when taken together with the accompanying drawings. In the drawings:

FIG. 21A to FIG. 21J are diagrams for explaining a mechanism of forming micro cracks;

FIG. 24A is a diagram showing a SEM photograph observed at 30-degree field of view, FIG. 24B is a diagram showing an illustrative view of the SEM photograph in FIG. 24A;

FIG. 27A is a diagram showing an illustrative cross-sectional view of a specimen, FIG. 27B is a diagram showing a SEM photograph of the specimen observed at magnification of 1000 times, FIG. 27C is a diagram showing an illustrative view of the SEM photograph in FIG. 27B;

DETAILED DESCRIPTION

First Embodiment

A manufacturing method of a semiconductor device according to a first embodiment of the present disclosure will be described with reference to the drawings. The manufacturing method includes a reformed layer forming process and an etching process. In the reformed layer forming process, a substrate made of single crystalline silicon is irradiated with a pulsed laser beam while moving a focal point of the laser beam, and thereby the single crystalline silicon is partially polycrystallized and a continuous reformed layer is formed in the single crystalline silicon. In the etching process, the reformed layer is removed by etching. The reformed layer forming process may be carried out with a laser irradiation equipment 50.

Figure 1:
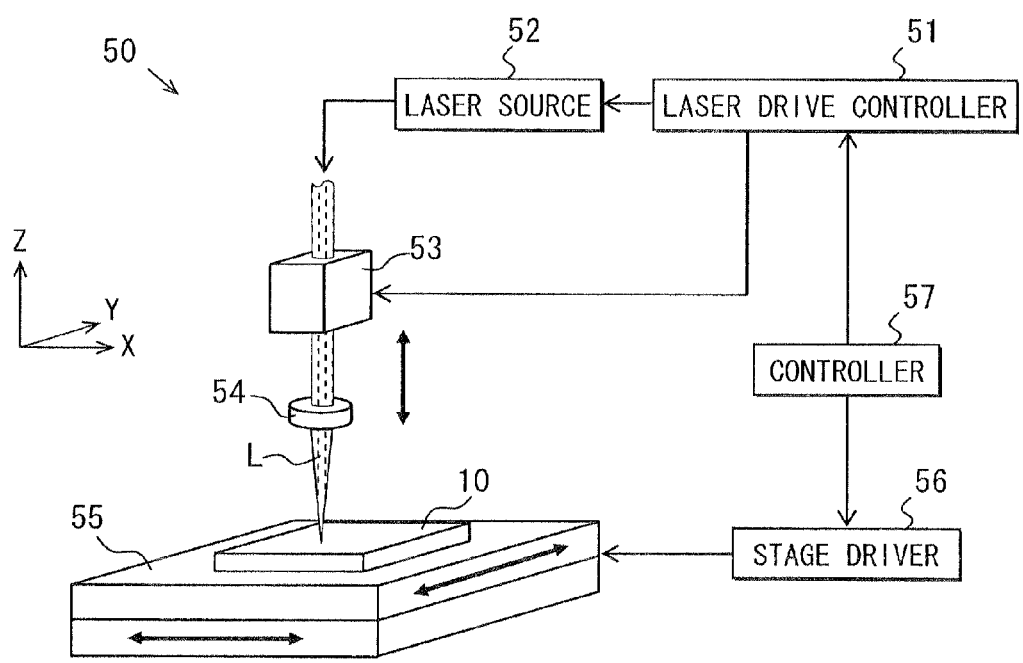
FIG. 1 a diagram showing a laser irradiation equipment used in a manufacturing method of a semiconductor device according to a first embodiment.

As shown in FIG. 1, the laser irradiation equipment 50 includes a laser drive controller 51, a laser source 52, an optical system including a variable focus lens 53 and a condensing lens 54, a stage 55 on which a substrate 10 is disposed, a stage driver 56, and a controller 57.

The laser drive controller 51 instructs the laser source 52 to output a pulsed laser beam L on instructions of the controller 57.

The laser source 52 generates the pulsed laser beam L. For example, the laser source 52 is a YAG laser having an oscillation wavelength of 1064 nm, an oscillation frequency of 80 kHz, and an output power of 0.96 W.

In the manufacturing method of the semiconductor device according to the present embodiment, the pulsed laser beam L is output while moving a focal point inside a substrate 10 made of single crystalline silicon. Thus, in order to concentrate pulse energy of the laser beam L in the substrate 10 without affecting a surface of the substrate 10, it is required that the laser beam L having an appropriate permeability (i.e., absorptivity) with respect to single crystalline silicon is not absorbed at the surface of the substrate 10, and the laser beam L is sufficiently absorbed at the focal point in the substrate 10 where the pulse energy is concentrated, and thereby causing polycrystallization. For this purpose, a wavelength of the laser beam L may be within a range from 1000 nm to 1100 nm. In cases where the wavelength of the laser beam L is less than 1000 nm, a transmittance is too low and energy absorption at the surface of the substrate 10 is large, and it may be difficult to supply the energy of the laser beam L to an inside of the substrate 10. In cases where the wavelength of the laser beam L is 1100 nm or more, a transmittance is too high and energy absorption is small, and it may be difficult to concentrate the energy of the laser beam L in the substrate 10.

The substrate 10 used in the manufacturing method according to the present embodiment may be a single crystalline silicon substrate and may also be a SOI substrate in which an oxide layer is buried in single crystalline silicon.

The variable focus lens 53 in the laser irradiation equipment 50 is disposed above the substrate 10 that is disposed on the state 55 and can move the focal point of the laser beam L in a Z-direction (a depth direction of the substrate 10). The condensing lens 54 condenses the laser beam L generated from the laser source 52 at the focal point set by the variable focus lens 53. A pulse spot diameter of the laser beam L condensed by the condensing lens 54 is within a range from about 1 µm to about 5 µm.

The stage 55 moves the substrate 10 in an X-Y direction (a direction along a substrate plane of the substrate 10) in a state where the substrate 10 is disposed on the state 55. The stage driver 56 moves the state 55 in the X-Y direction based on instructions of the controller 57. In the laser irradiation equipment 50 in FIG. 1, the focal point of the laser beam L is moved in a direction along the substrate plane of the substrate 10 (the X-Y direction) by the stage 55 as an example. The focal point of the laser beam L may also be optically moved in the X-Y direction. In the laser irradiation equipment 50 in FIG. 1, the focal point of the laser beam L is moved in the depth direction (the Z-direction) by the variable focus lens 53 as an example. The focal point of the laser beam L may also be moved in the Z-direction by moving the stage 55 in the Z-direction.

The controller 57 is a central controller and instructs the laser drive controller 51 and the stage driver 56 so that the laser source 52 outputs the pulsed laser beam L and the stage 55 is moved. The controller 57 executes the instructions according to a program that is previously prepared.

For example, the controller 57 firstly instructs the laser drive controller 51 to set the movable focus lens 53 so that the pulse spot of the laser beam L is located at a predetermined depth. Then, the controller 57 instructs the laser drive controller 51 and the stage driver 56 to move the stage 55 in a planar direction of the substrate 10 to a desired position and to irradiate the position with the pulsed laser beam L. When a region in a predetermined range is irradiated with the pulsed laser beam L, the controller 57 instructs the laser drive controller 51 and the stage driver 56 in such a manner that the stage 55 or the focal point of the variable focus lens 53 is moved in time with irradiation with the pulsed laser beam L.

Figure 2A:
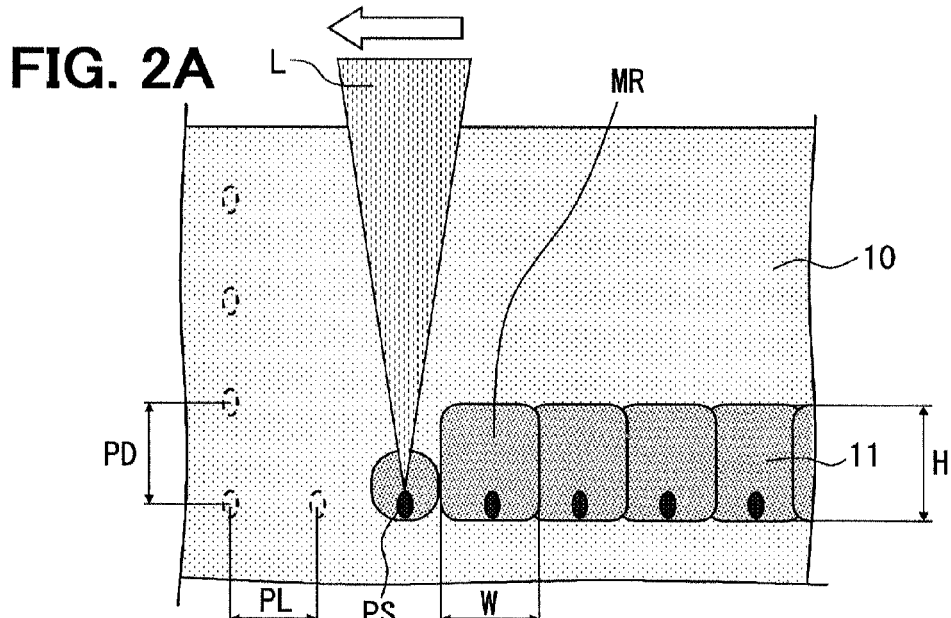
FIG. 2A is a diagram showing an illustrative cross-sectional view of a substrate in a reformed layer forming process.
Figure 2B:
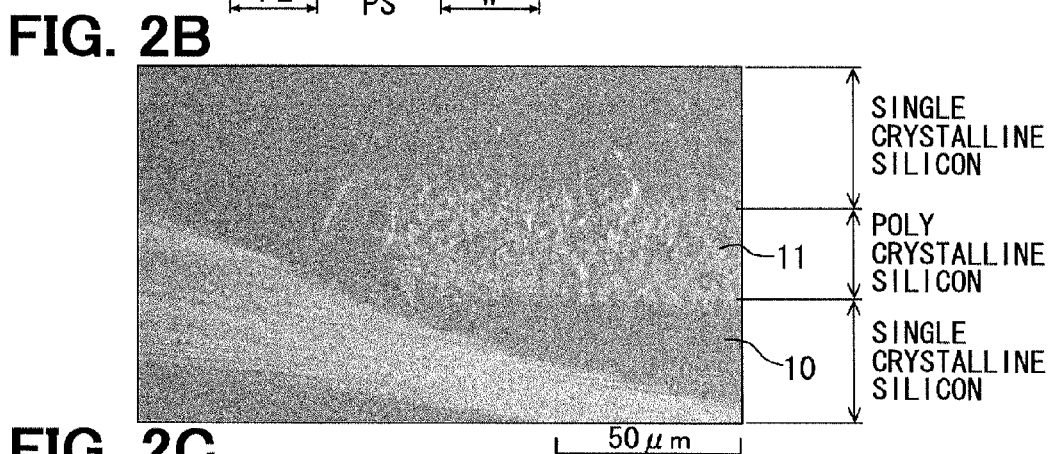
FIG. 2B is a diagram showing a partially enlarged cross-sectional view of a SEM photograph of a reformed layer.
Figure 2C:
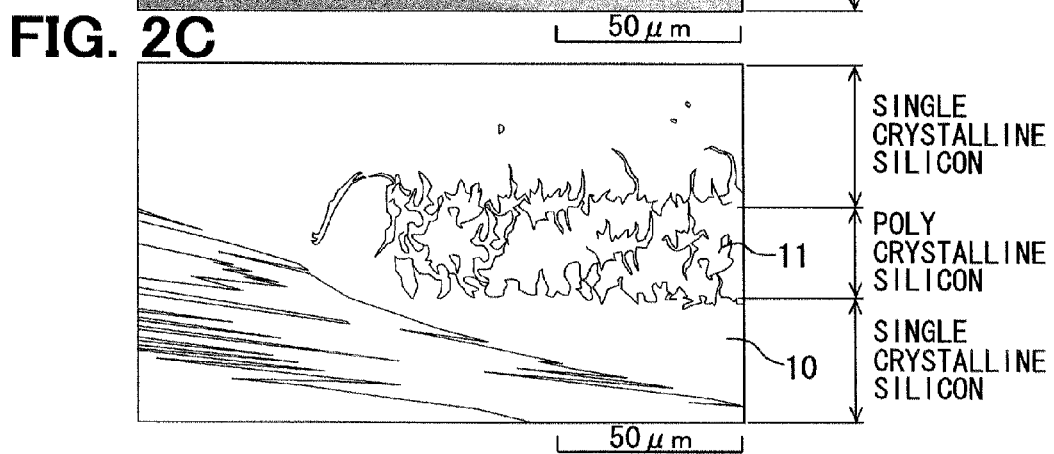
FIG. 2C is a diagram showing an illustrative cross-sectional view of the SEM photograph in FIG. 2B.

A state of the substrate 10 in a reformed layer forming process with the laser irradiation equipment 50 is shown in FIG. 2A to FIG. 2C.

In the reformed layer forming process shown in FIG. 2A, the substrate 10 made of single crystalline silicon is irradiated with the pulsed laser beam L while moving the focal point in a direction shown by the white arrow, and thereby the single crystalline silicon is partially polycrystallized and a reformed layer 11 is continuously formed in the single crystalline silicon. The reformed layer 11 is removed by etching in the following etching process.

A symbol PS shown in FIG. 2A is a pulse spot of the condensed laser beam L at the focal point and has a diameter within a range from about 1 µm to about 5 µm as described above. Pulse spots of the laser beam L to be formed later by movement of the focal point according to the program are show by dashed lines. In the example shown in FIG. 2A, the focal point of the laser beam L is moved at a planar pitch PL in a direction parallel to the substrate plane and is moved at a depth pitch PD in a direction vertical to the substrate plane. A symbol MR in FIG. 2A is a pulse polycrystallized region formed by one pulsed laser beam L. The pulse polycrystallized region has an average width W in the planar direction of the substrate 10 and has an average height H in a thickness direction of the substrate 10.

Figure 3:
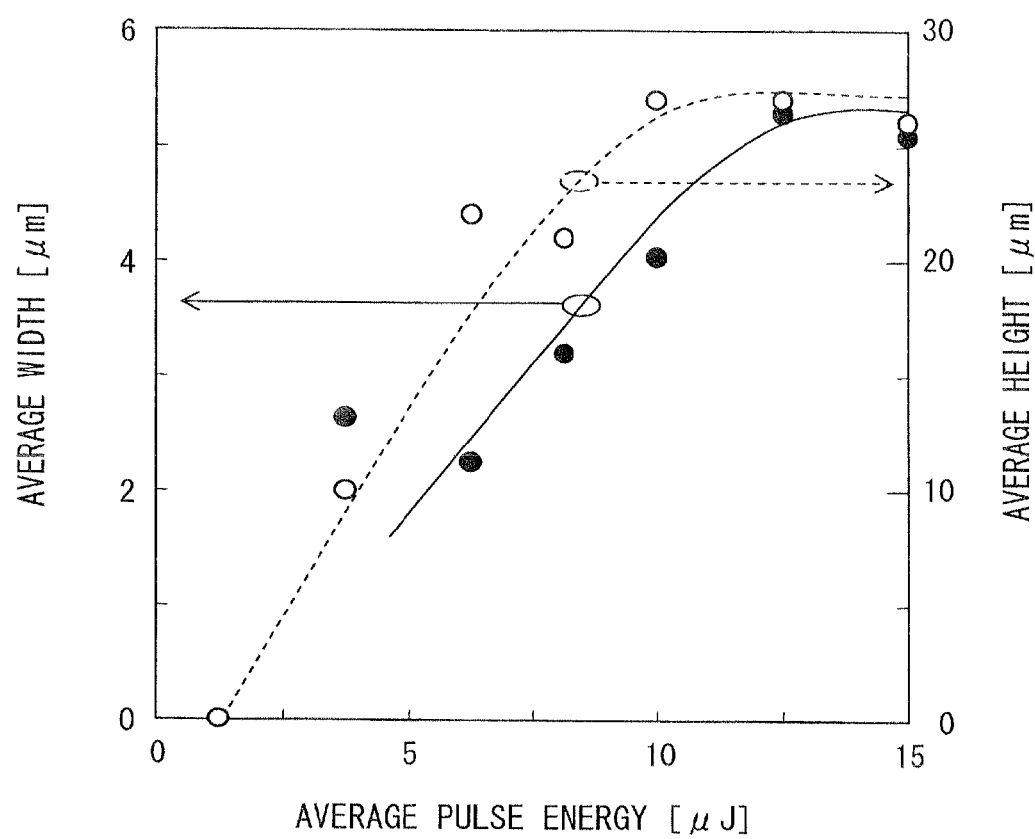
FIG. 3 is a graph showing a relationship between an average pulse energy of a laser beam and an average width and an average height of a pulse polycrystallized region.

FIG. 3 shows a result of studying a relationship between an average pulse energy of the laser beam L and an average width W and an average height H of the pulse polycrystallized region MR formed by the laser beam L.

As shown in FIG. 3, when the average pulse energy of the laser beam L is 2.5 µJ or less, a reformed layer 11 is not discriminated clearly, and polycrystallization is not sufficient. When the average pulse energy is about 4 µJ, the pulse polycrystallized region MR can be clearly discriminated. When the average pulse energy is increased from 6.25 µJ to 12.5 µJ, the pulse polycrystallized region MR enlarges. However, even when the average pulse energy is increased to be more than 15 µJ, a size of the pulse polycrystallized region MR is hardly changed and is constant.

From the above-described result, the average pulse energy of the laser beam L may be set to be more than 2.5 µJ. In addition, the average pulse energy may be set to be 15 µJ or less. The average pulse energy may also be set within a range from 6.25 µJ to 12.5 µJ.

The pulse polycrystallized region MR obtained in the above-described range of the average pulse energy of the laser beam L has an average width W within a range from about 2 µm to about 5 µm in the direction parallel to the substrate plane and has an average height H within a range from about 10 µm to about 25 µm in the direction vertical to the substrate plane.

Thus, in the manufacturing method according to the present embodiment, in cases where a direction of the movement of the focal point is parallel to the substrate plane, the planar pitch PL of the movement of the focal point may be 5 µm or less, and the planar pitch PL may also be within a range from 2 µm to 4 µm. When the focal point of the pulsed laser beam L is moved in the direction parallel to the substrate plane on these conditions, the pulse polycrystallized regions MR formed at adjacent focal points can be overlapped with certainty, and the reformed layer 11 that continues in the direction parallel to the substrate plane can be formed stably and efficiently.

On the other hand, in cases where a direction of the movement of the focal point is vertical to the substrate plane, the depth pitch PD of the movement of the focal point may be 27 µm or less, and the depth pitch PD may also be within a range from 10 µm to 25 µm. When the focal point of the pulsed laser beam L is moved in the direction vertical to the substrate plane on these conditions, the pulse polycrystallized regions MR formed at adjacent focal points can be overlapped with certainty, and the reformed layer 11 that continues in the direction vertical to the substrate plane can be formed stably and efficiently.

In examples shown in FIG. 4A to FIG. 6C, the reformed layers 11 are formed by the pulsed laser beam L which has the average pulse energy of 5 µJ, 12.5 µJ, and 15 µJ.

Figure 4A:
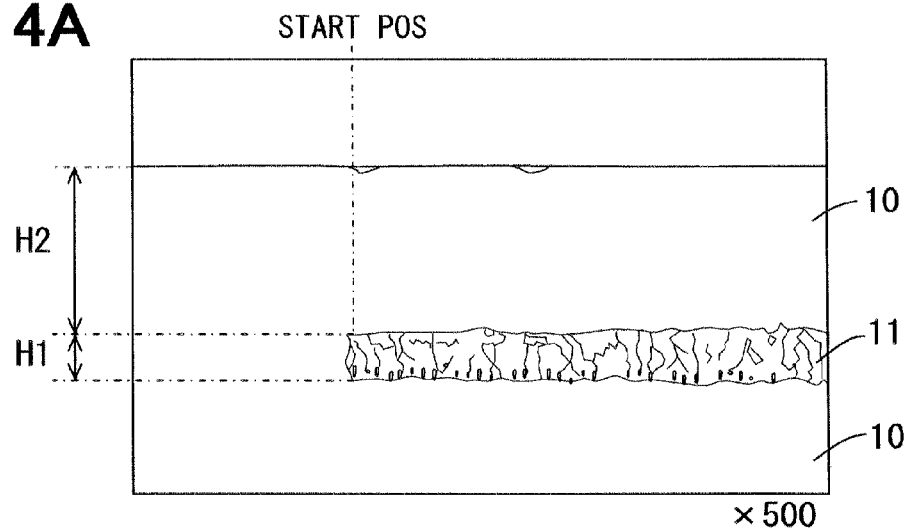
FIG. 4A is a diagram showing an illustrative cross-sectional view of a SEM photograph of a single crystalline silicon wafer, which is reformed by a pulsed laser beam having an average energy of 5 µJ.
Figure 4B:
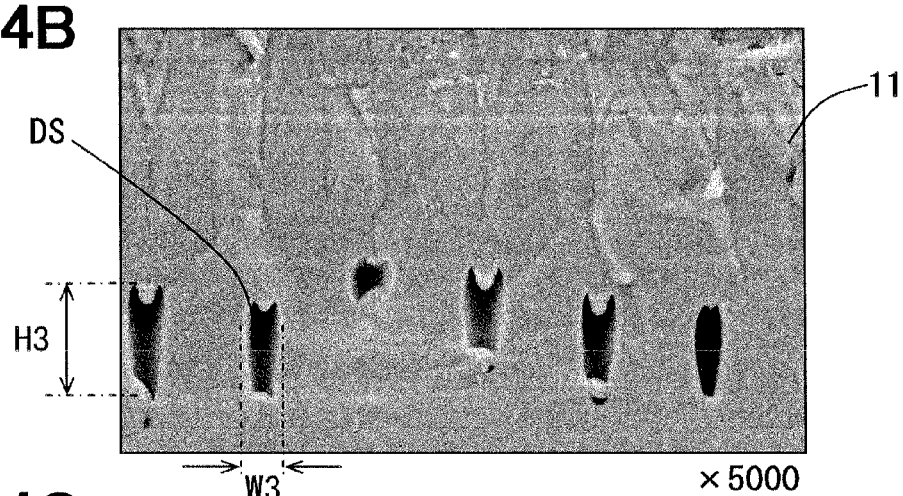
FIG. 4B is a diagram showing a partially enlarged cross-sectional view of the SEM photograph in FIG. 4A.
Figure 4C:
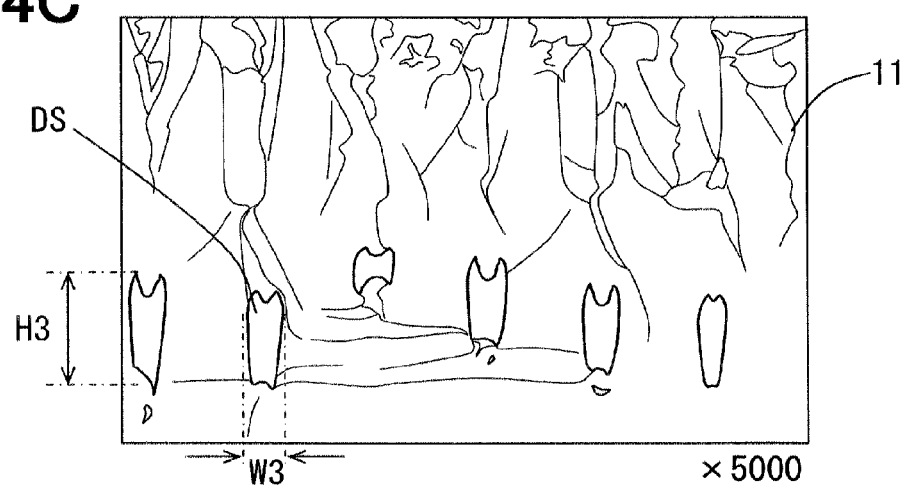
FIG. 4C is a diagram showing an illustrative cross-sectional view of the SEM photograph in FIG. 4B.

In the example shown in FIG. 4A to FIG. 4C, the average pulse energy is 5 µJ (average output: 0.4 W), the pulse frequency is 80 kHz, and a transporting speed in the planar direction is 300 mm/s. As shown in FIG. 4A, the reformed layer 11 is formed at a position at 60 µm (H2) from the surface of the substrate 10 made of single crystalline silicon with a thickness of about 15 µm (H1). In addition, as shown in FIG.

4B, at a bottom of the reformed layer 11, macrodomes DS having a thickness of about 4 μm (H3) and a width of about 1 μm (W3) are formed. The micro domes DS correspond to the pulse spots PS at the focal point of the laser beam L shown in FIG. 2A. It can be thought that the micro domes DS are formed because single crystalline silicon is melted once at the pulse spots PS.

Figure 5A:
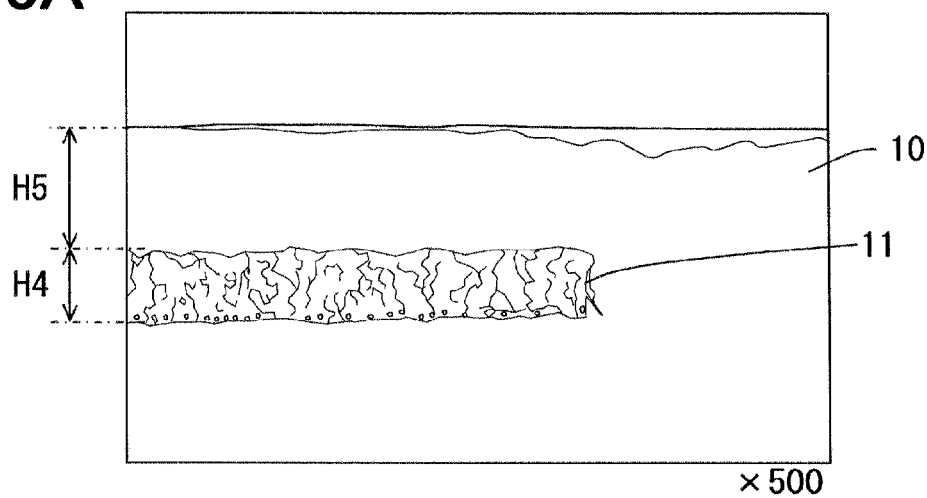
FIG. 5A is a diagram showing an illustrative cross-sectional view of a SEM photograph of a single crystalline silicon wafer, which is reformed by a pulsed laser beam having an average energy of 12.5 µJ.
Figure 5B:
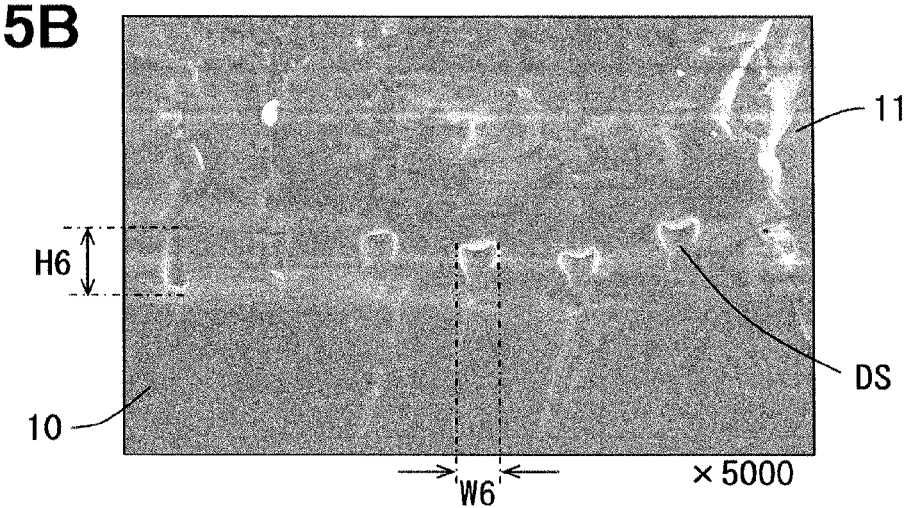
FIG. 5B is a diagram showing a partially enlarged cross-sectional view of the SEM photograph in FIG. 5A.
Figure 5C:
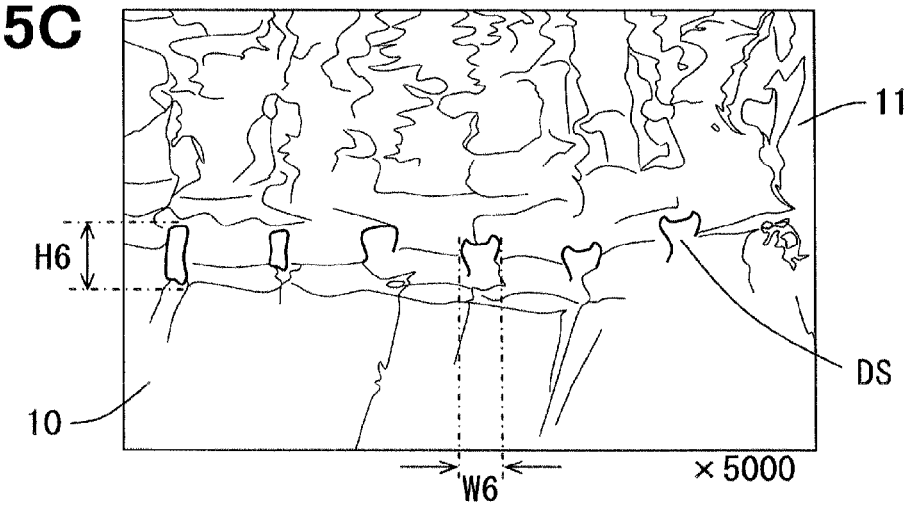
FIG. 5C is a diagram showing an illustrative cross-sectional view of the SEM photograph in FIG. 5B.

In the example shown in FIG. 5A to FIG. 5C, the average pulse energy is 12.5 μJ (average output: 1.0 W), the pulse frequency is 80 kHz, and the transporting speed in the planar direction is 300 mm/s. As shown in FIG. 5A, the reformed layer 11 is formed at a position at 45 μm (H5) from the surface of the substrate 10 made of single crystalline silicon with a thickness of about 30 μm (H4). In addition, as shown in FIG. 5B, micro domes DS having a thickness of about 2 μm (H6) and a width of about 1 μm (W6) are formed.

Figure 6A:
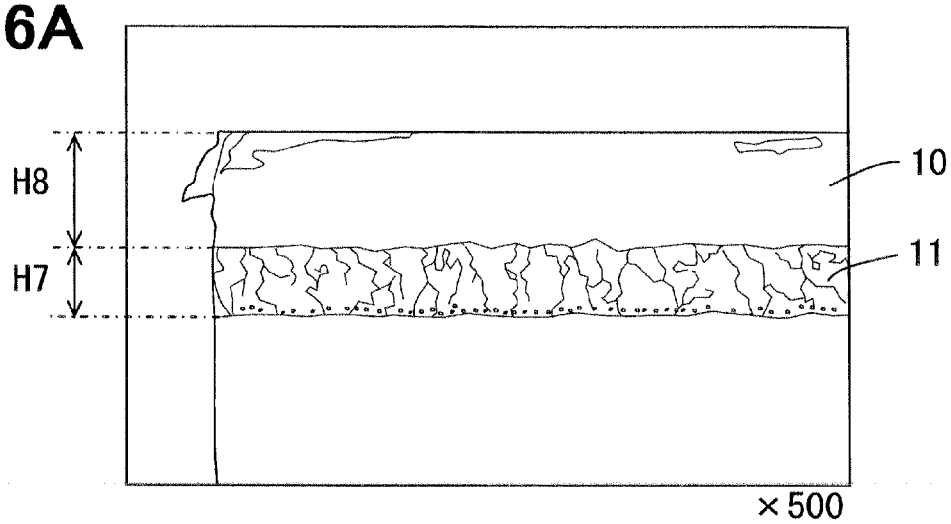
FIG. 6A is a diagram showing an illustrative cross-sectional view of a SEM photograph of a single crystalline silicon wafer, which is reformed by a pulsed laser beam having an average energy of 15 µJ.
Figure 6B:
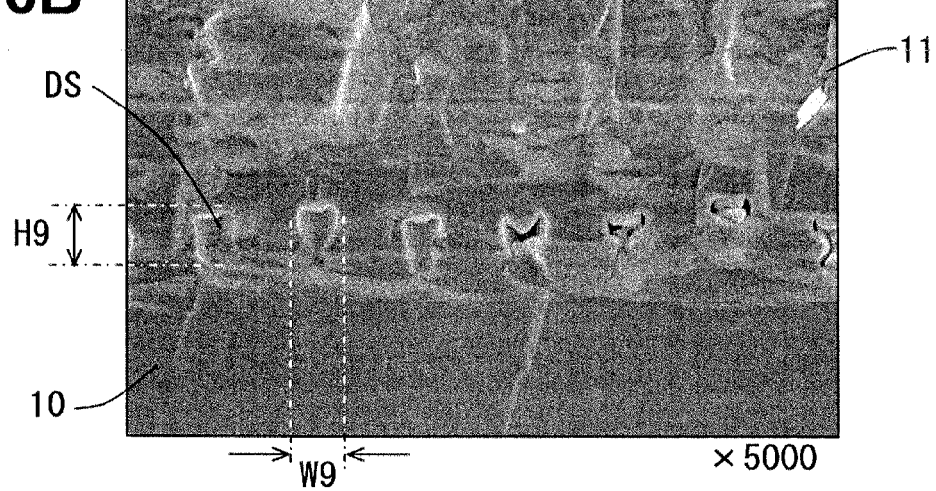
FIG. 6B is a diagram showing a partially enlarged cross-sectional view of the SEM photograph in FIG. 6A.
Figure 6C:
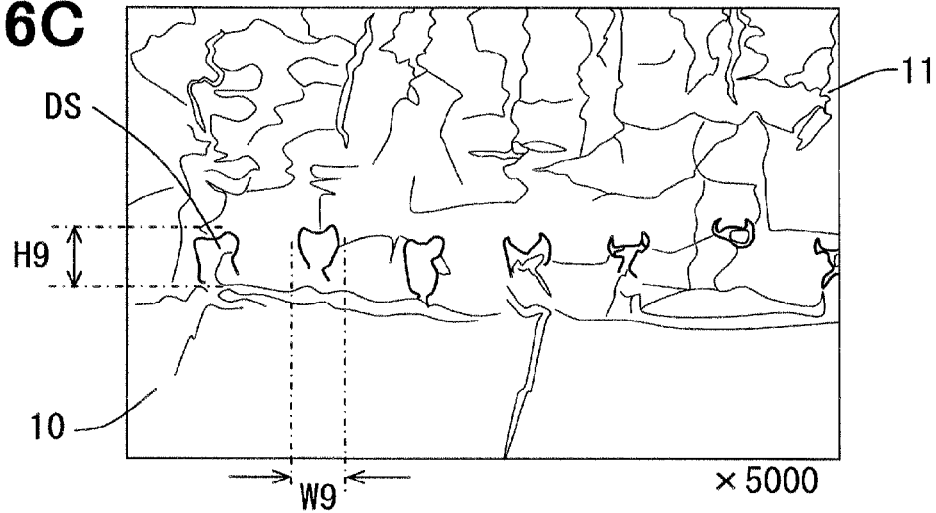
FIG. 6C is a diagram showing an illustrative cross-sectional view of the SEM photograph in FIG. 6B.

In the example shown in FIG. 6A to FIG. 6C, the average pulse energy is 15 μJ (average output: 1.2 W), the pulse frequency is 80 kHz, and the transporting speed in the planar direction is 300 mm/s. As shown in FIG. 6A, the reformed layer 11 is formed at a position at 45 μm (H8) from the surface of the substrate 10 made of single crystalline silicon with a thickness of about 30 μm (H7). In addition, as shown in FIG. 6B, micro domes DS having a thickness of about 2 μm (H9) and a width of about 1 μm (W6) are formed.

In the manufacturing method according to the present embodiment, because the substrate 10 made of single crystalline silicon is irradiated with the pulsed laser beam L whose focus is narrowed, the pulse energy of the laser beam L can be a small region (pulse spot PS) inside the substrate 10 without affecting the surface of the substrate 10. Single crystalline silicon in the small region at which the pulse energy is condensed melts once and then polycrystallizes. In the reformed layer forming process, small polycrystallized regions (pulse polycrystallized regions MR) formed at respective focal points by respective pulsed laser beam L are connected by moving the focal point at an appropriate pitch (intervals) when the pulsed laser beam L is emitted, and thereby the continuous reformed layer 11 is formed.

In the continuous reformed layer 11 formed by polycrystallizing single crystalline silicon, a permeation rate and an adsorption rate is higher than a surrounding portion made of single crystalline silicon and an etching rate is increased. Thus, in the next etching process, a higher etching rate can be achieved compared with cases where the continuous reformed layer 11 is not formed.

The continuous reformed layer 11 can be formed into any shape by appropriately setting movement (direction) of the focal point and can be applied to the manufacture of a wide range of semiconductor devices that need etching of a complicated-shaped removal region or a deep and large removal region. In addition, because the continuous reformed layer 11 is formed by irradiating with the pulsed laser beam L while moving the focal point, energy use efficiency of the laser beam L can be increased and a forming rate of the reformed layer 11 can be increased compared with cases where a laser beam L is continuously output while moving the focal point continuously.

As described above, the manufacturing method according to the present embodiment is the manufacturing method of the semiconductor device with etching using irradiation of the laser beam L, and the manufacturing method can be applied to the manufacture of a wide range of semiconductor devices that need etching of a complicated-shaped removal region or a deep and large removal region and can achieve a high etching rate.

Next, examples of the application of the manufacturing method according to the present embodiment will be described.

Figure 7:
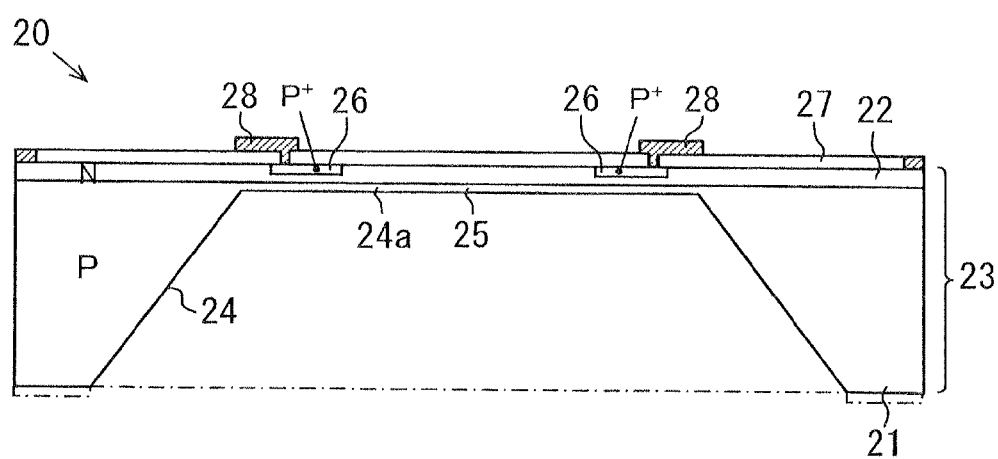
FIG. 7 is a cross-sectional view of a semiconductor pressure sensor to which the manufacturing method according to the first embodiment can be applied.

The manufacturing method according to the present embodiment can be applied, for example, to a manufacturing method of a semiconductor pressure sensor 20 including a piezoresistance layer shown in FIG. 7.

In the semiconductor pressure sensor 20, an N type epitaxial layer 22 having a thickness of 6 μm is formed on a surface of a P type silicon substrate 21 having a crystal orientation (100), and this layered body forms a semiconductor substrate 23. The P type silicon substrate 21 has a depressed portion 24 on a surface, and a bottom surface 24a of the depressed portion 24 forms a thin-wall portion 25. The thin-wall portion 25 is a sensor diaphragm.

In FIG. 7, P+ type impurity diffusion layers 26 are formed in the N type epitaxial layer 22, and the P+ type impurity diffusion layer 26 functions as piezoresistance elements for detecting distortion. On a surface of the N type epitaxial layer 22, a silicon oxide layer 27 is formed. The P+ type impurity diffusion layers 26 are electrically pulled out to a surface side of the silicon oxide layer 27 through aluminum wirings 28.

As described above, the semiconductor pressure sensor 20 shown in FIG. 7 is a sensor including a diaphragm (the thin-wall portion 25) and is a semiconductor device that needs etching of a deep and large removal region (the depressed portion 24). Conventionally, the depressed portion 24 of the semiconductor pressure sensor 20 is formed, for example, by electrochemical etching.

The manufacturing method according to the present embodiment can be applied to manufacturing a sensor including a diaphragm, such as the semiconductor pressure sensor 20 shown in FIG. 7, and the reformed layer forming process and the etching process can be applied to forming the diaphragm.

Examples of manufacturing processes of a sensor 30 including a diaphragm 35 to which the manufacturing method described with reference to FIG. 1 to FIG. 6C is applied will be described with reference to FIG. 8A to FIG. 8D and FIG. 9A to FIG. 9D.

Figure 8A:
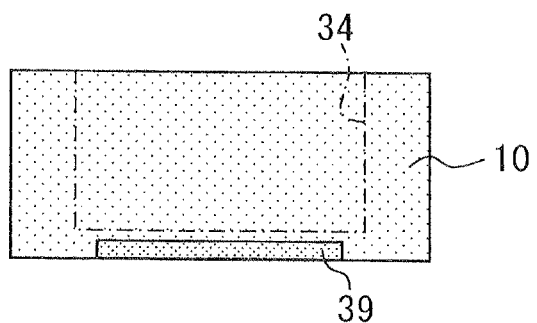
FIG. 8A to FIG. 8D are cross-sectional views showing an example of manufacturing processes of a sensor to which the manufacturing method according to the first embodiment is applied.

In the example of the manufacturing processes shown in FIG. 8A to FIG. 8D, firstly a substrate 10 made of single crystalline silicon is prepared as shown in FIG. 8A, and each component of a sensor structure 39 is formed in a surface portion of the substrate 10 that becomes the diaphragm 35. In FIG. 8A, a removal region 34 of the substrate 10 for forming the diaphragm 35 is shown by a dashed-dotted line.

Figure 8B:
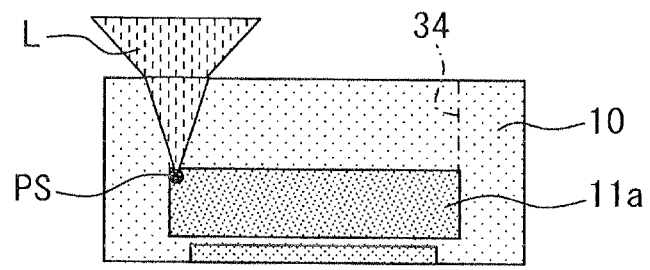
Figure 8C:
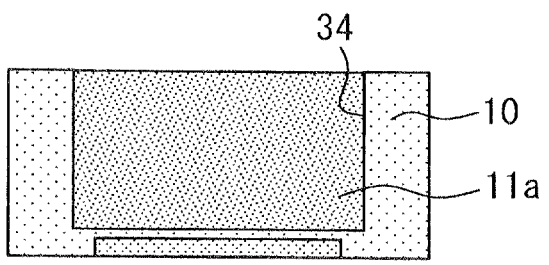

Next, as shown in FIG. 8B, the reformed layer forming process described with reference to FIG. 1 to FIG. 6 is carried out, and the reformed layer 11a is formed while moving the focal point of the pulsed laser beam L to cover the whole area of the removal region 34. Accordingly, as shown in FIG. 8C, the whole area of the removal region 34 is changed into the reformed layer 11a that is polycrystallized.

Figure 8D:
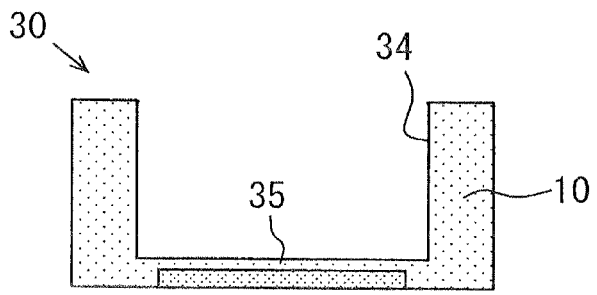

Finally, as shown in FIG. 8D, the etching process is carried out and the reformed layer 11a is removed by etching. Accordingly, the sensor 30 including the diaphragm 35 is manufactured.

In this way, the diaphragm 35 of the sensor 30 can be formed by changing the whole area of the removal region 34 located under the diaphragm 35 into the reformed layer 11a and removing the reformed layer 11a by etching. The present method can reduce the etching time compared with cases where the reformed layer 11a is not formed as described above, and a mask for defining the removal region 34 is not required. Because the reformed layer 11a removed by etching is polycrystallized, the method is free from anisotropic etching with respect to a crystal face orientation in cases where single crystalline silicon is treated with wet etching as the semiconductor pressure sensor in FIG. 7. Thus, a depressed structure with a high aspect ratio can be formed, and an open area under the diaphragm 35 can be reduced.

Figure 9A:
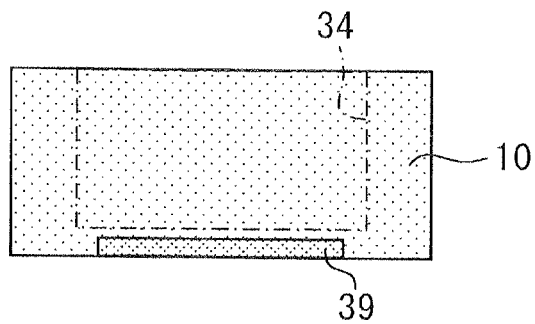
FIG. 9A to FIG. 9D are cross-sectional views showing another example of manufacturing processes of a sensor to which the manufacturing method according to the first embodiment is applied.

The sensor 30 including the diaphragm 35 can also be manufactured by the method shown in FIG. 9A to FIG. 9D. Firstly, as shown in FIG. 9A, a substrate 10 made of single crystalline silicon is prepared, and each component of a sensor structure 39 is formed in the surface portion of the substrate 10 that becomes the diaphragm 35.

Figure 9B:
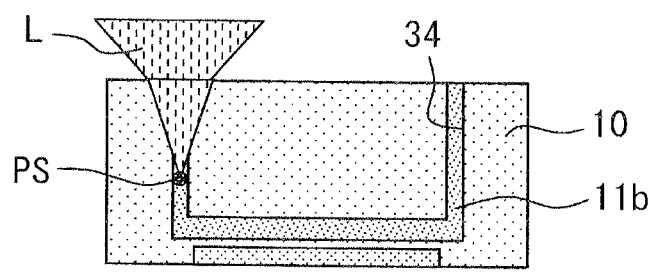
Figure 9C:
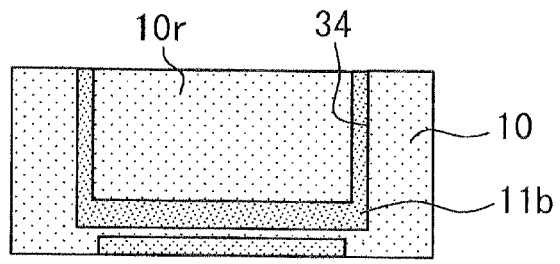

Next, as shown in FIG. 9B, the reformed layer forming process described with reference to FIG. 1 to FIG. 6 is carried out, and the reformed layer 11b is formed while moving the focal point of the pulsed laser beam L along an interface of the removal region 34 under the diaphragm 35. Accordingly, as shown in FIG. 9C, the reformed layer 11b that is polycrystallized is formed along the interface of the removal region 34.

Figure 9D:
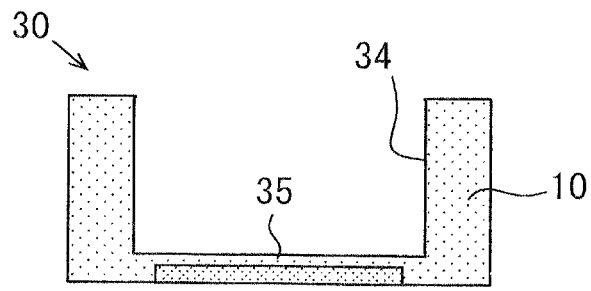

Finally, as shown in FIG. 9D, the etching process is carried out and the reformed layer 11b is removed by etching. Accordingly, a remaining portion 10r made of single crystalline silicon in the removal region 34 in FIG. 9C is hollowed out and the sensor 30 including the diaphragm 35 is manufactured.

Compared with the manufacturing method shown in FIG. 8A to FIG. 8D in which the whole area of the removal region 34 under the diaphragm 35 is changed into the reformed layer 11a, the manufacturing method shown in FIG. 9A to FIG. 9D in which the reformed layer 11b is formed along the interface of the removal region 34 and the removal region 34 is hollowed out is a more preferable method because the forming time of the reformed layer 11b can be reduced in addition to the above-described merits of forming the reformed layer 11a.

When the diaphragm 35 is formed by hollowing out the removal region 34 shown in FIG. 9A to FIG. 9D, the etching process may include a wet etching using etchant having a high etching rate such as a potassium hydroxide (KOH) solution or tetra-methyl ammonium hydroxide (TMAH) solution.

A preferable relationship between a size of the reformed layer 11b formed along the interface of the removal region 34 and an etching will be described. In an example shown in FIG. 10A, the diaphragm 35 has a maximum width WD.

As shown in FIG. 2 and FIG. 3, the average width W of the pulse polycrystallized regions MR is within a range from about 2 μm to about 5 μm, and the average height H of the pulse polycrystallized region MR is with a range from about 10 μm to 25 μm. Thus, when the reformed layer 11b that continues in the direction vertical to the substrate plane is formed with the minimum size by moving the focal point of the laser beam L in the direction vertical to the substrate plane, the average width W of the reformed layer 11b in the substrate plane is also with a range from about 2 μm to about 5 μm. When reformed layer 11b that continues in the direction parallel to the substrate plane is formed with the minimum size by moving the focal point of the laser beam L in the direction parallel the substrate plane, the average height H of the reformed layer 11b in the direction vertical to the substrate plane is also within a range from about 10 μm to about 25 μm. Thus, in order to remove the reformed layer 11b completely by etching, it is necessary to supply etchant to a backmost of the reformed layer 11b having the minimal size.

Figure 10A:
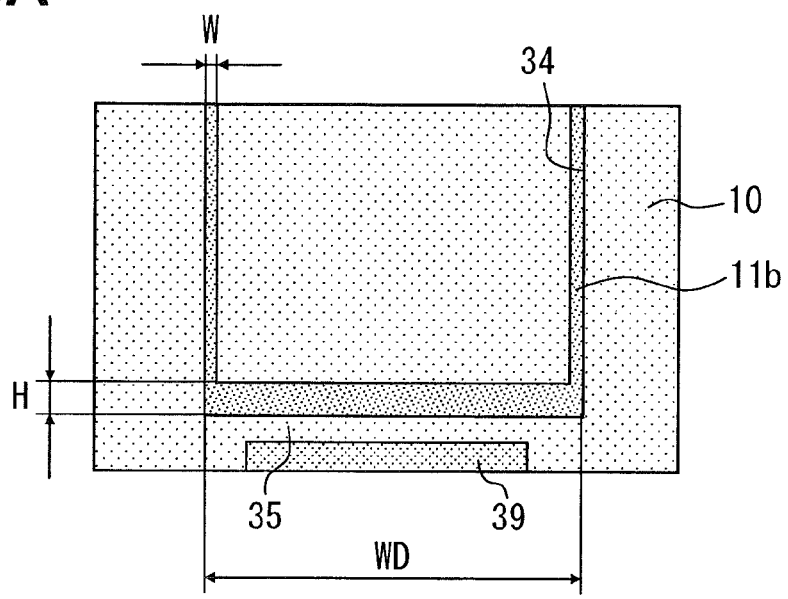
FIG. 10A is a cross-sectional view showing a size of each portion of a reformed layer formed along an interface of a removal region.
Figure 10B:
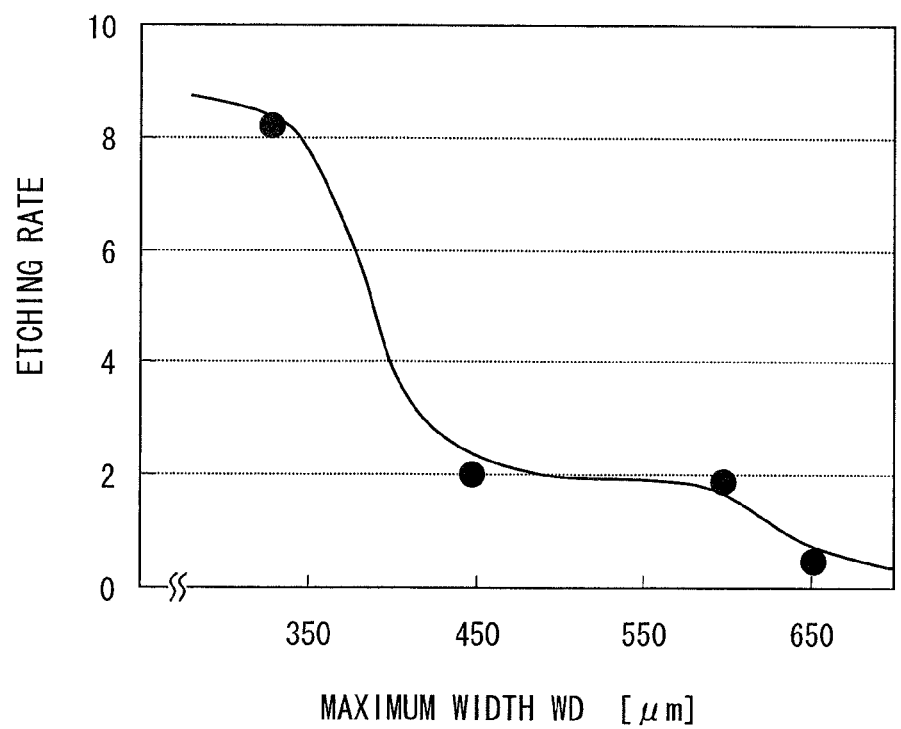
FIG. 10B is a graph showing a relationship between a maximum width of the reformed layer and an etching rate.

As is known from the relationship between the maximum width WD of the diaphragm 35 and the etching rate shown in FIG. 10B, when the maximum width WD of the diaphragm 35 in the substrate plane is more than 350 μm, the etching rate is reduced to about ¼, and when the maximum width WD is more than 600 μm, the etching rate is further reduced to about ¼ and the etching rate becomes very low.

Thus, in order to supply the etchant sufficiently to the reformed layer 11b shown in FIG. 10A formed in the substrate 10 under the diaphragm 35, the maximum width WD of the diaphragm 35 in the substrate plane may be 600 μm or less, and the maximum width WD may also be 350 μm or less.

Next, other exemplary methods of forming a diaphragm 35 being flat and having a uniform thickness will be described with reference to FIG. 11A to FIG. 11C and FIG. 12A to FIG. 12C.

By irradiation with the pulsed laser beam L, various defects may be generated in single crystalline silicon surrounding the reformed layers 11, 11a, 11b. Thus, in the manufacturing methods shown in FIG. 11A to FIG. 11C and FIG. 12A to FIG. 12C, the etching process is carried out in two stages.

Figure 11A:
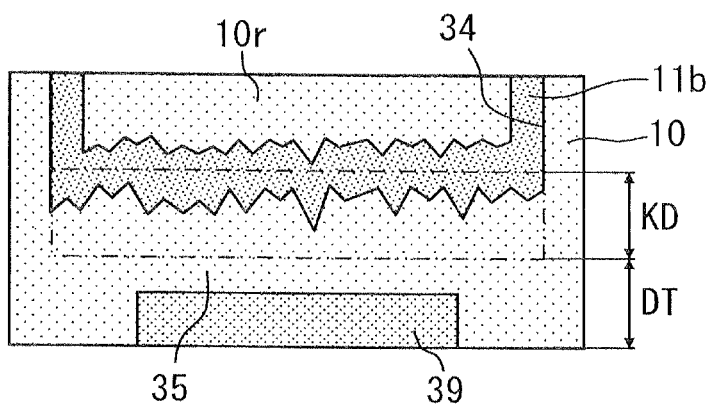
FIG. 11A to FIG. 11C are cross-sectional views showing an example of manufacturing processes of a diaphragm.
Figure 11B:
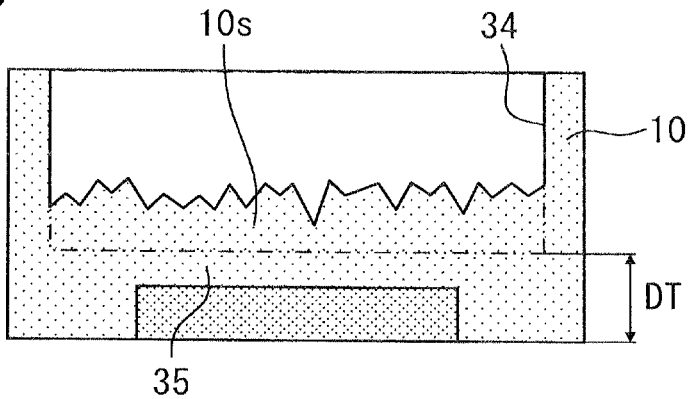
Figure 11C:
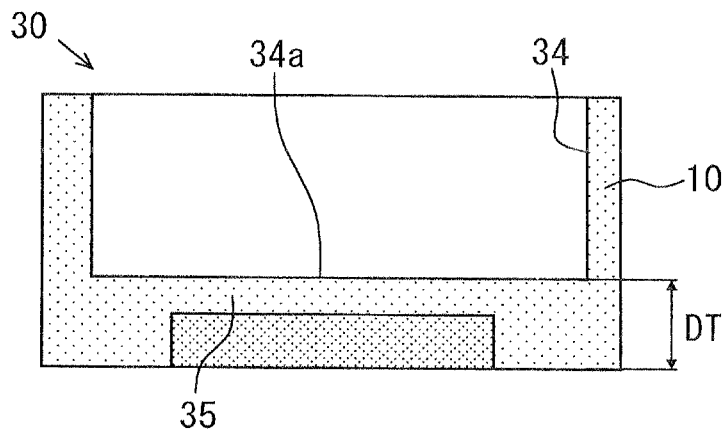

In the manufacturing method in FIG. 11A to FIG. 11C, firstly, as shown in FIG. 11A, the reformed layer 11b is formed at a distance KD with respect to a thickness DT of the diaphragm 35 that is formed finally. Next, as shown in FIG. 11B, the reformed layer 11b is removed by a first etching, and a remaining portion 10r made of single crystalline silicon is hollowed out. Finally, as shown in FIG. 11C, a remaining portion 10s made of single crystalline silicon and remaining under the diaphragm 35 in FIG. 11B is removed by a second etching, and the diaphragm 35 having the thickness DT and having a flat bottom surface 34a is formed.

Figure 12A:
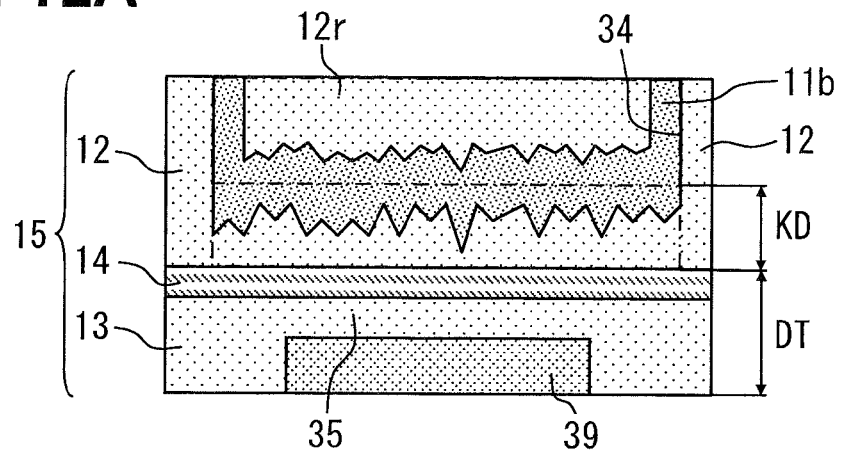
FIG. 12A to FIG. 12C are cross-sectional views showing another example of manufacturing processes of a diaphragm.
Figure 12B:
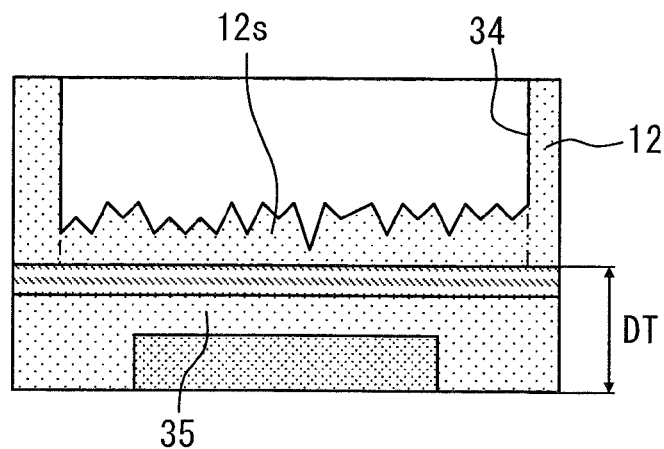
Figure 12C:
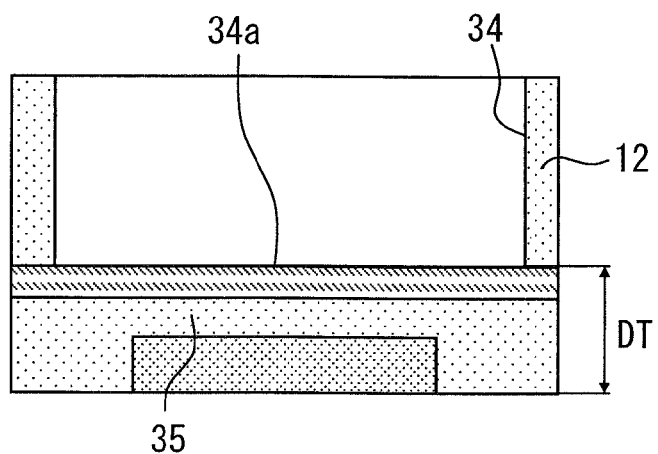

In the manufacturing method in FIG. 12A to FIG. 12C, a SOI substrate 15 in which an oxide layer 14 is buried in singe crystalline silicon layers 12, 13 is used, and the single crystalline silicon layer 12 on a support substrate side is etched until the oxide layer 14 is exposed to form the diaphragm 35. Firstly, as shown in FIG. 12A, the reformed layer 11b is formed at a distance KD with respect to a thickness DT of the diaphragm 35 that is formed finally. Next, as shown in FIG. 12B, the reformed layer 11b is removed by a first etching, and a remaining portion 12r made of single crystalline silicon is hollowed out. Finally, as shown in FIG. 12C, a remaining portion 12s made of single crystalline silicon and remaining under the diaphragm 35 in FIG. 12B is removed by a second etching, and the diaphragm 35 having the thickness DT and having a flat bottom surface 34a is formed.

As described above, when a diaphragm being flat and having a uniform thickness is formed, it is preferable that the reformed layer 11, 11a, 11b is formed in parallel with the substrate plane at a distance within a range from 10 μm to 30 μm (the distance KD in FIG. 11 and FIG. 12) from the diaphragm that is formed finally.

As described above, various defects may be caused in single crystalline silicon that surrounds the reformed layer 11, 11a, 11b formed by irradiation with the pulsed laser beam L. When a distance between the diaphragm that is formed finally and the reformed layer 11, 11a, 11b is 10 μm or more, single crystalline silicon including defects caused by the irradiation with the pulsed laser beam L can be completely removed. In addition, by setting the distance to be 30 μm or less, a width of single crystalline silicon used as an etching reserved portion for removing defects can be kept at a minimum, and a whole etching time can be restricted.

The manufacturing method described with reference to FIG. 1 to FIG. 6C can be applied not only to a semiconductor device that needs etching of a deep and large removal region such as the sensor 30 including the diaphragm 35 shown in FIG. 7 to FIG. 12C but also to a semiconductor device that needs etching of a complicated-shaped removal region.

For example, the manufacturing method can be applied to manufacturing a capacitive acceleration sensor 40, which an example of a semiconductor dynamic quantity sensor that needs etching of a complicated-shaped removal region and includes a movable part being movable in accordance with application of dynamic quantity. The semiconductor dynamic quantity sensor may be any MEMS device that includes a movable part being movable in a predetermined direction in accordance with application of dynamic quantity. For example, the semiconductor dynamic quantity sensor may also be a capacitive angular velocity sensor, a vibration sensor, a microphone, or a micro scanner.

Figure 13A:
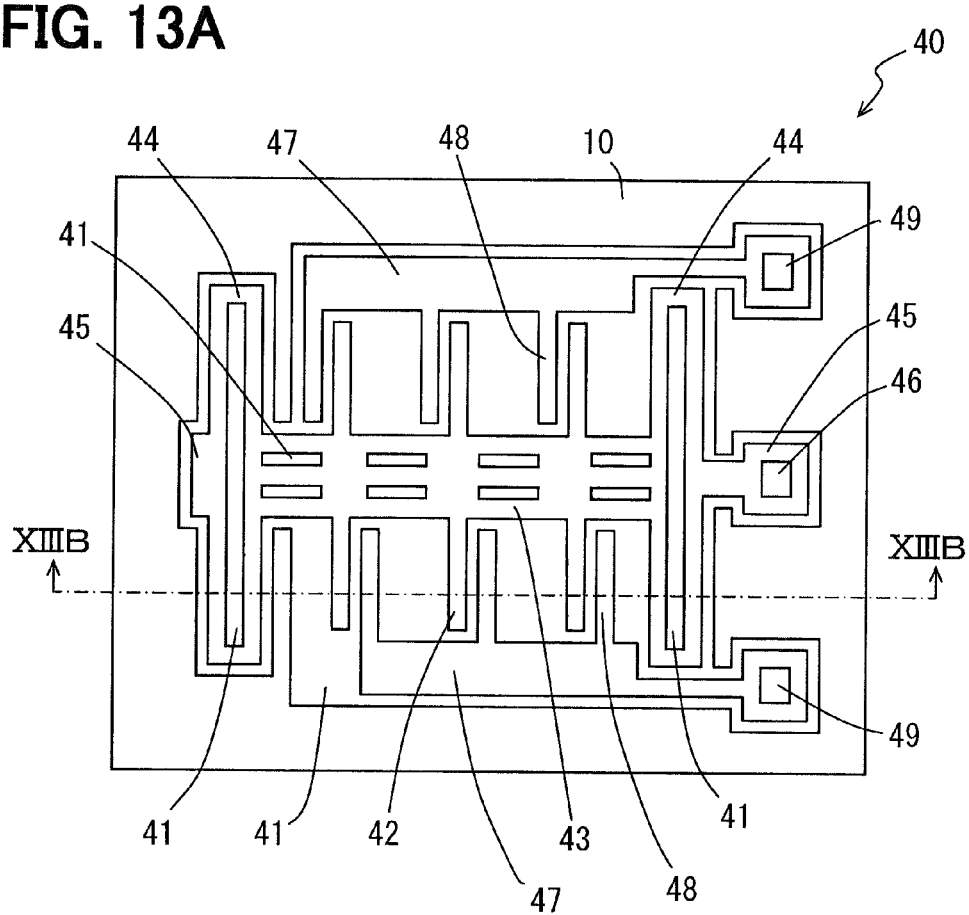
FIG. 13A is a top view of a semiconductor dynamic quantity sensor including a movable part.
Figure 13B:
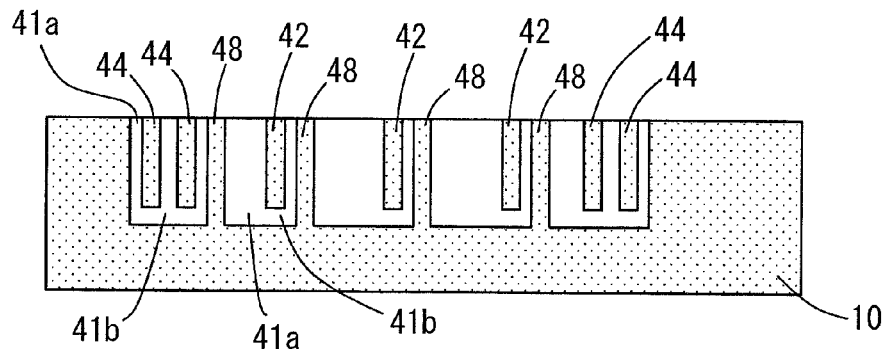
FIG. 13B is a cross-sectional view of the semiconductor dynamic quantity sensor taken along line XIIIB-XIIIB in FIG. 13A.

In the capacitive acceleration sensor 40 in FIG. 13A to FIG. 13B, the movable part can be moved (released) due to a trench portion 41a and a release portion 41b. The trench portion 41a is an etching part 41 etched in a depth direction of a substrate 10 made of single crystalline silicon. The release portion 41b is an etching part 41 etched in a horizontal direction in the substrate 10. The movable part is movable in a predetermined direction (a left to right direction in FIG. 13A and FIG. 13B) in accordance with application of dynamic quantity (i.e., acceleration). The movable part has a beam structure provided by dividing the substrate 10 with the etching part 41 and includes movable electrodes 42, spindle portions 43, and spring portions 44. The depth direction of the substrate 10 means a vertical direction of a plane (surface) of the substrate 10. On the other hands, the horizontal direction of the substrate 10 means a direction along the plane of the substrate 10.

A periphery (outer frame) of the spindle portion 43 that operates as mass to which acceleration is applied has a planar rectangular shape. The spindle portion 43 has a through hole as a part of the etching part 41 so that a portion of the substrate 10 under the spindle portion 43 can be easily removed by etching. The spindle portion 43 floats from a bottom surface of an etched space of the substrate 10, that is, the release portion 41b. Thus, the through hole in the spindle portion 43 penetrates from the surface of the substrate 10 to the release portion 41b. The spindle portion 43 does not always need the through hole.

The movable electrode 42 protrudes from a sidewall that is perpendicular to a displacement direction of the spindle portion 43. In the example shown in FIG. 13A and FIG. 13B, three movable electrodes 42 are formed on each sidewall. At both ends of the spindle portion 43 in the displacement direction, the spring portions 44 having a quadrangular-shaped beam structure are respectively coupled. The spring portions 44 are respectively coupled with anchors 45 that operate as supporting portions for supporting the movable part.

In this way, the movable part has the beam structure in which the beams that form the movable electrodes 42, the beams that form the spindle portions 43, and the beams that form the spring portions 44 are coupled with each other, and both ends of the beam structure as the movable part are fixed to the anchors 45. In other words, the movable electrodes 42, the spindle portions 43, and the spring portions 44 are supported by the anchors 45 and float from the bottom surface of the etched space of the substrate 10 (the release portion 41b).

One of the anchors 45 has a movable electrode pad 46 formed by patterning a metal layer made of, for example, aluminum.

Each of a plurality of fixed parts 47 includes a fixed electrode 48, a fixed electrode pad 49, and a portion connecting the fixed electrode 48 and the fixed electrode pad 49. In each of the fixed parts 47, the portion coupling the fixed electrode 48 and the fixed electrode pad 49 operate as a wiring that electrically couples the fixed electrode 48 and the corresponding fixed electrode pad 49.

Each of the fixed parts 47 is divided by the trench portion 41a that is the etching part 41 formed by etching the substrate 10 in the depth direction. The portions of the fixed parts 47 operating as the wirings are disposed in parallel with the spindle portions 43, and the fixed electrodes 48 extending from the portions are disposed opposite and parallel to the movable electrodes 42 protruding from both sidewalls of the spindle portion 43 with a predetermined detection distance (clearance) therebetween.

The number of the fixed electrodes 48 is same as the number of the movable electrodes 42. In addition, the fixed electrodes 48 are configured so that when acceleration is applied, one of electrostatic capacities of capacitors provided between the movable electrodes 42 and the fixed electrodes 48 increases and the other decreases. In other words, a configuration that provides differential amplification is formed.

Exemplary manufacturing processes of the capacitive acceleration sensor 40 will be described with reference to FIG. 14A to FIG. 14C.

Figure 14A:
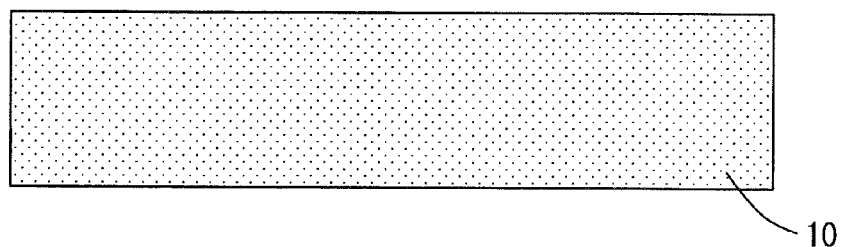
FIG. 14A to FIG. 14C are cross-sectional views showing manufacturing processes of the semiconductor dynamic quantity sensor shown in FIG. 13A and FIG. 13B.

Firstly, as shown in FIG. 14A, the substrate 10 made of single crystalline silicon is prepared.

Figure 14B:
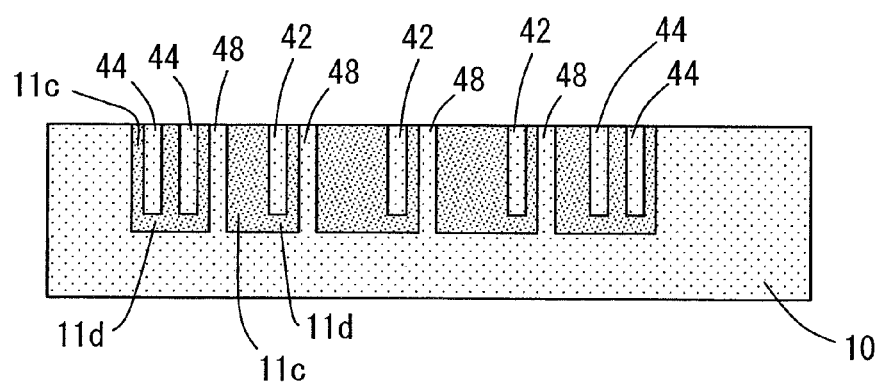

Next, as shown in FIG. 14B, the substrate 10 is irradiated with the laser beam L while moving the focal point of the laser beam L in an etching-planned region in the substrate 10. Accordingly, an inside of the substrate is partially (selectively) polycrystallized and reformed layers 11 including trench reformed layers 11c and release reformed layers lid are formed.

In other words, portions in the substrate 10 dividing the movable part and the fixed part are polycrystallized. Namely, portions surrounding forming-planned regions of the movable electrodes 42, the spindle portions 43, the spring portions 44, the anchors 45, and the fixed parts 47 are polycrystallized to form the trench reformed layers 11c and portions under forming-planned region of the movable electrodes 42, the spindle portions 43, and the spring portions 44 are polycrystallized to form the release reformed layer 11d.

The reformed layers 11 for forming the trench portions 41a are called the trench reformed layers 11c and the reformed layers 11 for forming the release portions 41b are called the release reformed layer 11d. In other words, the reformed layers 11 in the depth direction of the substrate 10 are called the trench reformed layers 11c, and the reformed layers 11 in the horizontal direction are called the release reformed layers 11d.

Figure 14C:
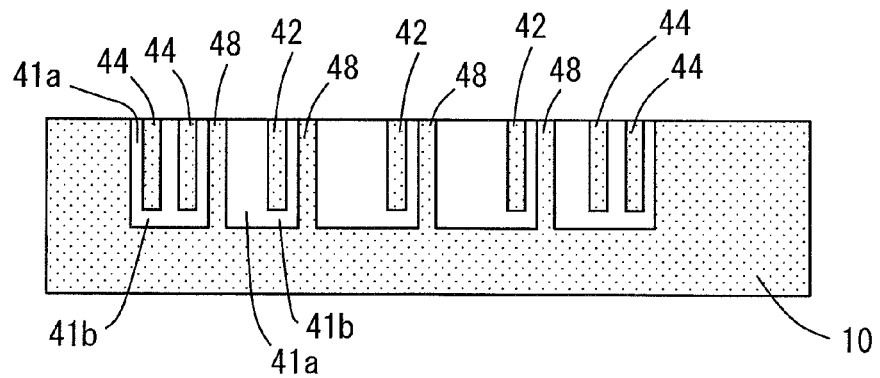

Next, as shown in FIG. 14C, an etching process is carried out and the reformed layer 11 formed by polycrystallizing the substrate 10 made of single crystalline silicon is removed by etching. The etching process may be either a wet etching or a dry etching including a reactive gas etching, in which a material is etched by being exposed in reactive gas, and a reactive ion etching, in which an etching is carried out with changing gas into ion or radical by plasma.

In cases where a wet etching is adopted, when the reformed layers 11 are removed by the etching, a phenomenon (so called sticking) in which adjacent portions of the substrate 10 may be bonded to each other at the trench portions 41a and the release portion 41b may occur. Thus, in the etching process in FIG. 14C, it is preferable to adopt a dry etching. By adopting the dry etching, the above-described sticking can be restricted. In cases where the portions under the forming-planned regions of the movable electrodes 42, the spindle portions 43, and the spring portions 44 are etched, it is preferable to adopt a dry etching because gas used in the dry etching can permeate the release reformed layers 11d more easily than water solution used in a wet etching.

For example, the dry etching may be carried out on conditions of gas: $XeF_2$, pressure: 1 torr, pulse etching×5 times, and equation: $Si + 2XeF_2 \rightarrow SiF_4 + 2Xe$.

The polycrystallized portions in the substrate 10 made of single crystalline silicon, that is, the reformed layers 11 including the trench reformed layers 11c and the release reformed layers 11d have a higher permeation rate and a higher adsorption rate of the etchant than the portions which are not polycrystallized, that is, single crystalline portions. Thus, when the capacitive acceleration sensor 40 is manufactured with the substrate 10 made of single crystalline silicon, the etching rate can be improved by previously polycrystallizing the substrate 10 made of single crystalline silicon and continuously etching the polycrystallized portion with the etchant.

The manufacturing method described in FIG. 1 to FIG. 6C may also be applied to the manufacture of a transistor or a composite IC including a trench gate in addition to a semiconductor dynamic quantity sensor. Namely, in the reforming process, a forming-planned region of a trench gate in the substrate 10 made single crystalline silicon in polycrystallized or a forming-planned region of an isolation trench of the composite IC is polycrystallized. By this way, a manufacturing cost of the transistor or the composite IC including the trench gate can be reduced.

As described above, the above-described manufacturing method of the semiconductor device includes etching with the laser irradiation. The manufacturing method can be applied to the manufacture of wide range of semiconductor devices that need etching of a complicated-shaped removal region or a deep and large removable region and can achieve a high etching rate.

In the above-described manufacturing method of the semiconductor device, the wavelength of the laser beam may be within a range from 1000 nm to 1100 nm. However, if the average pulse energy of the laser beam is increased, the wavelength of the laser beam may also be more than 1100 nm. When the wavelength of the laser beam is less than 1000 nm, absorption at a surface of a substrate may be dominant and the laser beam has difficulty reaching the inside of the substrate.

In the above-described manufacturing method of the semiconductor device, the average pulse energy of the laser beam may be more than 2.5 µJ and 15 µJ or less. However, the average pulse energy of the laser beam may also be 2.5 µJ or less, for example, if the pulse spot diameter of the laser beam is reduced or the pulse width is increased. The average pulse energy of the laser beam may also be more than 15 µJ, for example, if the pulse spot diameter of the laser beam is increased or the pulse width is reduced.

In the above-described manufacturing method of the semiconductor device, in cases where the moving direction of the focal point of the laser beam is parallel to the substrate plane, the planar pitch of the movement of the focal point may be with a range from 2 µm to 5 µm or less. However, the planar pitch of the movement of the focal point may also be more than 5 µm, for example, if the average pulse energy of the laser beam is increased. The planar pitch of the movement of the focal point may also be less than 2 µm, for example, if the average pulse energy of the laser beam is reduced.

In cases where the moving direction of the focal point of the laser beam is parallel to the substrate plane, the depth pitch of the movement of the focal point may be within a range from 10 µm to 27 µm. However, the depth pitch of the movement of the focal point may also be more than 27 µm, for example, if the average pulse energy of the laser beam is increased. The planar pitch of the movement of the focal point may also be less than 10 µm, for example, if the average pulse energy of the laser beam is reduced.

Second Embodiment

A manufacturing method according to a second embodiment of the present disclosure will be described below. The manufacturing method according to the present embodiment can be applied to a dynamic quantity sensor, such as an acceleration sensor and an angular velocity sensor that includes a movable part. The dynamic quantity sensor can be used, for example, for detecting acceleration or an angular velocity of a vehicle.

Figure 15:
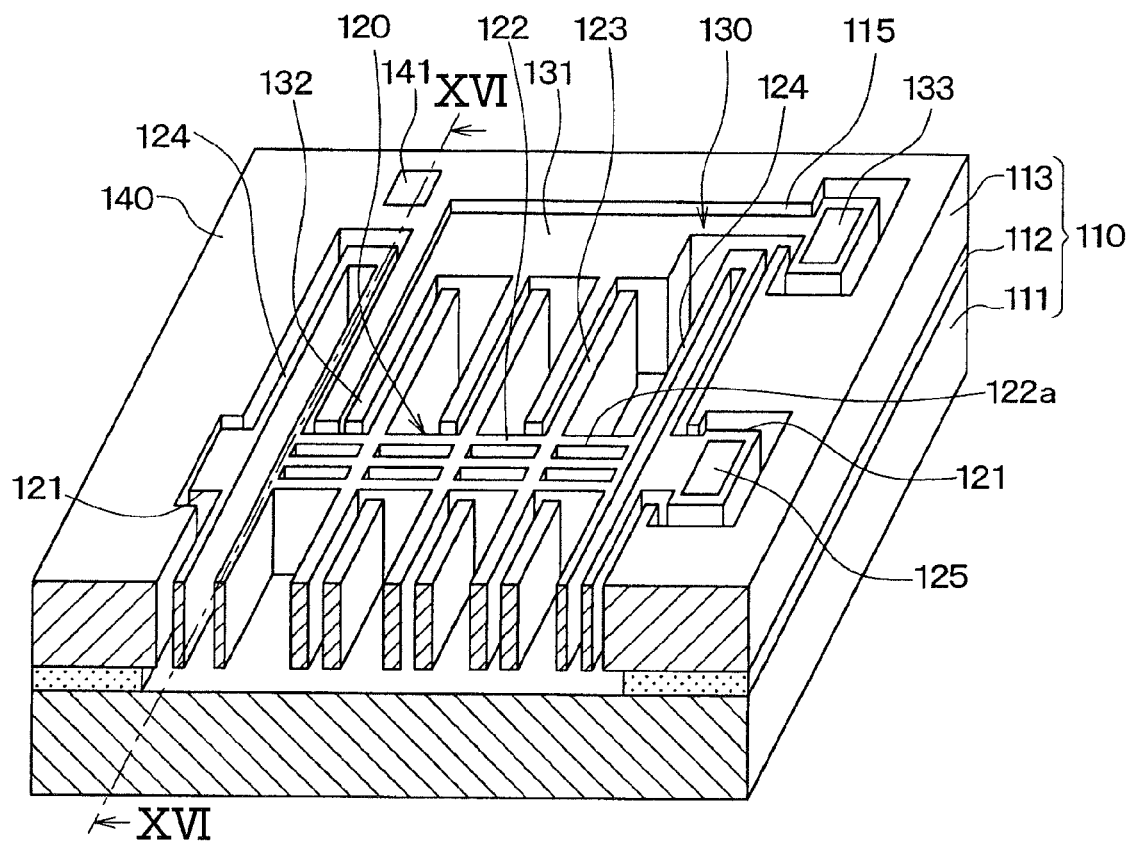
FIG. 15 is a diagram showing a perspective cross-sectional view of a semiconductor device manufacturing by a method according to a second embodiment.
Figure 16:
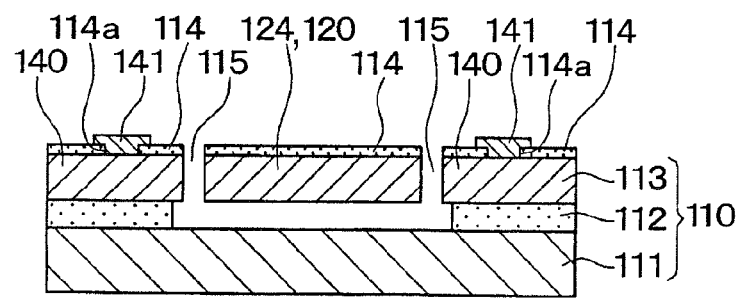
FIG. 16 is a cross-sectional view of the semiconductor device taken along line XVI-XVI in FIG. 15.

An acceleration sensor manufactured by the method according to the present embodiment is shown in FIG. 15 and FIG. 16.

As shown in FIG. 15, the acceleration sensor is formed of a SOI substrate 110. The SOI substrate 110 includes a support substrate 111, a sacrifice layer 112 formed on the support substrate 111, and a semiconductor layer 113 formed on the sacrifice layer 112. For example, the support substrate 111 has a thickness of 500 µm, the sacrifice layer 112 has a thickness of 3 µm, and the semiconductor layer 113 has a thickness of 22 µm.

For example, the support substrate 111 and the semiconductor layer 113 is made of N type single crystalline silicon, and the sacrifice layer 112 is made of $SiO_2$.

As shown in FIG. 16, a thermally-oxidized layer 114 is formed on the semiconductor layer 113. The thermally-oxidized layer 114 is formed by thermally oxidizing a surface of the semiconductor layer 113. For example, the thermally-oxidized layer 114 ix made of $SiO_2$. In FIG. 15, the thermally-oxidized layer 114 is not shown.

The sacrifice layer 112 in the SOI substrate 110 isolates the support substrate 111 and the semiconductor layer 113 and provides a distance between the support substrate 111 and the semiconductor layer 113. The semiconductor layer 113 includes a movable part 120, fixed parts 130, and a peripheral part 140.

The movable part 120, the fixed parts 130, and the peripheral part 140 are defined by opening portions 115 that penetrate the semiconductor layer 113. The movable part 120 and the fixed parts 130 configurate a sensing part for detecting dynamic quantity such as acceleration.

The movable part 120 includes anchor portions 121, a spindle portion 122, movable electrodes 123, and beam portions 124.

The anchor portions 121 hold the spindle portion 122 in such a manner that the spindle portion 122 floats from the support substrate 111. The anchor portions 121 have block shapes and are disposed at two portions on the sacrifice layer 112.

The spindle portion 122 operates as a spindle that transfers the movable electrodes 123 with respect to each of the anchor portions 121 when the semiconductor device is applied with acceleration. The spindle portion 122 includes a plurality of etching holes 122a. The etching holes 122a are used as introducing holes of etchant when the sacrifice layer 112 between the spindle portion 122 and the support substrate 111 is removed.

The movable electrodes 123 protrude from a longitudinal side of the spindle portion 122 in a direction perpendicular to the longitudinal side and are arranged in a comb shape. The movable electrodes 123 are arranged at the regular intervals and the movable electrodes 123 have the same width and the same length.

The beam portions 124 connect the anchor portions 121 and the spindle portion 122. Each of the beam portions 124 have a rectangular frame shape in which two parallel beams are connected at both ends and has a spring function that displaces in a direction perpendicular to a longitudinal direction of the two beams. By the beam portions 124, the spindle portion 122 is integrally connected with the anchor portions 121. As shown in FIG. 15, the two beam portions 124 connect the respective anchor portions 121 and the spindle portion 122.

The sacrifice layer 112 under the beam portions 124, the spindle portion 122 and the movable electrodes 123 is partially removed, and the beam portions 124, the spindle portion 122, and the movable electrodes 123 float from the support substrate 111 at a predetermined distance. The predetermined distance is a distance between the semiconductor layer 113, which forms the beam portions 124, the spindle portions 122, and the movable electrodes 123, and the support substrate 111 and corresponds to a thickness of the sacrifice layer 112.

Thus, as shown in FIG. 16, the sacrifice layer 112 under the beam portions 124 is removed and the beam portions 124 float from the support substrate 111 at the predetermined distance. Although only the beam portions 124 in the movable part 120 is shown in FIG. 16, the spindle portion 122 and the movable electrode 123 also float from the support substrate 111 at the predetermined distance.

The fixed part 130 is disposed opposite to the longitudinal side of the spindle portion 122. Thus, two fixed parts 130 are disposed on opposite sides of the spindle portion 122. In FIG. 15, the whole part of one of the two fixed electrodes 130 and a part of the other are shown. Each of the fixed parts 130 includes a wiring portion 131 and fixed electrodes 132.

The wiring portion 131 operates as wiring for electrically coupling the fixed electrodes 132 with an external part.

The fixed electrodes 132 protrudes from a side of the wiring portion 131 opposite to the spindle portion 122 in a direction perpendicular to the side and are arranged in a comb shape. The fixed electrodes 132 are arranged at regular intervals and the fixed electrodes 132 have the same width and the same length.

The fixed electrodes 132 are arranged opposite to the movable electrodes 123, respectively, and capacitors are formed between the fixed electrodes 132 and the corresponding movable electrodes 123. In other words, the movable part 120 and the fixed parts 130 are configured to detect dynamic quantity based on capacitance formed between the movable electrodes 123 and the fixed electrodes 132. Thus, when the acceleration sensor is applied with acceleration in the planar direction of the support substrate 111 and the longitudinal direction of the spindle portion 122, the acceleration sensor can detect the acceleration based on change in capacitance of the capacitors.

The wiring portion 131 is formed on the sacrifice layer 112 and is fixed to the support substrate 111 through the sacrifice layer 112. The sacrifice layer 112 between the fixed electrodes 132 and the support substrate 111 is removed, and the fixed electrodes 132 float from the support substrate 111.

The peripheral part 140 is disposed to surround the movable part 120 and the fixed parts 130. In the example shown in FIG. 15, the peripheral part 140 makes a circuit around the movable part 120 and the fixed parts 130.

On one of the two anchor portions 121, a movable part pad 125 is disposed. On the wiring portion 131 of the fixed part 130, a fixed part pad 133 is disposed. On the peripheral part 140, a peripheral part pad 141 is disposed.

Each of the pads 125, 133, 141 is electrically coupled with the semiconductor layer 113, which forms the anchor portion 121, the wiring portion 131, and the peripheral part 140, through contact holes 114a provided in the thermally-oxidized layer 114.

Each of the pads 125, 133, 141 is bonded with bonding wires (not shown) so that each part is electrically coupled with external parts. For example, the anchor portion 121 and the wiring part 131 are applied with a predetermined potential and the peripheral part 140 is coupled with the ground. For example, the pads 125, 133, 141 is made of aluminum.

When the semiconductor device is applied with acceleration from outside, the beam portions 124 of the movable part 120 bends, and the spindle portion 122 moves in the longitudinal direction with respect to the fixed electrodes 132, which are fixed. Accordingly, the distances between the movable electrodes 123 and the fixed electrodes 132 change, and the capacitances of the capacitors formed by the movable electrodes 123 and the fixed electrodes 132 change. By detecting the change in the capacitances, the acceleration applied to the semiconductor device can be detected.

Next, the manufacturing method of the semiconductor device according to the present embodiment will be described with reference to FIG. 17 to FIG. 20. First, a laser irradiation equipment 150 used for removing a part of the semiconductor layer 113 and a part of the sacrifice layer 112 will be described with reference to FIG. 17.

Figure 17:
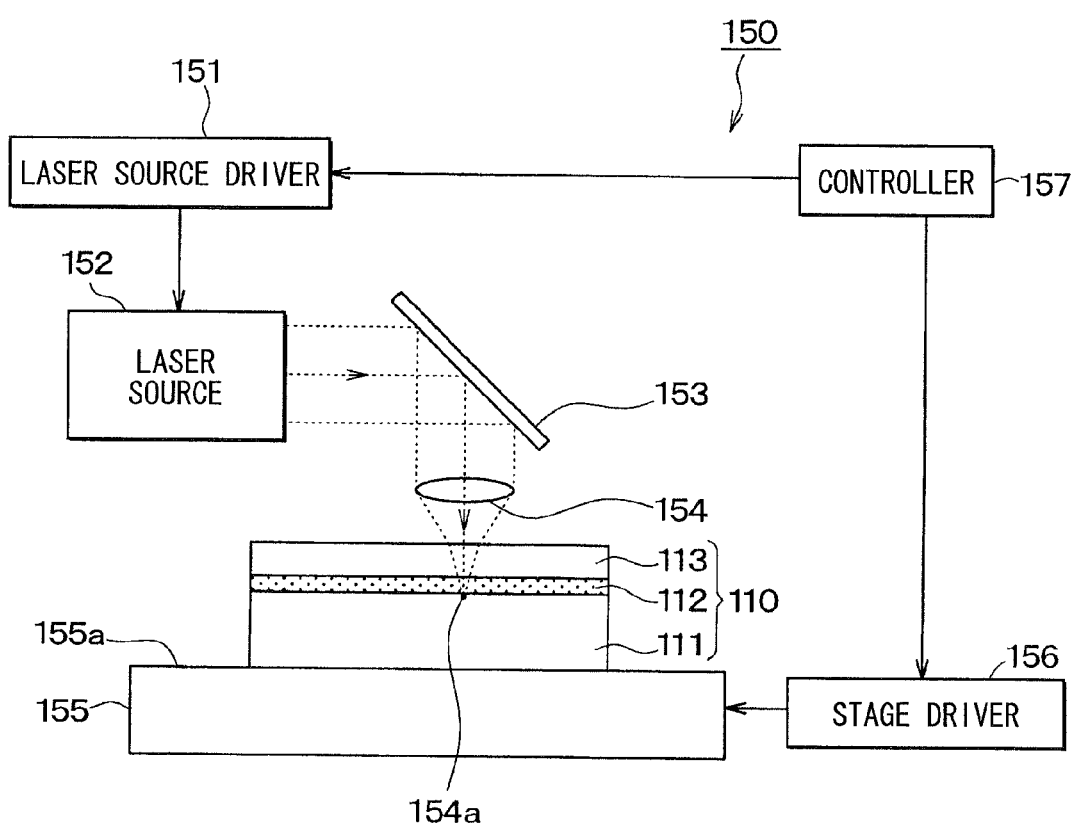
FIG. 17 is a diagram showing a laser irradiation equipment used in the manufacturing method according to the second embodiment.

As shown in FIG. 17, the laser irradiation equipment 150 includes a laser source driver 151, a laser source 152, a mirror 153, a condensing lens 154, a stage 155, a stage driver 156, and a controller 157.

The laser source driver 151 is a driver that controls the laser source 152 to generate a laser beam on instructions of the controller 157.

The laser source 152 generates the laser beam. For example, the laser source 152 is a nanosecond laser having an oscillation wavelength of 1043 nm, an oscillation frequency of 80 kHz, a pulse width of 1 ns, and a maximum output power of 4 W. The laser beam is selected from laser beams that permeate the support substrate 111, the sacrifice layer 112, and the semiconductor layer 113 without being absorbed by the support substrate 111 and the semiconductor layer 113. The above-described specifications of the laser source 152 are examples, and the laser source 152 may have different specifications.

The mirror 153 is a reflecting plate that introduces the laser beam output from the laser source 152 toward the stage 155.

The condensing lens 154 condenses the laser beam that is output from the laser source 152 and is reflected by the mirror 153. The condensing lens 154 has a focal point 154a that is positioned in the support substrate 111 in the SOI substrate 110. In other words, the laser beam permeates the semiconductor layer 113 and the sacrifice layer 112 and reaches the support substrate 111. The laser beam condensed by the condensing lens 154 has a spot diameter of, for example, 5 μm.

The stage 155 has a setting surface 155a. A height of the condensing lens 154 from the setting surface 155a can be changed. In other words, the condensing lens 154 is movable in a direction perpendicular the setting surface 155a of the stage 155, that is, in a Z-direction. Accordingly, the position of the focal point 154a of the laser beam is movable in the Z-direction. The position of the condensing lens 154 is changed by the laser source driver 151 that receives instructions from the controller 157.

The stage 155 is a base that is movable in an X-Y direction parallel to the setting surface 155a of the stage 155. On the setting surface 155a of the stage 155, the SOI substrate 110 having a wafer shape is disposed.

The stage driver 156 moves the stage 155 in the X-Y direction based on instructions from the controller 157.

The controller 157 is a central controller and instructs the laser source driver 151 and the stage driver 156 so that the laser source 152 outputs the pulsed laser beam and the stage 155 is moved. The controller 157 executes the instructions according to a program previously prepared.

The controller 157 instructs the laser source driver 151 so that the focal point 154a of the laser beam is positioned in the support substrate 111. Then, the controller 157 instructs the laser source driver 151 and the stage driver 156 to move the stage 155 in a planar direction of the support substrate 111 in the SOI substrate 110 so that the focal point 154a of the laser beam is positioned at a desired position and to irradiate the SOI substrate 110 with the laser beam at the desired position. When a region in a predetermined range is irradiated with the pulsed laser beam, the controller 157 instructs the laser source driver 151 and the stage driver 156 in such a manner that the stage 155 is moved in time with irradiation with the pulsed laser beam.

Figure 18:
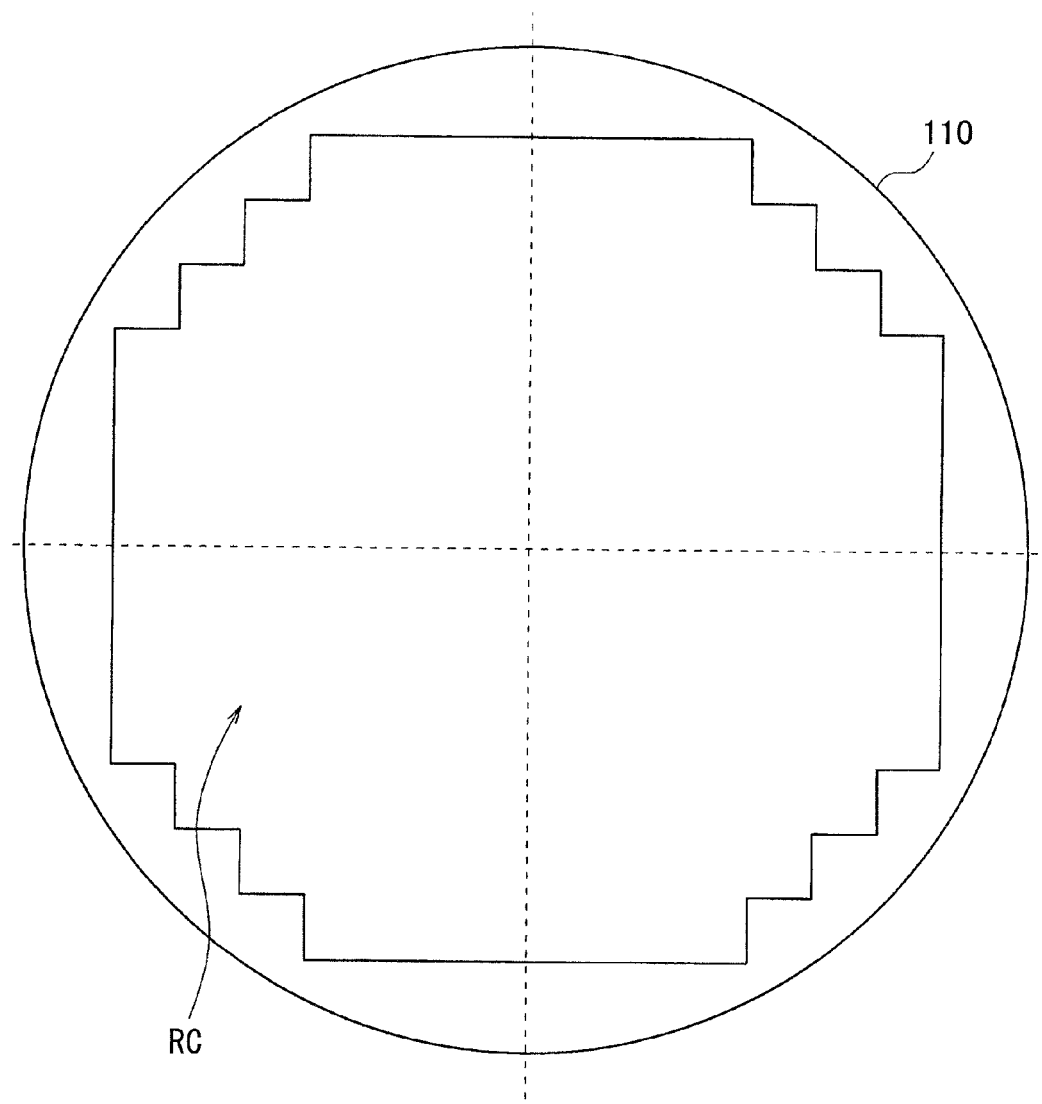
FIG. 18 is a plan view showing a SOI substrate.

As shown in FIG. 18, the SOI substrate 110 includes a chip forming region. The chip forming region includes a plurality of chip sections 116. For example, each of the chip sections 116 is a 2-mm square and this size corresponds to a size of the semiconductor device. By carrying out the processes shown in FIG. 19A to FIG. 19D, a plurality of semiconductor devices is formed in the SOI substrate 110.

Firstly, the SOI substrate 110 in which the sacrifice layer 112 is disposed between the support substrate 111 and the semiconductor layer 113 is prepared. The SOI substrate 110 is a 6-inch wafer.

Figure 19A:
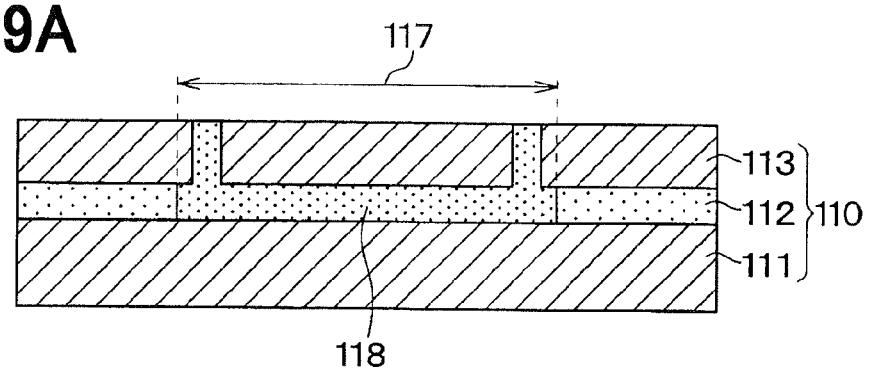
FIG. 19A to FIG. 19D are cross-sectional views showing manufacturing processes of the semiconductor device shown in FIG. 15.

At a process shown in FIG. 19A, the SOI substrate 110 is disposed on the setting surface 155a of the stage 155 in the laser irradiation equipment 150 shown in FIG. 17. Then, the SOI substrate 110 is irradiated with the laser beam in a state where the focal point 154a of the laser beam is positioned in a portion of the support substrate 111 located in a sacrifice section 117.

Figure 20:
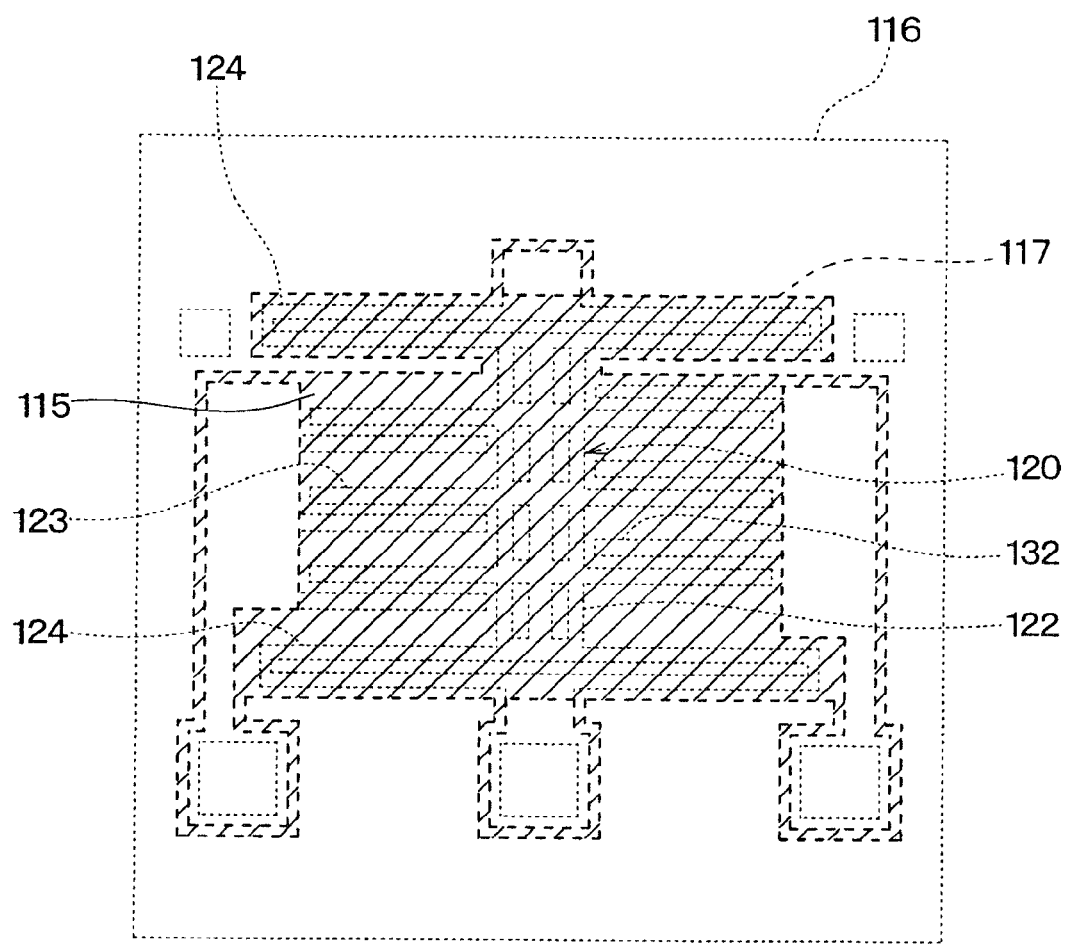
FIG. 20 is a plan view showing a sacrifice section in a chip region.

As shown in FIG. 20, the chip section 116 includes the sacrifice section 117 which is illustrated with hatching surrounded by a dashed line. In the semiconductor layer 113, the sacrifice section 117 includes a portion where the opening portion 115 is formed, portions where the beam portions 124, the spindle portion 122, and the movable electrodes 123 are formed, and portions where the fixed electrodes 132 are formed.

Thus, the laser beam equipment 150 sets the focal point 154a of the laser beam in the portion of the support substrate 111 that is adjacent to the sacrifice layer 112 and is located in sacrifice section 117, and the support substrate 111 is irradiated with the laser beam from a side of the semiconductor layer 113 through the sacrifice layer 112. Accordingly, a thermal stress is transferred from the focal point 154a of the laser beam toward an incident side of the laser beam, and micro cracks are generated in a portion of the sacrifice layer 112 located in the sacrifice section 117. A generation mechanism of the micro cracks will be described later.

In addition, by moving the focal point 154a of the laser beam in the thickness direction of the semiconductor layer 113 (the Z-direction), micro cracks are generated in a forming-planned region of the opening portion 115 in the semiconductor layer 113. An order of forming the micro cracks in the semiconductor layer 113 and the sacrifice layer 112 may be inverted.

A focal position of the focal point 154a of the condensing lens 154, that is, a position of the focal point 154a of the laser beam with respect to the support substrate 111 may be set as follows. Firstly, the SOI substrate 110 is disposed on the setting surface 155a of the stage 155. Then, the stage 155 is moved so that an outer peripheral portion of the SOI substrate 110 surrounding the chip sections 116 is irradiated with the laser beam. After that, the SOI substrate 110 is irradiated with the laser beam and the focal position of the condensing lens 154 in the support substrate 111 is set by adjusting the position of the condensing lens 154 with the laser source driver 151.

When the region of the support substrate 111 corresponding to the sacrifice section 117 is irradiated with the laser beam, the thermal stress is transferred from the focal point 154a of the laser beam toward the incident side of the laser beam. Thus, micro cracks are generated in the sacrifice layer 112 above the support substrate 111. The micro cracks are cracks generated in the sacrifice layer 112 and mean a state where the sacrifice layer 112 is damaged by the thermal stress. In other words, a part of the semiconductor layer 113 and a part of the sacrifice layer 112 in which the micro cracks are generated configurate a reformed layer 118 including a lot of cracks.

In the portion of the support substrate 111 located in the sacrifice section 117, the surface of the support substrate 111 being in contact with the sacrifice layer 112 is scanned with the laser beam at predetermined intervals in one direction. Accordingly, a plurality of lines of micro cracks is formed in the portion of the sacrifice layer 112 located in the sacrifice section 117. The predetermined intervals are intervals between one scan line of the laser beam and an adjacent scan line of the laser beam.

Since FIG. 19A shows a cross-sectional view of a portion of the SOI substrate 110 where the micro cracks are generated, the forming-planned region of the opening portion 115 in the semiconductor layer 113 and the sacrifice layer 112 in the sacrifice section 117 are illustrated as the reformed layer 118. However, because the laser beam is scanned at the predetermined intervals, in other cross-section, there is a portion where the reformed layer 118 is not formed in the sacrifice layer 112 in the sacrifice section 117.

A corner portion of the sacrifice section 117 may be irradiated with the laser beam because the reformed layer 118 is etched from the corner portion. In the sacrifice section 117, a narrow portion between the peripheral part 140 and the fixed parts 130 and a narrow portion between the peripheral part 140 and the movable part 120 may also be irradiated with the laser beam so that the sacrifice layer 112 between the peripheral part 140 and the fixed parts 130 and the sacrifice layer 112 between the peripheral part 140 and the movable part 120 can be removed with certainty.

The controller 157 instructs the stage driver 156 to move the stage 155 so that the portion of the support substrate 111 located in the sacrifice section 117 in each of the chip sections 116 in the chip forming region shown in FIG. 18 is irradiated with the laser beam.

After the reformed layer 118 is formed in the sacrifice layer 112 in the sacrifice section 117 and the forming-planned region of the opening portion 115 in the semiconductor layer 113, the SOI substrate 110 is carried to a clean room. The following processes are carried out in the clean room.

Figure 19B:
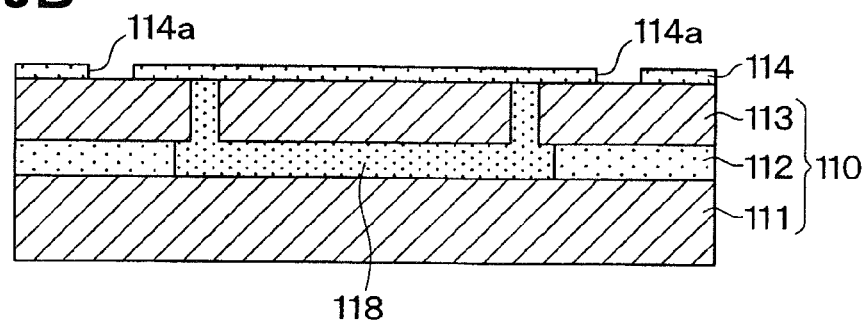

In the process shown in FIG. 19B, the SOI substrate 110 is thermally oxidized in oxygen atmosphere so that the thermally-oxidized layer 114 having a thickness of a few μm is formed on the semiconductor layer 113 that is made of single crystalline silicon. The thermally-oxidized layer 114 is made of $SiO_2$.

Then, a resist layer (not shown) is formed on the thermally-oxidized layer 114. The resist layer is treated with patterning by photolithography so that portions of the resist layer corresponding to the contact holes 114a of the movable part pad 125, the fixed part pad 133, and the peripheral part pad 141 are open.

The thermally-oxidized layer 114 is treated with wet etching using the resist layer as a mask. Accordingly, the contact holes 114a are formed in the thermally-oxidized layer 114 and the semiconductor layer 113 is exposed through the contact holes 114a. After that, the resist layer is removed.

Figure 19C:
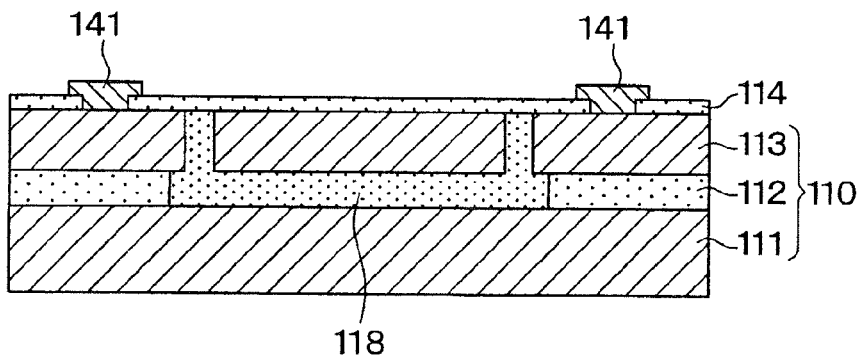

In the process shown in FIG. 19C, on the semiconductor layer 113 exposed through the contact holes 114a and the thermally-oxidized layer 114, a metal layer (not shown) made of aluminum is formed, for example, by a PVD method. In addition, a photo mask is formed on the metal layer, and the metal layer is treated with wet etching using the photo mask so that the metal layer is pattern-formed. The movable part pad 125, the fixed part pad 133 and the peripheral part pad 141 are formed of the metal layer. Then, the photo mask is removed.

Figure 19D:
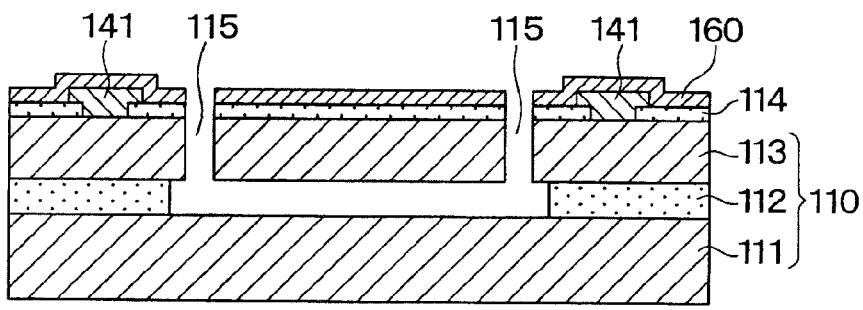

In the process shown in FIG. 19D, the opening portion 115 is provided in the semiconductor layer 113, and the beam portions 124, the spindle portion 122, the movable electrodes 123, and the fixed electrodes 132 are released from the support substrate 111. Thus, firstly, a resist layer 160 is formed on the thermally-oxidized layer 114 and each pads 125, 133, 141, and the resist layer 160 is treated with patterning so that a portion of the resist layer 160 corresponding to the opening portion 115 is open. Accordingly, the thermally-oxidized layer 114 is exposed from the resist layer 160 at the portion corresponding to the opening portion 115. The thermally-oxidized layer 114 exposed from the resist layer 160 is removed by dry etching, and the reformed layer 118 is exposed from the thermally-oxidized layer 114 with changing etching gas.

After that, an etching process for removing the reformed layer 118, in which the micro cracks are formed, is carried out. An etchant is introduced from the opening portions of the resist layer 160 and the thermally-oxidized layer 114, and the forming-planned region of the opening portion 115 in the semiconductor layer 113 is removed by dry etching. Accordingly, the opening portion 115 is formed in the semiconductor layer 113.

Then, an etchant is introduced into the SOI substrate 110 through the opening portion 115 formed in the semiconductor layer 113, and the sacrifice layer 112 in the sacrifice section 117, in which the micro cracks are formed, is removed by etching. Accordingly, the beam portions 124, the spindle portion 122, the movable electrodes 123, and the fixed electrodes 132 float from the support substrate 111. After that, the resist layer 160 is removed.

When the etching process is carried out as described above, in the reformed layer 118, the micro cracks are formed and the part of the semiconductor layer 113 and the part of the sacrifice layer 112 are fractured. Thus, the incubation time to start etching of the reformed layer 118 is short, and the etching starts immediately after introducing the etchant to the reformed layer 118 is started. This is because the etchant easily permeates into the reformed layer 118, a surface area inside the reformed layer 118 subjected to the etchant increases, and the amount of the etchant coming into contact with the reformed layer 118 increases. Thus, the reformed layer 118 is selectively etched with respect to the portions of the semiconductor layer 113 and the sacrifice layer 112 without micro cracks.

Because the portion of the support substrate 111 located in the sacrifice section 117 is irradiated with the laser beam at the predetermined intervals in one direction, a plurality of lines of micro cracks is formed in one direction along the planar direction of the sacrifice layer 112. Thus, in the portion of the sacrifice layer 112 located in the sacrifice section 117, there are portions without micro cracks. However, because the reformed layer 118 is etched quickly, the etchant is quickly supplied to a portion of the sacrifice layer 112 at the most distance from the opening portion 115 and without micro cracks. In the present case, in the sacrifice layer 112, the etching proceeds from the lines of micro cracks in a direction perpendicular to an extending direction of the lines. Thus, the etching uniformly proceeds in the whole area of the sacrifice section 117. Thus, an area effect of the etching due to the micro cracks is improved. In other words, the number of scanning the laser beam can be reduced, and the productivity of the semiconductor device is improved.

A time required for removing the sacrifice layer 112 in the sacrifice section 117 can be reduced compared with a case where the reformed layer 118 is not formed in the sacrifice layer 112. In other words, a time for which the semiconductor layer 113, the thermally-oxidized layer 114, and the pads 125, 133, 141 are exposed to the etchant can be reduced compared with the case where the reformed layer 118 is not formed in the sacrifice layer 112. Therefore, surface roughness of the pads 125, 133, 141 can be restricted, and a fine structure body such as the beam portions 124 does not deform. In addition, the time required for removing the sacrifice layer 112 in the sacrifice section 117 in each of the chip sections 116 is uniform among the all chip sections 116, and an over etched amount is restricted.

A plurality of semiconductor devices can be formed in the SOI substrate 110 as described above. After that, the SOI substrate 110 is cut into each chip section 116, and thereby the semiconductor device shown in FIG. 15 is completed.

Next, a mechanism of forming the micro cracks in the sacrifice layer 112 by setting the focal point 154a of the laser beam to the portion of the support substrate 111 located in the sacrifice section 117 and irradiating the support substrate 111 with the laser beam from the side of the semiconductor layer 113 through the sacrifice layer 112 will be described with reference to FIG. 21A to FIG. 21J.

It is known that absorptivity of a light of 1064 nm wavelength with respect to silicon increases with temperature. When silicon is irradiated with the laser beam, evaporation of silicon due to generation of heat at the focal point 154a of the laser beam causes stress (impulse wave), and the heat is transferred. Then, the absorptivity of the laser beam in silicon above the focal point 154a (that is, on the laser beam incident side) increases due to the heat, and the maximum temperature position moves toward the laser beam incident side. Next, because of a thermal distortion due to a temperature distribution and the stress that generates first, cracks grow from the focal point 154a toward the laser beam incident side. The growth of the cracks stop when the stress is reduced due to a fracture stress, and a high-density dislocation region is formed. The high-density dislocation region is a region where the micro cracks are formed.

By applying the above-described mechanism to the present embodiment, it can be considered that the micro cracks are formed through processes shown in FIG. 21A to FIG. 21J.

First, as shown in FIG. 21A, the SOI substrate 110 includes the support substrate 111, the sacrifice layer 112, and the semiconductor layer 113 is prepared. Then, as shown in FIG. 21B, the SOI substrate 110 is irradiated with the laser beam L from the side of the semiconductor layer 113 in a state where the focal point 154a of the laser beam L is positioned in the support substrate 111. After a femtosecond from the irradiation, as shown in FIG. 21C, the energy of the laser beam L is absorbed by the support substrate 111 at the focal point 154a of the laser beam.

After sub-picoseconds from the irradiation, as shown in FIG. 21D, a temperature of the support substrate 111 increases and the support substrate 111 expands at the focal point 154a of the laser beam L. After picoseconds from the irradiation, as shown in FIG. 21E, a thermal distortion impulse wave is transferred from the focal point 154a.

After nano seconds from the irradiation, as shown in FIG. 21F, a position of a temperature absorption point rises toward the laser beam incident side. At this time, a void 111a is formed in the support substrate 111. Then, the thermal distortion impulse wave arrives at the sacrifice layer 112 made of $SiO_2$ as shown in FIG. 21G, and the temperature absorption point arrives at the sacrifice layer 112. At this time, 10 nano second has elapsed from the irradiation with the laser beam L.

After 100 nano seconds from the irradiation, as shown in FIG. 21I, the rise of the temperature absorption point stops, and distortion due to thermal stress enlarges. When the irradiation with the laser beam L stops, as shown in FIG. 21J, micro cracks 112a are formed in the sacrifice layer 112 due to a thermal stress. Thus, a region of the sacrifice layer 112 in which the micro cracks 112a are formed configurates the reformed layer 118.

The micro cracks 112a may be formed in the sacrifice section 117 as described above. Also when the micro cracks 112a is formed in the semiconductor layer 113, a thermal stress transferred from the focal point 154a of the laser beam toward the laser beam incident side can be used.

In order to verify the above-described mechanism of forming the micro cracks 112a, observation of a specimen can be performed as was demonstrated by the inventors. The specimen is a SOI substrate 110 including a support substrate 111, a sacrifice layer 112 disposed on the support substrate 111, and a semiconductor layer 113 disposed on the sacrifice layer 112. The observation can be performed with a scanning electron microscope (SEM).

Figure 22A:
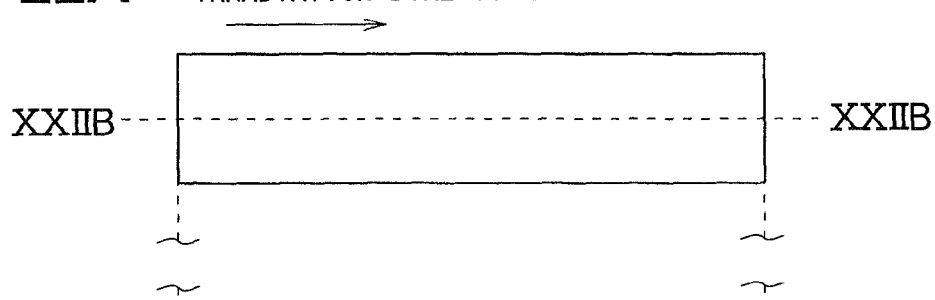
FIG. 22A is a top view of a specimen and FIG. 22B is a cross-sectional view of the specimen taken along line XXIIB-XXIIB in FIG. 22A.
Figure 22B:
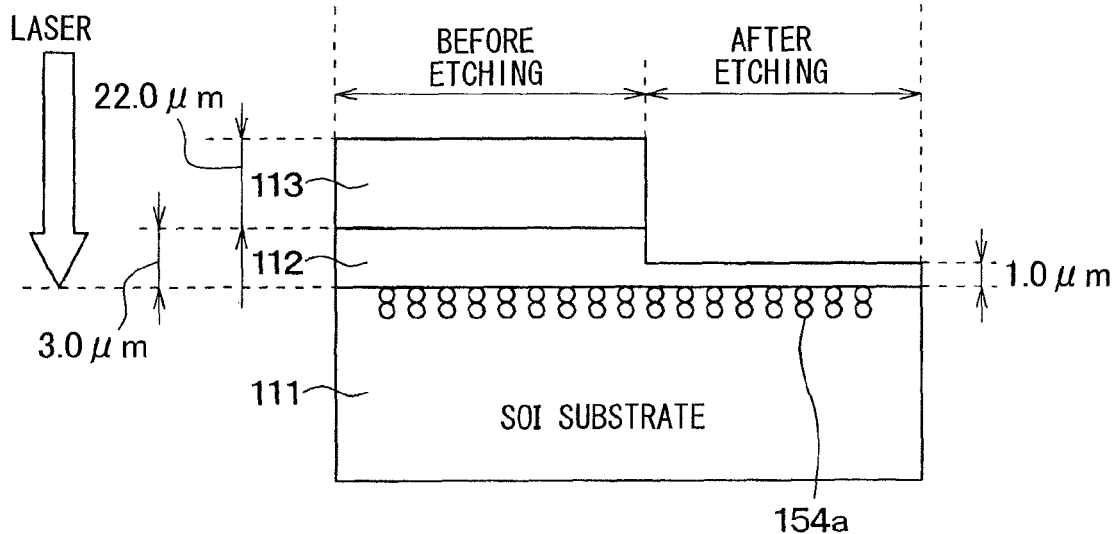

As shown in FIG. 22B, the semiconductor layer 113 has a thickness of 22.0 μm and the sacrifice layer 112 has a thickness of 3.0 μm. In FIG. 22B, a left part is a cross section before etching, and a right part is a cross section after etching.

The SOI substrate 110 is irradiated with the laser beam under conditions that a scan speed is 300 mm/sec, and a setting depth of the focal point 154a of the laser beam from a surface of the semiconductor layer 113 is 28 μm. The SOI substrate 110 is irradiated with the laser beam along line XXIIB-XXIIB in FIG. 22A.

The semiconductor layer 113 is etched with an ICP etching equipment under conditions that a power is 600 W, gas is $SF_6/C_4F_8/120/130$ ml/min, a time is 5/7 sec, a pressure is 2 Pa, a rate is 2 μm/min×11 min, and an etching depth is 22 μm. The sacrifice layer 112 is etched under conditions that $HF/NH_4F=1/6(RT)\times15$ min and an etching depth from a surface of the sacrifice layer (a contact surface with the semiconductor layer 113) is 2.0 μm.

Firstly, the micro cracks 112a formed in the sacrifice layer 112 is observed. The specimen is irradiated with the laser beam, and the semiconductor layer 113 as an active layer is etched with the ICP etching equipment. In the present stage, only the semiconductor layer 113 is etched and the sacrifice layer 112 is not etched.

Figure 23A:
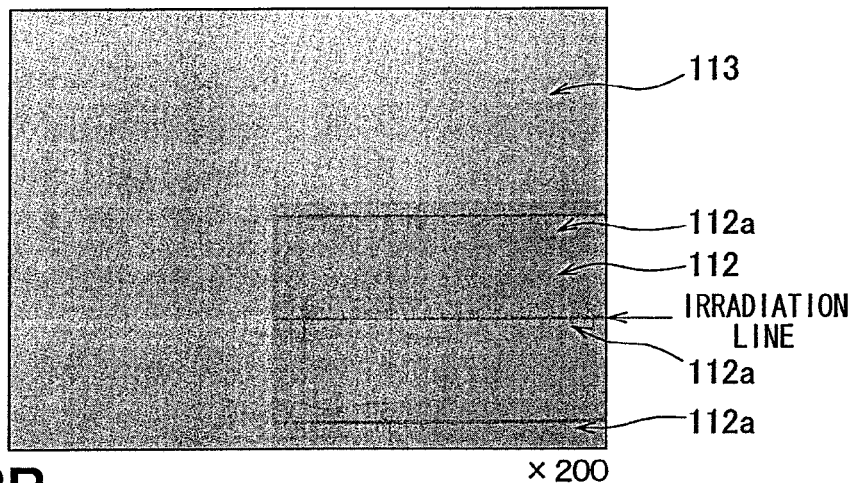
FIG. 23A is a diagram showing a SEM photograph of a specimen before etching observed at magnification of 200 times.
Figure 23B:
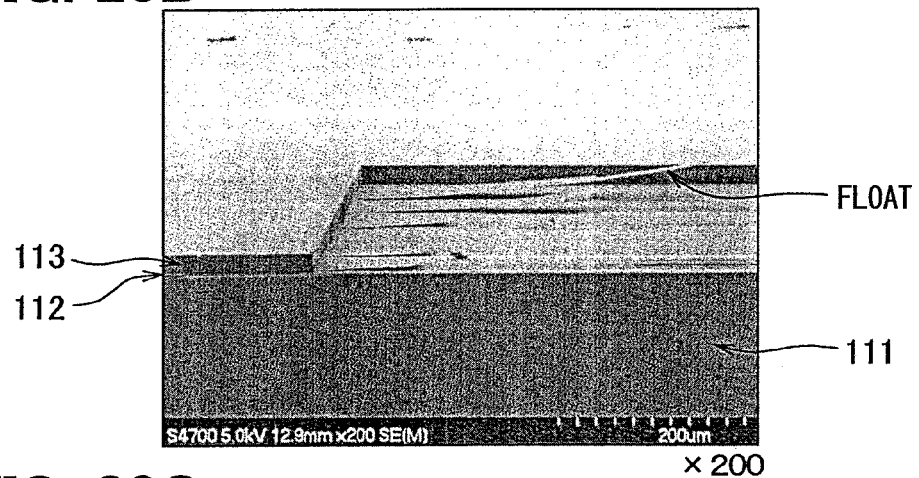
FIG. 23B is a diagram showing a SEM photograph of a cross section of the specimen observed at magnification of 200 times.
Figure 23C:
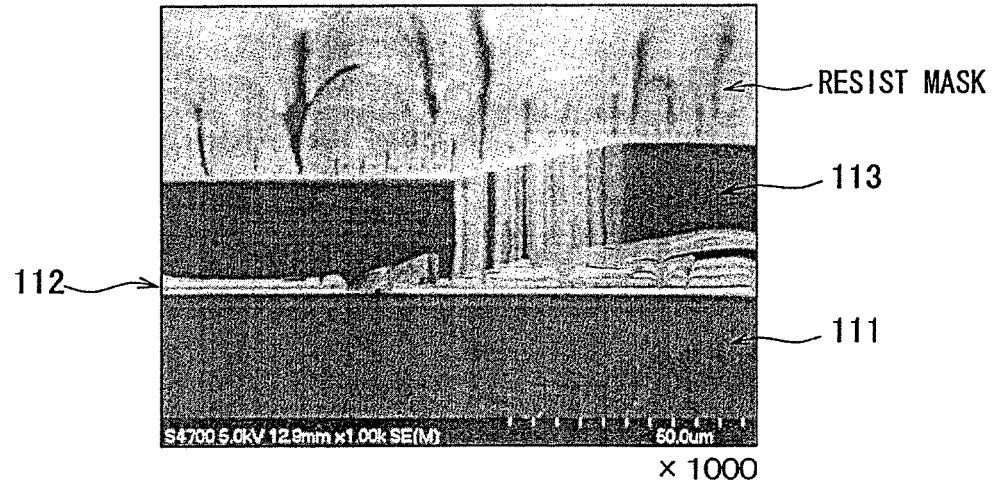
FIG. 23C is a diagram showing a SEM photograph of a cross section of the specimen observed at magnification of 1000 times.
Figure 23D:
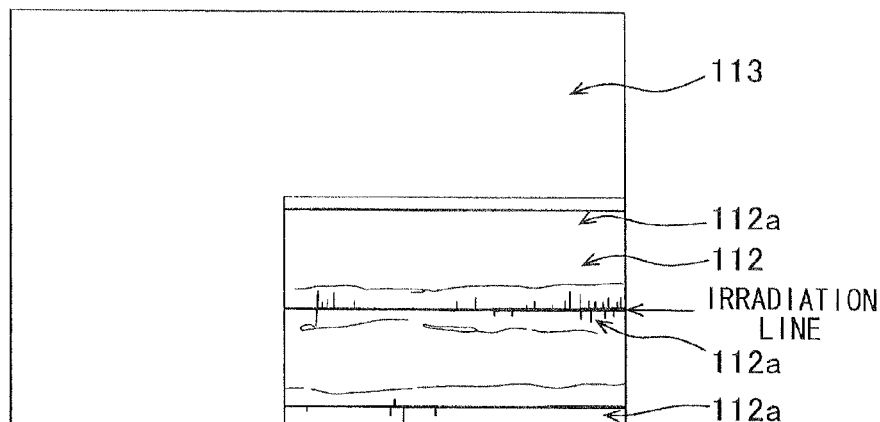
FIG. 23D is a diagram showing an illustrative view of the SEM photograph in FIG. 23A.

In the specimen shown in FIG. 23A and FIG. 23D, a part of the semiconductor layer 113 is etched so that a part of the sacrifice layer 112 is exposed from the semiconductor layer 113, and the exposed surface of the sacrifice layer 112 is observed from above the semiconductor layer 113. In FIG. 23A and FIG. 23D, the specimen is observed at magnification of 200 times. As shown in FIG. 23A and FIG. 23D, linear traces of irradiation lines of the laser beam exist, and micro cracks 112a are formed in a direction perpendicular to an extending direction of the irradiation lines.

Figure 23E:
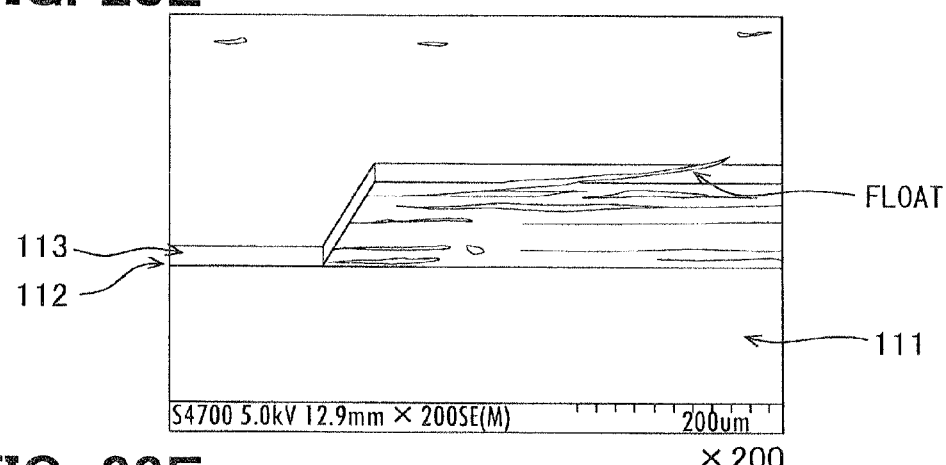
FIG. 23E is a diagram showing an illustrative view of the SEM photograph in FIG. 23B.
Figure 23F:
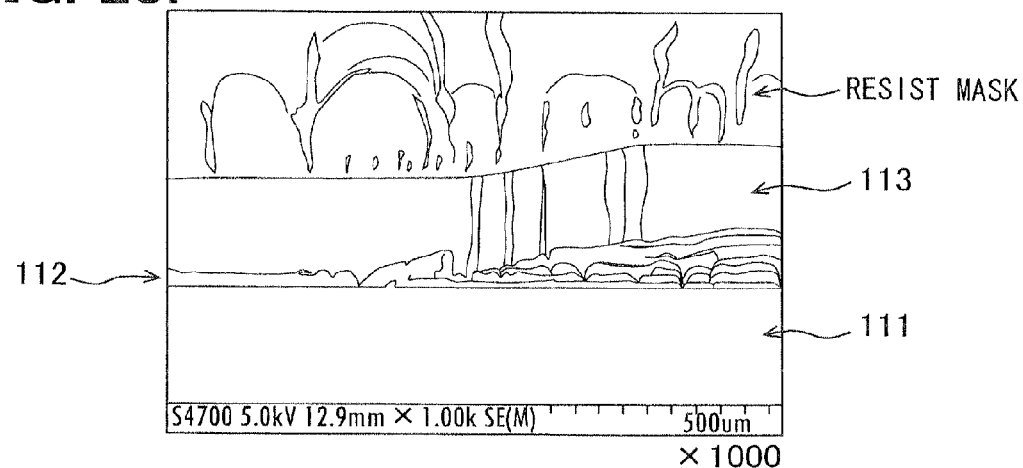
FIG. 23F is a diagram showing an illustrative view of the SEM photograph in FIG. 23C.

In FIG. 23B, FIG. 23C, FIG. 23E, and FIG. 23F, the exposed surface of the sacrifice layer 112 is observed from a side of the specimen. In FIG. 23B and FIG. 23E, the specimen is observed at magnification of 200 times, and it is confirmed that a part of the sacrifice layer 112 exposed from the semiconductor layer 113 floats. In addition, in FIG. 23C and FIG. 23F, the specimen is observed at magnification of 1000 times, and it is clearly confirmed that a part of the sacrifice layer 112 floats.

In FIG. 24A and FIG. 24B, the specimen is observed with 30 degrees field of view at a portion where the sacrifice layer 112 is exposed from the semiconductor layer 113, and the specimen is observed at magnification of 3000 times. As shown in FIG. 24A and FIG. 23B, a plurality of circular dislocation defects arranged in a vertical direction is formed by one pulsed laser beam. The dislocation defect has a dimension of about 5 μm.

Figure 25A:
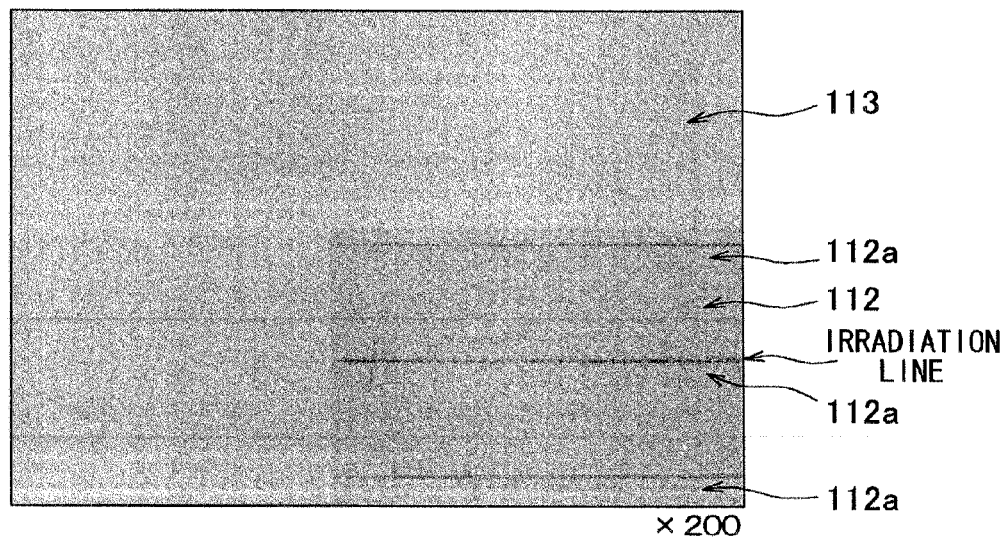
FIG. 25A is a diagram showing a SEM photograph of a specimen before etching.
Figure 25B:
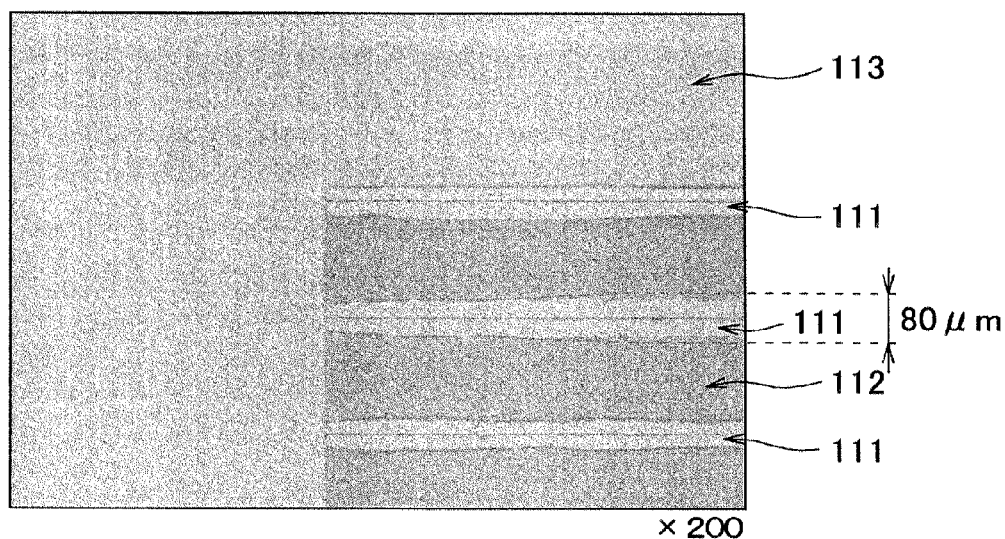
FIG. 25B is a diagram showing a SEM photograph of the specimen after etching.
Figure 25C:
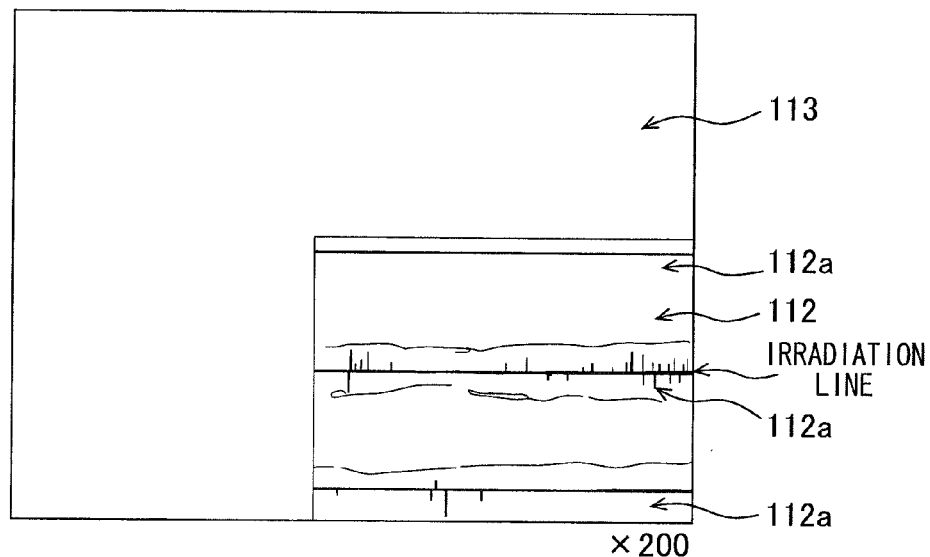
FIG. 25C is a diagram showing an illustrative view of the SEM photograph in FIG. 25A.
Figure 25D:
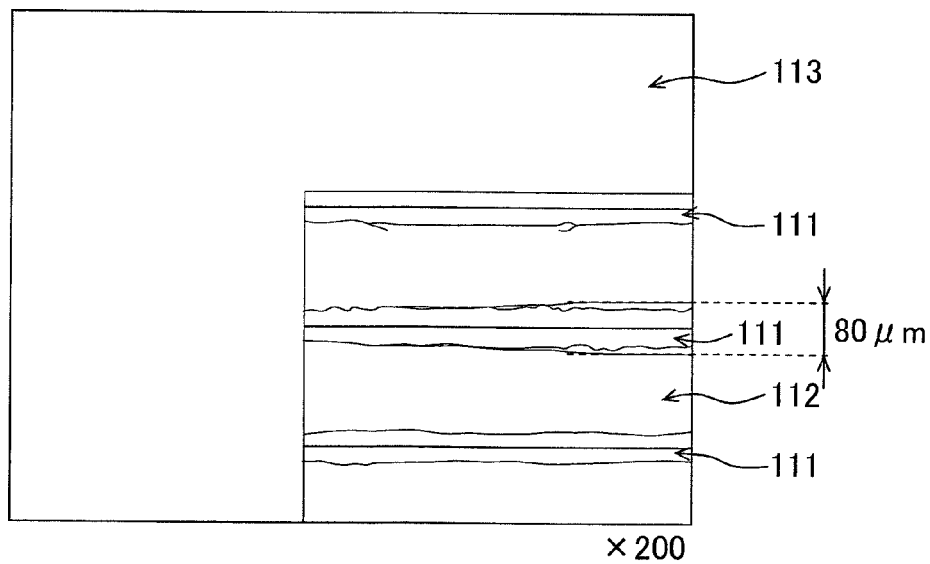
FIG. 25D is a diagram showing an illustrative view of the SEM photograph in FIG. 25B.

Next, the sacrifice layer 112 is etched with HF-base to a depth of 2 μm from the surface of the sacrifice layer 112, and the surface of the sacrifice layer 112 is observed. FIG. 25A and FIG. 25C are diagrams showing the surface of the sacrifice layer 112 before etching, and FIG. 25B and FIG. 25D are diagrams showing the surface of the sacrifice layer 112 after etching. In FIG. 25A to FIG. 25D, the specimen is observed at magnification of 200 times.

As shown in FIG. 25B and FIG. 25D, after etching the sacrifice layer 112, etching proceeds from traces of irradiation lines of the laser beam in the direction perpendicular to the extending direction of the irradiation lines. The proceeding amount of etching is about 40 μm on one side in the perpendicular direction. In other words, the etching proceeds 80 μm centering on the traces of the irradiation lines of the laser beam. At etched regions in FIG. 25B and FIG. 25D, the sacrifice layer 112 is removed, and the surface of the support substrate 111 is exposed from the sacrifice layer 112.

Another specimen is irradiated with the laser beam under conditions that the laser power is 0.3 W and the focal point 154a of the laser beam is set to a depth of 28 μm. In this case, traces of irradiation lines of the laser beam are not observed clearly. In addition, when the sacrifice layer 112 in the specimen is etched, proceeding of etching centering on the traces of the irradiation lines of the laser beam is not observed. Thus, when the laser power is low, the micro cracks 112a are less likely to be formed in the sacrifice layer 112, and proceeding of etching centering on the irradiation lines of the laser beam cannot be expected. Thus, it is necessary to select the laser power that can form the micro cracks 112a in the sacrifice layer 112.

In an example shown in FIG. 26A to FIG. 26D, a specimen is irradiated with the laser beam in a state where the focal point 154a of the laser beam is set to the semiconductor layer 113 not only to the support substrate 111. The specimen is observed at magnification of 200 times in FIG. 26A and FIG. 26C, and the specimen is observed at magnification of 1000 times in FIG. 26B and FIG. 26D.

The specimen is irradiated with the laser beam from above the semiconductor layer 113 along an X-direction in a state where the focal point 154a of the laser beam is set to a portion of the semiconductor layer 113 adjacent to the sacrifice layer 112. In addition, the specimen is irradiated with the laser beam from above the semiconductor layer 113 along a Y-direction in a state where the focal point 154a of the laser beam is set to a portion of the support substrate 111 adjacent to the sacrifice layer 112. The X-direction and the Y-direction are directions parallel to a surface of the support substrate 111 being in contact with the sacrifice layer 112 and are perpendicular to each other.

Figure 26A:
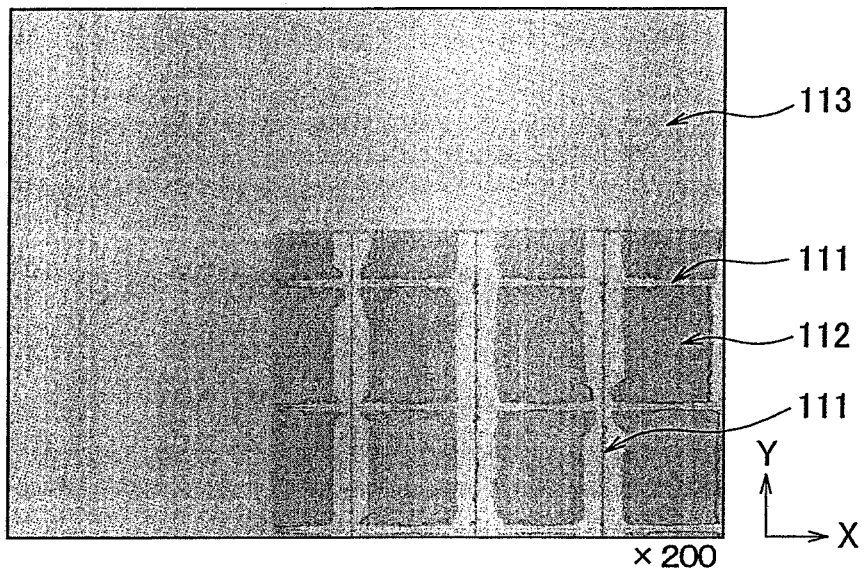
FIG. 26A is a diagram showing a SEM photograph of a specimen observed at magnification of 200 times.
Figure 26B:
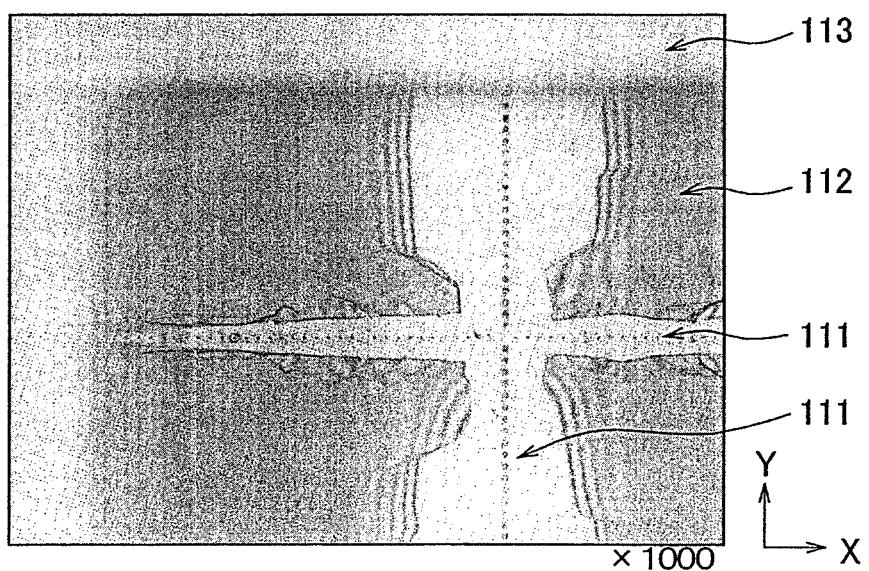
FIG. 26B is a diagram showing a SEM photograph of the specimen observed at magnification of 1000 times.
Figure 26C:
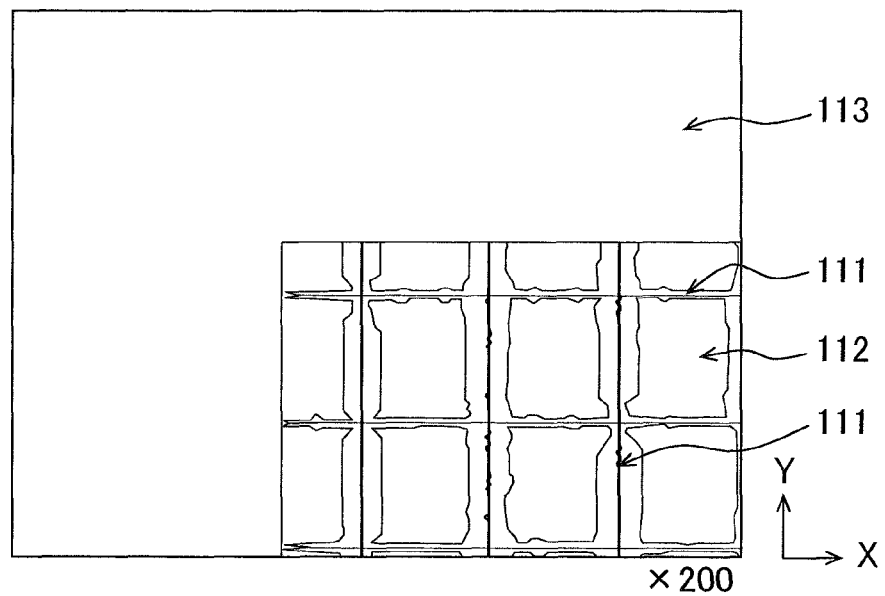
FIG. 26C is a diagram showing an illustrative view of the SEM photograph in FIG. 26A.
Figure 26D:
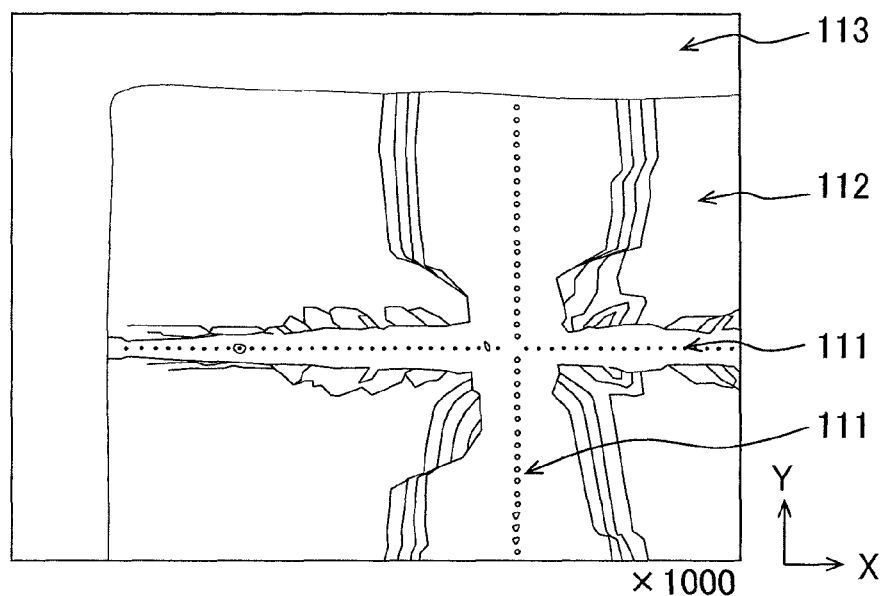
FIG. 26D is a diagram showing an illustrative view of the SEM photograph in FIG. 26B.

After irradiating the specimen with the laser beam while setting focal point 154a of the laser beam to the semiconductor layer 113 and the support substrate 111, the sacrifice layer 112 is etched. As shown in FIG. 26A and FIG. 26C, there is a difference between proceeding of etching in the X-direction and proceeding of etching in the Y-direction. Specifically, as shown in FIG. 26B and FIG. 26D, due to a difference in the depth of the focal point 154a of the laser beam, the proceeding of etching in the X-direction is about 5 times greater than the proceeding of etching is the Y-direction. In FIG. 26B and FIG. 26D, dotted voids formed in the support substrate 111 are shown.

As described in the mechanism of forming the micro cracks 112a, when the focal point 154a of the laser beam is set to the support substrate 111, a thermal stress is transferred from the focal point 154a toward the sacrifice layer 112. On the other hand, when the focal point 154a of the laser beam is set to the semiconductor layer 113 and the SOI substrate 110 is irradiated from above the semiconductor layer 113, a damage of the semiconductor layer 113, which is located on the incident side, by thermal stress is large, and a damage of the sacrifice layer 112 by the thermal stress is small.

After etching the sacrifice layer 112 of the specimen, a cross section of the specimen shown in FIG. 27A is observed with a SEM. In the cross section observation, a portion of the semiconductor layer 113 and a portion of the sacrifice layer 112 located at a left part of the specimen are etched.

The support substrate 111, the sacrifice layer 112, and the semiconductor layer 113 of the specimen used in the cross section observation have thicknesses same as thicknesses of the specimen shown in FIG. 22A and FIG. 22B. The specimen is scanned with the laser beam under conditions that a laser power is 0.4 W, the focal point 154a of the laser beam is set to a depth of the 28 μm from the surface of the semiconductor layer 113 and a scanning speed is 300 mm/sec.

FIG. 27B shows a cross-sectional view of a SEM photograph of a boundary portion between the etched portion and the non-etched portion of the specimen and is observed at magnification of 1000 times. FIG. 27C shows an illustrative view of the SEM photograph shown in FIG. 27B. As shown in FIG. 27B and FIG. 27C, in the support substrate 111, a reformed layer having a thickness of 9 μm is formed from the focal point 154a of the laser beam to the contact surface with the sacrifice layer 112. In addition, it can be confirmed that etching progresses 36 μm due to micro cracks 112a formed with the laser beam.

Figure 28A:
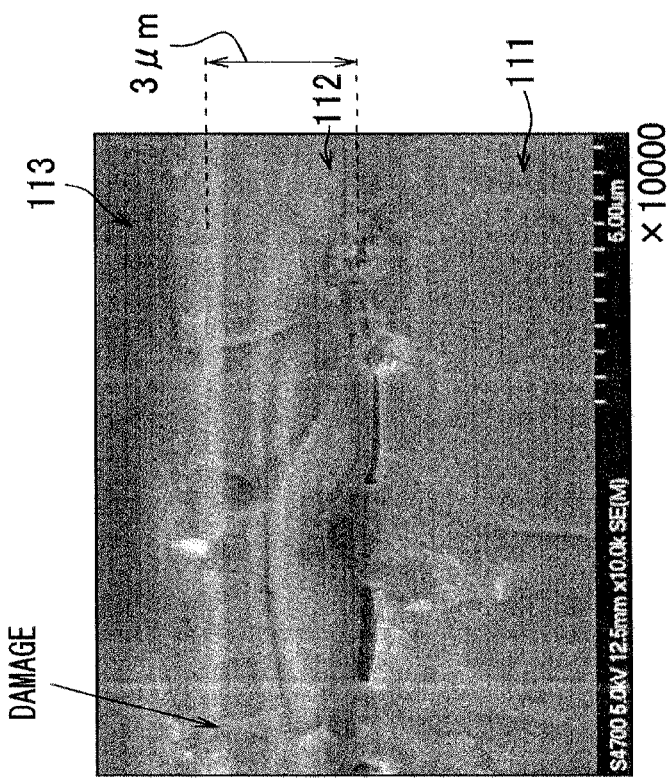
FIG. 28A is a diagram showing a SEM photograph of the specimen in FIG. 27A observed at magnification of 4000 times.
Figure 28B:
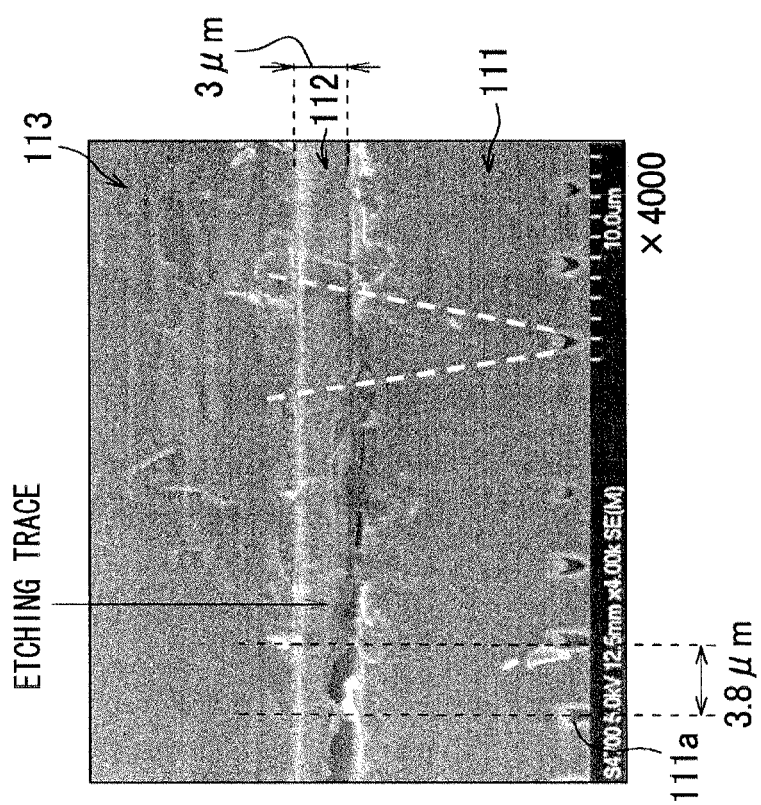
FIG. 28B is a diagram showing a SEM photograph of the specimen observed at magnification of 10000 times.
Figure 28C:
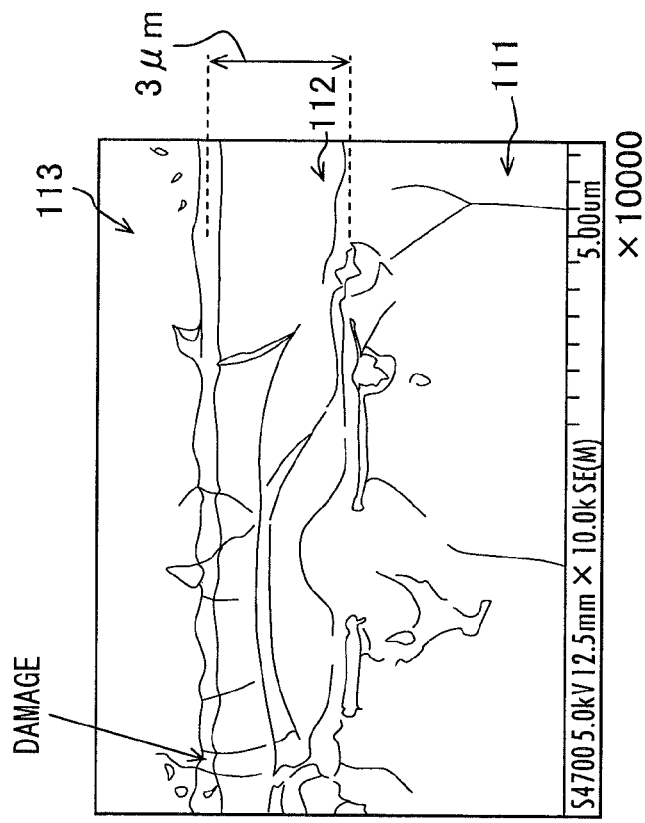
FIG. 28C is a diagram showing an illustrative view of the SEM photograph in FIG. 27A.

In FIG. 28A and FIG. 28C, the specimen is observed at magnification of 4000 times. As shown in FIG. 28A and FIG. 28C, a distance between voids 111a, that is, an irradiation interval of the laser beam is 3.8 μm. Between the support substrate 111 and the sacrifice layer 112, an etching trace of the sacrifice layer 112 is clearly seen.

In addition, as shown by dashed lines in FIG. 28A and FIG. 28C, damage of the support substrate 111 and the sacrifice layer 112 proceeds from the voids 111a. As shown in FIG. 24A and FIG. 24B, the damage has circular shapes when seen from above. In other words, the damage due to the thermal stress of the laser beam proceeds into funnel shapes from the voids 111a.

Figure 28D:
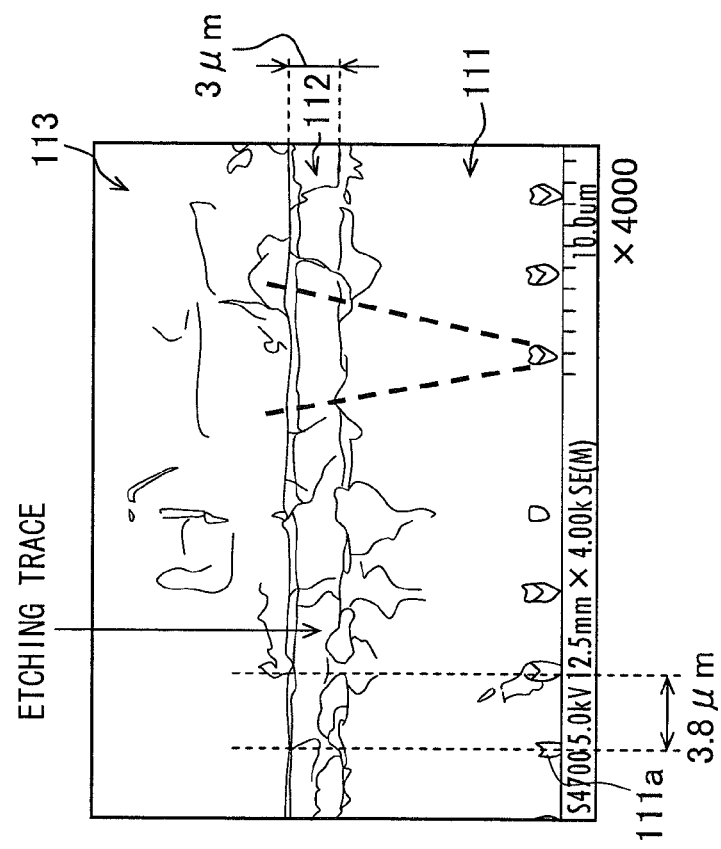
FIG. 28D is a diagram showing an illustrative view of the SEM photograph in FIG. 28B.

In FIG. 28B and FIG. 28D, the specimen is observed at magnification of 10000 times. A plurality of lines is seen in the sacrifice layer 112. The lines are the micro cracks 112a at which the sacrifice layer 112 fractures.

Figure 29A:
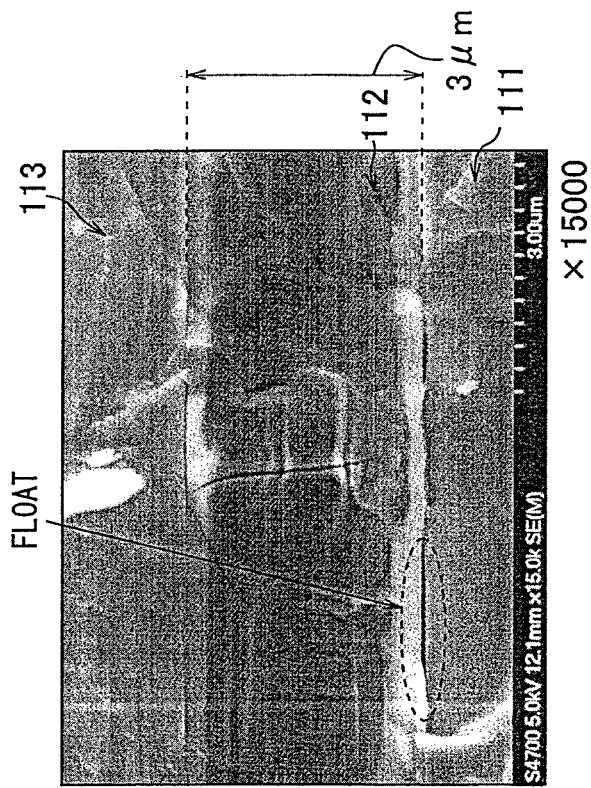
FIG. 29A is a diagram showing a SEM photograph of the specimen in FIG. 27A observed at magnification of 5000 times.
Figure 29B:
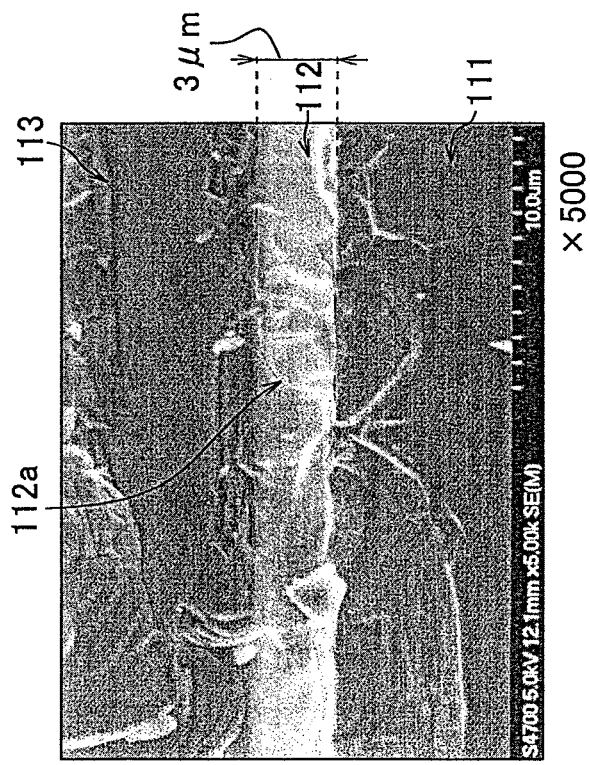
FIG. 29B is a diagram showing a SEM photograph of the specimen observed at magnification of 15000 times.
Figure 29C:
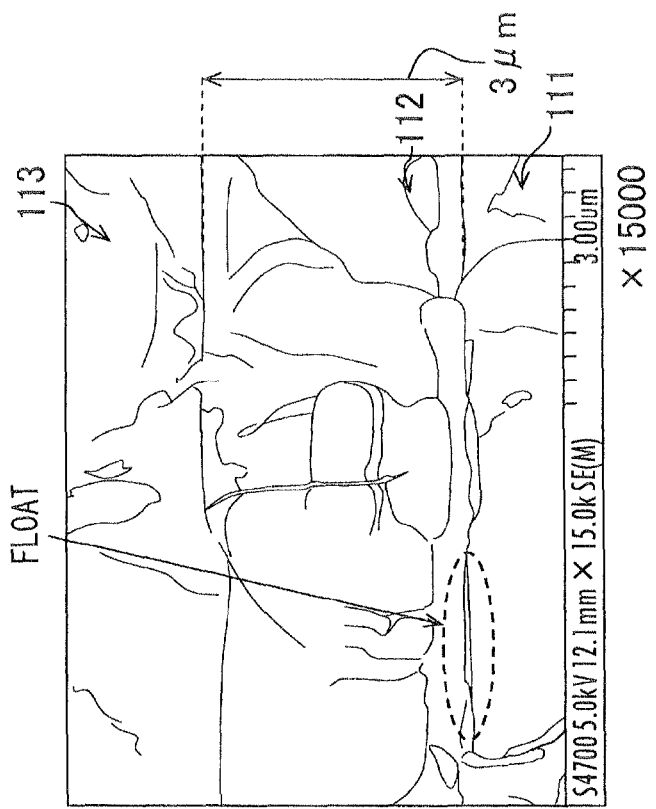
FIG. 29C is a diagram showing an illustrative view of the SEM photograph in FIG. 29A.
Figure 29D:
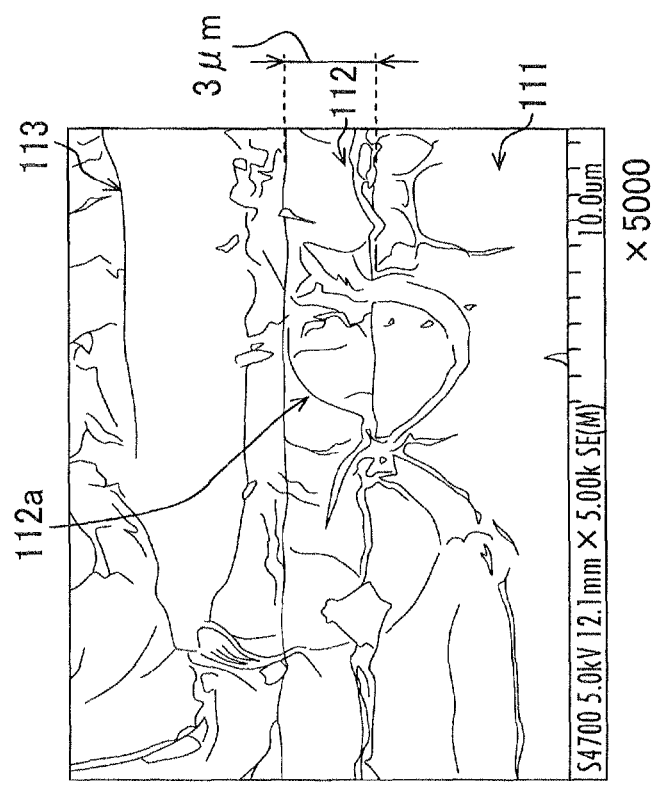
FIG. 29D is a diagram showing an illustrative view of the SEM photograph in FIG. 29B.

In FIG. 29A and FIG. 29C, the specimen is observed at magnification of 5000 times. Black thin lines in the sacrifice layer 112 between the support substrate 111 and the semiconductor layer 113 are the micro cracks 112a. In FIG. 29B and FIG. 29D, the specimen is observed at magnification of 15000 times, and it can be confirmed that an interface between the support substrate 111 and the sacrifice layer 112 floats. The float of the interface may be caused because the interface is damaged when the thermal stress from the focal point 154a of the laser beam is transferred to the sacrifice layer 112.

As described above, when the SOI substrate 110 is irradiated with the laser beam in the state where the focal point 154a of the laser beam is set to one of the semiconductor layer 113 and the support substrate 111 and then the sacrifice layer 112 is etched, it is found that the damage of the sacrifice layer 112 is large when the focal point 154a of the laser beam is set to the support substrate 111. In addition, the difference in the depth of the focal point 154a of the laser beam clearly emerges as 5 times difference in the proceeding of etching. Thus, by scanning the SOI substrate 110 with the laser beam in a lattice manner as shown in FIG. 30A and FIG. 30B, the sacrifice layer 112 can be etched using the proceeding of etching centering on the irradiation lines of the laser beam.

Figure 30A:
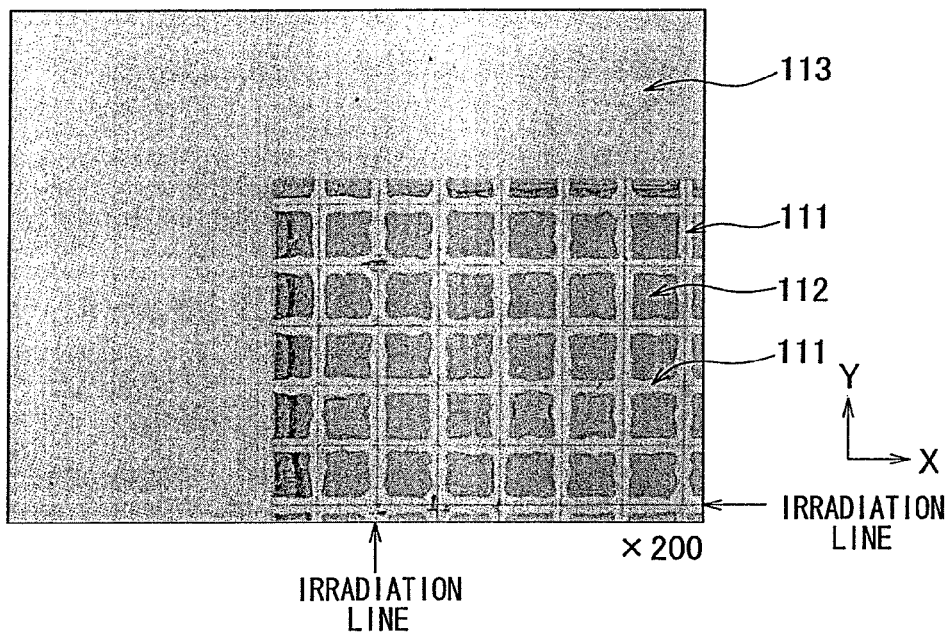
FIG. 30A is a diagram showing a SEM photograph of a specimen scanned with a laser beam in an X-direction and a Y-direction.
Figure 30B:
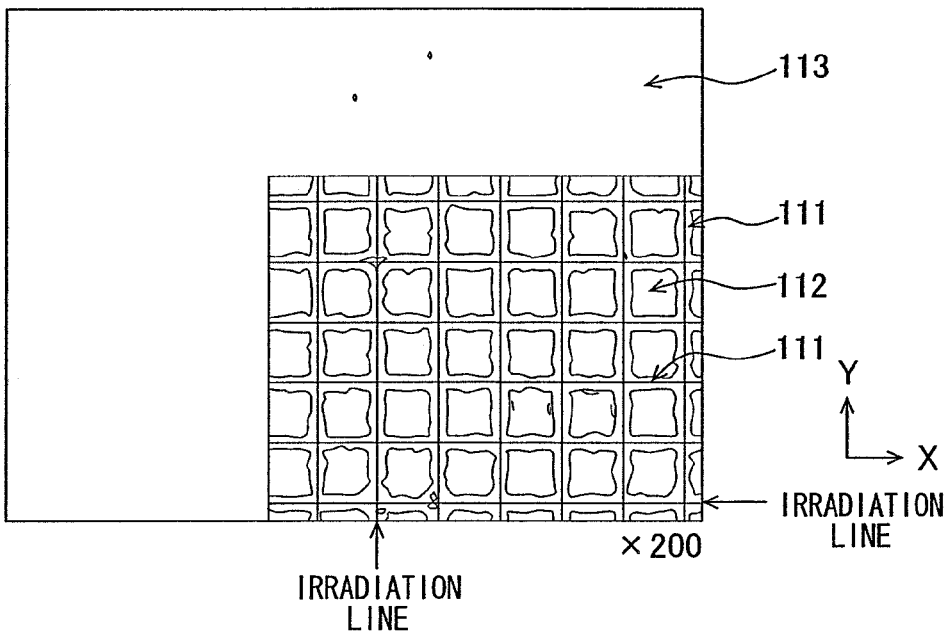
FIG. 30B is a diagram showing an illustrative view of the SEM photograph in FIG. 30A.

In FIG. 30A and FIG. 30B, the surface of the sacrifice layer 112 is observed from above the semiconductor layer 113 at magnification of 200 times. The etching of the sacrifice layer 112 proceeds in the Y-direction when the SOI substrate 110 is scanned with the laser beam in the X-direction, and the etching of the sacrifice layer 112 proceeds in the X-direction. In other words, a portion of the sacrifice layer 112 surrounded by the irradiation lines of the laser beam, that is, the lines of the micro cracks 112a can be etched from surrounding. Thus, a size of a square island of the sacrifice layer 112 shown in FIG. 30A and FIG. 30B decreases.

Because the area effect of etching can be improved by scanning the SOI substrate with the laser beam in two directions, that is, the X-direction and the Y-direction, the sacrifice layer 112 can be efficiently etched and the etching time can be reduced. Thus, in cases where the SOI substrate 110 is irradiated with the laser beam in the state where the focal point 154a of the laser beam is set to the support substrate 111 in the laser beam irradiation process shown in FIG. 19A, the SOI substrate 110 may be irradiated with the laser beam at regular intervals along two directions parallel to the surface of the support substrate 111 being in contact with the sacrifice layer 112.

Even in cases where the SOI substrate 110 is scanned with the laser beam in one direction at regular intervals, proceeding of etching can be expected. However, in this case, the etched region proceeds only in a direction perpendicular to the one direction. Thus, it is preferable that the SOI substrate 110 is scanned with the laser beam in two directions at regular intervals. The scanning direction is not limited to two directions perpendicular to each other and may be any two different directions along the plane of the support substrate 111. In cases where the irradiation of the laser beam is carried out in two different directions, the etching proceeds in directions perpendicular to the two directions, and the area effect of etching can be improved.

In order to evaluate a cross-sectional stress due to the thermal stress applied to the support substrate 111 and the sacrifice layer 112, a Raman spectroscopic analysis of a specimen including the support substrate 111, the sacrifice layer 112, and the semiconductor layer 113 is carried out. The result of the Raman spectroscopic analysis is shown in FIG. 31A to FIG. 31F.

Figure 31A:
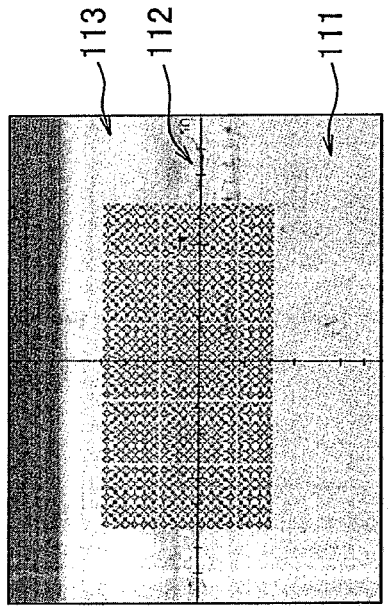
FIG. 31A is a diagram showing a cross-sectional image of a specimen.
Figure 31B:
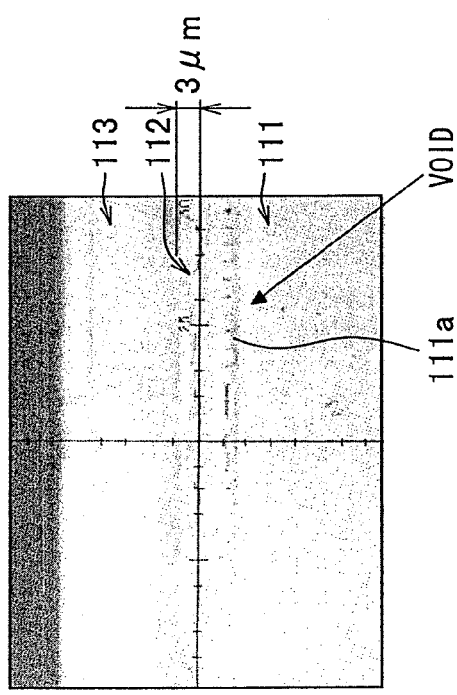
FIG. 31B is a diagram showing a mapping to the image in FIG. 31A.
Figure 31C:
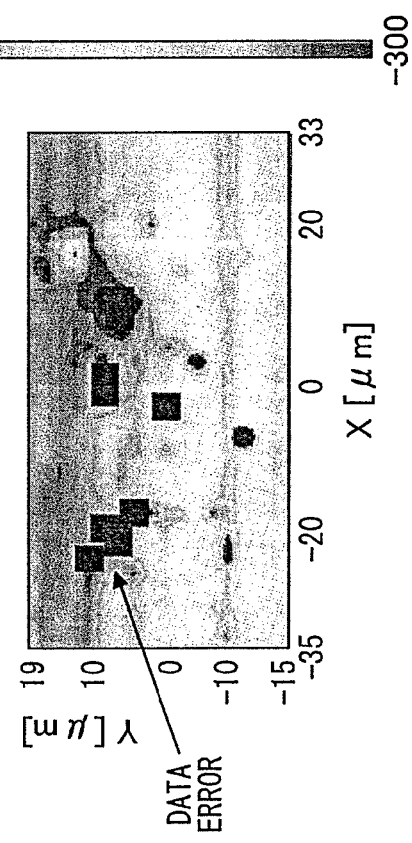
FIG. 31C is a diagram showing a distribution of a cross-sectional stress based on the mapping.
Figure 31D:
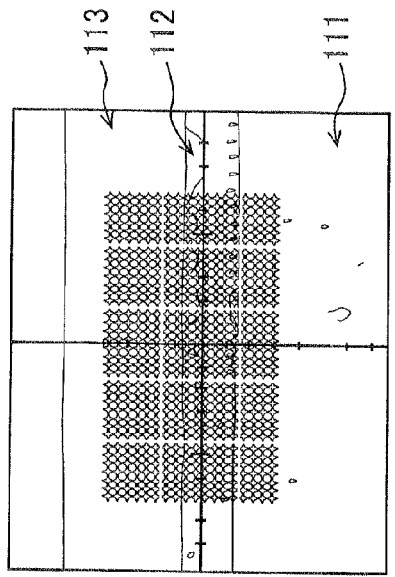
FIG. 31D is a diagram showing an illustrative view of the cross-sectional image in FIG. 31A.
Figure 31E:
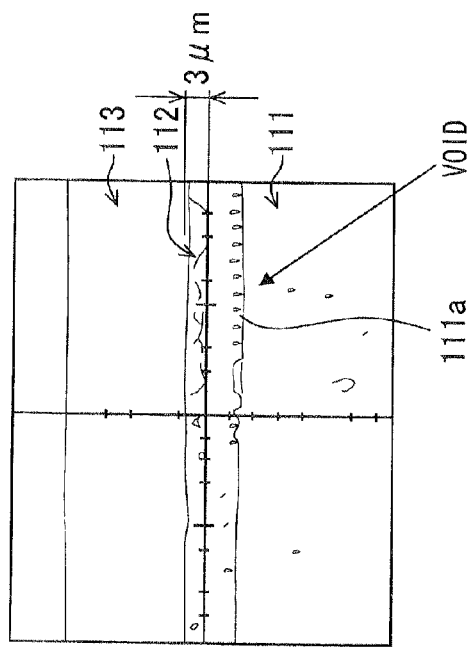
FIG. 31E is a diagram showing an illustrative view of the mapping.
Figure 31F:
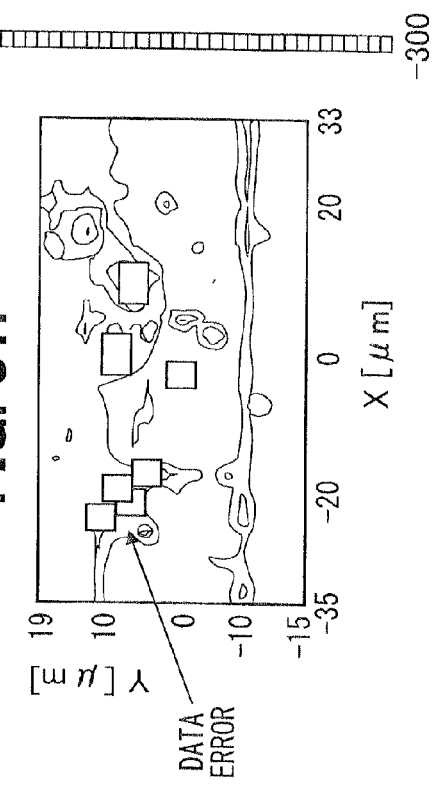
FIG. 31F is a diagram showing an illustrative view of the distribution of the cross-sectional stress in FIG. 31C.

In FIG. 31C and FIG. 31F, a horizontal axis expresses a distance in a planar direction of the surface of the support substrate 111 and a vertical axis expresses a distance in a thickness direction of the specimen. In FIG. 31C and FIG. 31F, the sacrifice layer 112 is located at a position of Y=0 μm to 3 μm, and it is found that a stress, that is, an impulse wave transfers from the focal point 154a of the laser beam toward the sacrifice layer 112. The Raman spectroscopic analysis also tells that the damage of the sacrifice layer 112 due to the thermal stress by the irradiation of the laser beam is large. In FIG. 31C and FIG. 31F, filled squares indicate data errors.

As described above, the mechanism of forming the micro cracks 112a in the sacrifice layer 112 by scanning the SOI substrate 110 with the laser beam in a state where the focal point 154a of the laser beam is positioned in the support substrate 111 can be explained from FIG. 21A to FIG. 31F. Thus, in the laser beam irradiation process in which the focal point 154a is set to the portion of the support substrate 111 located the sacrifice section 117 and the support substrate 111 is irradiated with the laser beam from above the semiconductor layer 113 through the sacrifice layer 112, the thermal stress is transferred from the focal point 154a of the laser beam toward the incident side of the laser beam and the micro cracks 112a are formed in the portion of the sacrifice layer 112 located in the sacrifice section 117. Then, the etchant is introduced from the opening portion 115 of the semiconductor layer 113 and the sacrifice layer 112 in which the micro cracks 112a are formed is removed by etching. Accordingly, the components such as the beam portions 124 float from the support substrate 111.

Because the micro cracks 112a are formed by intentionally damaging the sacrifice layer 112 in the sacrifice section 117 and fracturing the sacrifice layer 112 by transfer of the thermal stress, the sacrifice layer 112 can be reformed more efficiently compared with cases where the focal point 154a of the laser beam is set to the sacrifice layer 112. Thus, the etchant permeates to a deep portion of the sacrifice layer 112 more easily, and an etching rate of the sacrifice layer 112 can be improved.

In addition, by scanning the SOI substrate 110 with the laser beam in two different directions, the area effect of etching using the proceeding of etching can be improved. Thus, by a reduction of the number of scans and a reduction of the etching time, a productivity of the semiconductor device can be further improved. Because a time for which the structural bodies such as the beam portions 124 are subjected to the etchant is reduced by the reduction of the etching time, damage of the structural bodies by the etchant can be restricted.

In the present embodiment, the SOI substrate 110 is an example of a substrate, the support substrate 111 is an example of a first layer, the semiconductor layer 113 is an example of a second layer, the beam portions 124, the spindle portion 122, and the movable electrodes 123 are examples of a structural body.

Other Embodiments

The configurations of the semiconductor devices described in the above-described embodiments are examples and the manufacturing method of the present disclosure may also be applied to other semiconductor device.

For example, although each of the support substrate 111 and the semiconductor layer 113 in the second embodiment is composed of a single layer, each of the support substrate 111 and the semiconductor layer 113 may also be composed of multiple layers. The sacrifice layer 112 may also be composed of multiple layers. The manufacturing method of the second embodiment can be applied to any semiconductor device in which a part of the semiconductor layer 113 floats from the support substrate 111 by removing a part of the sacrifice layer 112 in the SOI substrate 110.

Although the sacrifice section 117 in FIG. 20 includes the fixed electrodes 132, at least the beam portions 124, the spindle portion 122, and the movable electrodes 123 in the movable part 120 need to float from the support substrate 111. The sacrifice section 117 may be configured optionally in accordance with a structure of a semiconductor device to be manufactured.

In the above-described embodiment, the SOI substrate 110 is irradiated with the laser beam at regular intervals. However, the intervals of scans may be set optionally.

In the above-described embodiment, the micro cracks 112a are formed in the forming-planned region of the opening portion 115 in the semiconductor layer 113. However, the opening portion 115 may also be formed by etching without forming the micro cracks 112a.

The laser irradiation equipment 150 shown in FIG. 17 may include a device that changes a direction of the condensing lens 154 with respect to the SOI substrate 110. When the direction of the condensing lens 154 can be changed, the laser beam output from the condensing lens 154 can enter the SOI substrate 110 in a direction that is not perpendicular to the surface of the SOI substrate 110. In other words, a high-speed beam scan can be performed. Accordingly, the irradiation direction of the laser beam can be changed not only by moving the SOI substrate 110 by the stage but also by changing the direction of the condensing lens. Accordingly, the SOI substrate 110 can be scanned with the laser beam faster, and a time required for the laser irradiation process can be reduced.

What is claimed is:

1. A manufacturing method of a semiconductor device comprising:
   preparing a substrate including single crystalline silicon;
   forming a reformed layer that continuously extends in the substrate, the forming the reformed layer including polycrystallizing a portion of the single crystalline silicon by irradiating the substrate with a pulsed laser beam while moving a focal point of the laser beam in the substrate; and
   removing the reformed layer by wet etching,
   wherein the semiconductor device includes a sensor having a diaphragm,
   wherein the forming the reformed layer and the removing the reformed layer are applied to forming the diaphragm in the substrate,
   wherein the forming the reformed layer includes forming the reformed layer along an interface between the diaphragm and a removal region under the diaphragm, and
   wherein the removing the reformed layer includes hollowing out the removal region by removing the reformed layer by wet etching, the diaphragm thereby being exposed to the outside.

2. The manufacturing method according to claim 1, wherein the pulsed laser beam has a wavelength within a range from 1000 nm to 1100 nm.

3. The manufacturing method according to claim 1, wherein the pulsed laser beam has an average pulse energy of more than 2.5 µJ.

4. The manufacturing method according to claim 3, wherein the pulsed laser beam has the average pulse energy of 15 µJ or less.

5. The manufacturing method according to claim 4, wherein the pulsed laser beam has the average pulse energy within a range from 6.25 µJ to 12.5 µJ.

6. The manufacturing method according to claim 1, wherein the forming the reformed layer includes moving the focal point of the laser beam in a direction parallel to a planar direction of the substrate at a planar pitch of 5 µm or less.

7. The manufacturing method according to claim 6,
wherein the planar pitch is within a range from 2 μm to 4 μm.

8. The manufacturing method according to claim 1,
wherein the forming the reformed layer includes moving the focal point of the laser beam in a direction vertical to a planar direction of the substrate at a vertical pitch of 5 μm or less.

9. The manufacturing method according to claim 8,
wherein the vertical pitch is within a range from 10 μm to 25 μm.

10. The manufacturing method according to claim 1,
wherein the reformed layer is removed by wet etching.

11. The manufacturing method according to claim 10,
wherein the diaphragm has a width of 600 μm or less in a planar direction of the substrate.

12. The manufacturing method according to claim 11,
wherein the diaphragm has the width of 350 μm or less.

13. The manufacturing method according to claim 1,
wherein the reformed layer is formed at a predetermined distance from the diaphragm to be formed along a direction parallel to a planar direction of the substrate, and
wherein the predetermined distance is within a range from 10 μm to 30 μm.

14. The manufacturing method according to claim 1,
wherein the substrate is a single crystalline silicon substrate.

15. The manufacturing method according to claim 1,
wherein the substrate is a silicon-on-insulator substrate in which a silicon oxide layer is buried in single crystalline silicon.

* * * * *